United States Patent
Fujita et al.

(10) Patent No.: US 9,178,102 B2
(45) Date of Patent: Nov. 3, 2015

(54) LIGHT EMITTING APPARATUS, MANUFACTURING METHOD OF LIGHT EMITTING APPARATUS, LIGHT RECEIVING AND EMITTING APPARATUS, AND ELECTRONIC EQUIPMENT

(71) Applicant: SEIKO EPSON CORPORATION, Tokyo (JP)

(72) Inventors: Tetsuji Fujita, Nagano (JP); Hidetoshi Yamamoto, Nagano (JP); Hideto Ishiguro, Nagano (JP); Tsukasa Eguchi, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/331,677

(22) Filed: Jul. 15, 2014

(65) Prior Publication Data

US 2015/0021627 A1    Jan. 22, 2015

(30) Foreign Application Priority Data

Jul. 17, 2013  (JP) ................................. 2013-148276
Apr. 16, 2014  (JP) ................................. 2014-084339

(51) Int. Cl.
| | |
|---|---|
| H01L 27/15 | (2006.01) |
| H01L 29/22 | (2006.01) |
| H01L 31/16 | (2006.01) |
| H01L 31/18 | (2006.01) |
| G06K 9/00 | (2006.01) |

(52) U.S. Cl.
CPC .............. *H01L 31/16* (2013.01); *G06K 9/0004* (2013.01); *H01L 31/18* (2013.01)

(58) Field of Classification Search
CPC ... H01L 31/16; H01L 31/18; H01L 27/14625; H01L 27/14627; H01L 27/14629
USPC .................................................. 257/82, 84, 98
See application file for complete search history.

(56) References Cited

U.S. PATENT DOCUMENTS

| | | |
|---|---|---|
| 5,515,169 A | 5/1996 | Cargill et al. |
| 6,688,186 B2 | 2/2004 | Chae |
| 7,728,902 B2 | 6/2010 | Kishigami et al. |

(Continued)

FOREIGN PATENT DOCUMENTS

| | | |
|---|---|---|
| JP | 2008-036058 A | 2/2008 |
| JP | 2008-042175 A | 2/2008 |
| JP | 2008-098617 A | 4/2008 |

(Continued)

OTHER PUBLICATIONS

The extended European Search Report for European Application No. 14177242.6 mailed Dec. 4, 2014.

*Primary Examiner* — Hung Vu
(74) *Attorney, Agent, or Firm* — Global IP Counselors, LLP

(57) ABSTRACT

A light emitting apparatus includes a translucent substrate, and a light emitting section and an optical filter section arranged in a first region of the substrate when viewed in a normal direction of a first surface of the substrate. The light emitting section has a laminate structure that includes, on the first surface of the substrate, a dielectric multilayer film, a first electrode, a functional layer with a light emitting layer, and a second electrode having semi-transmissive reflectivity. The optical filter section has a laminate structure that includes, on the first surface of the substrate, the dielectric multilayer film, the functional layer, and the second electrode. The dielectric multilayer film and the functional layer extend over the first region.

18 Claims, 20 Drawing Sheets

(56) References Cited

U.S. PATENT DOCUMENTS

| | | |
|---|---|---|
| 7,897,961 B2 | 3/2011 | Vogel et al. |
| 7,936,983 B2 | 5/2011 | Konno et al. |
| 8,274,034 B2 | 9/2012 | Vogel et al. |
| 8,383,431 B2 | 2/2013 | Kim et al. |
| 8,415,685 B2 * | 4/2013 | Fujita et al. .............. 257/79 |
| 2012/0098013 A1 * | 4/2012 | Yamazaki et al. ........... 257/98 |
| 2012/0228661 A1 * | 9/2012 | Ishitani et al. ............. 257/98 |
| 2012/0257031 A1 | 10/2012 | Tsuchiya et al. |

FOREIGN PATENT DOCUMENTS

| | | |
|---|---|---|
| JP | 2009-003821 A | 1/2009 |
| JP | 2009-110452 A | 5/2009 |
| JP | 2010-505582 A | 2/2010 |
| WO | 99/46724 A1 | 9/1999 |
| WO | 00/36547 A1 | 6/2000 |

* cited by examiner

| (EXAMPLE 1) | LIGHT EMITTING SECTION | | OPTICAL FILTER SECTION | |
|---|---|---|---|---|
| PEAK WAVELENGTH λ₁ OF FRONT SURFACE (nm) | 805 | | 770 | |
| PEAK WAVELENGTH λ₂ AT 40 DEGREE (nm) | 770 | | | |
| | FILM THICKNESS (nm) | OPTICAL FILM THICKNESS (nm) | FILM THICKNESS (nm) | OPTICAL FILM THICKNESS (nm) |
| NEGATIVE ELECTRODE Mg LAYER | 5 | | 5 | |
| NEGATIVE ELECTRODE MgAg (1:20) LAYER | 20 | | 20 | |
| ELECTRON INJECTION LAYER (EIL) | 1 | 1.4 | 1 | 1.4 |
| ELECTRON TRANSPORT LAYER (ETL) | 60 | 108.0 | 60 | 108.0 |
| LIGHT EMITTING LAYER (EML) | 25 | 43.0 | 25 | 43.0 |
| HOLE INJECTION TRANSPORT LAYER (HTL) | 30 | 51.6 | 30 | 51.6 |
| POSITIVE ELECTRODE/TRANSPARENT LAYER | 63 | 106.5 | 52 | 87.9 |
| INSULATING FILM | 50 | 92.5 | 50 | 92.5 |
| L1/L2 | | 403.0 | | 384.4 |
| SECOND DIELECTRIC FILM | 48 | 193.9 | 48 | 193.9 |
| FIRST DIELECTRIC FILM | 104 | 192.4 | 104 | 192.4 |
| REFLECTION LAYER AlNd | 80 | | -- | |

Fig. 10A

| (EXAMPLE 2) | LIGHT EMITTING SECTION | | OPTICAL FILTER SECTION | |
|---|---|---|---|---|
| PEAK WAVELENGTH λ₁ OF FRONT SURFACE (nm) | 805 | | 770 | |
| PEAK WAVELENGTH λ₂ AT 40 DEGREE (nm) | 770 | | | |
| | FILM THICKNESS (nm) | OPTICAL FILM THICKNESS (nm) | FILM THICKNESS (nm) | OPTICAL FILM THICKNESS (nm) |
| NEGATIVE ELECTRODE Mg LAYER | 5 | | 5 | |
| NEGATIVE ELECTRODE MgAg (1:20) LAYER | 20 | | 20 | |
| ELECTRON INJECTION LAYER (EIL) | 1 | 1.4 | 1 | 1.4 |
| ELECTRON TRANSPORT LAYER (ETL) | 60 | 108.0 | 60 | 108.0 |
| LIGHT EMITTING LAYER (EML) | 25 | 43.0 | 25 | 43.0 |
| HOLE INJECTION TRANSPORT LAYER (HTL) | 30 | 51.6 | 30 | 51.6 |
| POSITIVE ELECTRODE/TRANSPARENT LAYER | 48 | 81.1 | 32 | 54.1 |
| INSULATING FILM | 50 | 92.5 | 50 | 92.5 |
| L1/L2 | | 377.6 | | 350.6 |
| SECOND DIELECTRIC FILM | 48 | 193.9 | 48 | 193.9 |
| FIRST DIELECTRIC FILM | 104 | 192.4 | 104 | 192.4 |
| REFLECTION LAYER AlNd | 80 | | -- | |

| | First Light Emitting Section | | First Optical Filter Section | | Second Light Emitting Section | | Second Optical Filter Section | | Third Light Emitting Section | | Third Optical Filter Section | |
|---|---|---|---|---|---|---|---|---|---|---|---|---|
| Peak Wavelength $\lambda_1$ Of Front Surface (nm) | 740 | | 710 | | 805 | | 770 | | 860 | | 830 | |
| Peak Wavelength $\lambda_2$ At 40 Degree (nm) | 710 | | | | 770 | | | | 820 | | | |
| | Film Thickness (nm) | Optical Film Thickness (nm) | Film Thickness (nm) | Optical Film Thickness (nm) | Film Thickness (nm) | Optical Film Thickness (nm) | Film Thickness (nm) | Optical Film Thickness (nm) | Film Thickness (nm) | Optical Film Thickness (nm) | Film Thickness (nm) | Optical Film Thickness (nm) |
| Negative Electrode Mg Layer | 5 | | 5 | | 5 | | 5 | | 5 | | 5 | |
| Negative Electrode MgAg (1:20) Layer | 20 | | 20 | | 20 | | 20 | | 20 | | 20 | |
| E60 Electron Injection Layer (EIL) | 1 | 1.4 | 1 | 1.4 | 1 | 1.4 | 1 | 1.4 | 1 | 1.4 | 1 | 1.4 |
| Electron Transport Layer (ETL) | 60 | 108.6 | 60 | 108.6 | 60 | 108.0 | 60 | 108.0 | 60 | 107.4 | 60 | 107.4 |
| Light Emitting Layer (EML) | 25 | 43.5 | 25 | 43.5 | 25 | 43.0 | 25 | 43.0 | 25 | 43.0 | 25 | 43.0 |
| Hole Injection Transport Layer (HTL) | 30 | 54.0 | 30 | 54.0 | 30 | 53.9 | 30 | 53.9 | 30 | 54.0 | 30 | 54.0 |
| Positive Electrode/Transparent Layer | 16 | 28.0 | 0 | 0.0 | 48 | 81.1 | 32 | 54.1 | 80 | 130.4 | 64 | 104.3 |
| Insulating Film | 50 | 93.0 | 50 | 93.0 | 50 | 92.5 | 50 | 92.5 | 50 | 92.5 | 50 | 92.5 |
| L1/L2/L4/L5/L6/L7 | | 328.5 | | 300.5 | | 379.9 | | 352.8 | | 428.7 | | 402.6 |
| Second Dielectric Film | 47.4 | 196.7 | 47.4 | 178.5 | 47.4 | 191.5 | 47.4 | 191.5 | 47.4 | 186.8 | 47 | 186.8 |
| First Dielectric Film | 95 | 176.7 | 95 | 176.7 | 95 | 175.8 | 95 | 175.8 | 95 | 175.8 | 95 | 175.8 |
| Reflection Layer AlNd | 80 | | -- | | 80 | | -- | | 80 | | -- | |

Fig. 14B

| | 710nm | 770nm | 830nm |
|---|---|---|---|
| Electron Injection Layer (EIL) | 1.39 | 1.38 | 1.38 |
| Electron Transport Layer (ETL) | 1.81 | 1.80 | 1.79 |
| Light Emitting Layer (EML) | 1.74 | 1.72 | 1.72 |
| Hole Injection Transport Layer (HTL) | 1.80 | 1.79 | 1.79 |
| Positive Electrode/Transparent Layer | 1.75 | 1.69 | 1.63 |
| Insulating Film | 1.86 | 1.85 | 1.85 |
| Second Dielectric Film | 4.15 | 4.04 | 3.94 |
| First Dielectric Film | 1.86 | 1.85 | 1.85 |

LIGHT EMITTING APPARATUS, MANUFACTURING METHOD OF LIGHT EMITTING APPARATUS, LIGHT RECEIVING AND EMITTING APPARATUS, AND ELECTRONIC EQUIPMENT

CROSS-REFERENCE TO RELATED APPLICATIONS

This application claims priority to Japanese Patent Application Nos. 2013-148276 filed on Jul. 17, 2013 and 2014-084339 filed on Apr. 16, 2014. The entire disclosures of Japanese Patent Application Nos. 2013-148276 and 2014-084339 are hereby incorporated herein by reference.

BACKGROUND

1. Technical Field

Several aspects of the present invention relate to a light emitting apparatus, a manufacturing method of a light emitting apparatus, a light receiving and emitting apparatus in which the light emitting apparatus is used as a lighting apparatus, and electronic equipment provided with the light receiving and emitting apparatus.

2. Related Art

An optical apparatus, in which one or more electromagnetic wave emission elements and one or more electromagnetic wave detection elements are provided on a surface of a CMOS substrate as a light receiving and emitting apparatus provided with a light emitting apparatus and at least one of the electromagnetic wave detection elements is an element capable of being manufactured by the CMOS technology, is well known (see JP-A 2008-42175 (Patent Document 1), for example).

According to Patent Document 1, as the electromagnetic wave emission element, it includes an organic light emitting diode or a light emitting diode, and as the electromagnetic wave detection element, it includes a photodiode or a CMOS sensor.

The electromagnetic wave emission elements and the electromagnetic wave detection elements are evenly distributed and arranged on the substrate made of silicon. Further, as a wavelength of the electromagnetic wave, it includes a visible light wavelength or a near infrared wavelength.

As an example of such optical apparatus, it includes a display in which three organic light emitting diodes, which emit wavelengths of a red light, a green light, and a blue light, are adjacently arranged. The electromagnetic wave detection element is provided between the three organic light emitting diodes.

SUMMARY

When the optical apparatus of the aforementioned Patent Document 1 is used as an imaging means, a subject is illuminated by the light as an electromagnetic wave emitted from the electromagnetic wave emission element, and the reflected light from the subject is received in the electromagnetic wave detection element. In recent years, it is not only used to obtain an image of the subject by receiving the light that is reflected on the surface of the subject, but also, it attempts to be used in, for example, a biometric authentication, or in the medical field, to obtain a shape of a blood vessel in the body, or biometric information such as components in the blood (e.g., hemoglobin) by irradiating the light to a human body as a subject. In this case, there is a possibility that the desired biometric information cannot be accurately obtained because the electromagnetic wave detection element of the aforementioned optical apparatus receives both the light reflected from the surface of the subject and the light reflected inside part of the subject. Therefore, it was considered to correspondingly provide an optical filter, which selectively transmits only a desired wavelength of the electromagnetic wave (light) by eliminating an unnecessary wavelength of the electromagnetic wave (light) other than the desired wavelength that accurately reflects the biometric information, in the electromagnetic wave detection element. However, there is a problem that the structure of the aforementioned optical apparatus becomes complicated.

The present invention was made to address at least a part of the aforementioned objects, and is capable of realizing the following embodiments or applied examples.

Applied Example

A light emitting apparatus according to the present applied example is provided with a translucent substrate, and a light emitting section and an optical filter section arranged in a first region of the substrate when viewed in a normal direction of a first surface of the substrate. The light emitting section has a laminate structure that includes, on the first surface of the substrate, a dielectric multilayer film, a first electrode, a functional layer with a light emitting layer, and a second electrode having semi-transmissive reflectivity. The optical filter section has a laminate structure that includes, on the first surface of the substrate, the dielectric multilayer film, the functional layer, and the second electrode. The dielectric multilayer film and the functional layer extend over the first region.

According to the present applied example, the light emitting section and the optical filter section share the dielectric multilayer film, the functional layer, and the second electrode. Therefore, in comparison with that the light emitting section and the optical filter section are formed on the substrate by using different members respectively, the light emitting apparatus, which is provided with a simple formation and structure of the light emitting section and the optical filter section, can be provided.

According to the light emitting apparatus of the aforementioned applied example, the light emitting section can have a reflection layer that is disposed between the first surface of the substrate and the dielectric multilayer film. A first optical resonance structure is formed between the reflection layer and the second electrode. A second optical resonance structure is formed between the dielectric multilayer film of the optical filter section and the second electrode.

With such configuration, the optical resonance structure is respectively formed in the light emitting section and the optical filter section so that the light in which the light intensity has been enhanced can be extracted in the resonance wavelength from the light emitting section. Further, the light of the resonance wavelength can be selectively transmitted in the optical filter section.

According to the applied example of the light emitting apparatus, the optical filter section can be configured to transmit light in a part of a wavelength range of light emitted from the light emitting section.

In the light emitting apparatus of the aforementioned applied example, the optical filter section can include a transparent layer that has the same thickness of the first electrode and is located in the same layer level with the first electrode.

In such configuration, the second optical resonance structure has the same resonance length of the first optical resonance structure, optically. That is, the light with the wavelength being close to the resonance wavelength in the light emitting section can be selectively transmitted in the optical filter section.

In the light emitting apparatus of the aforementioned applied example, the optical filter section can include a transparent layer that is made of the same conducting film as the first electrode and is located in the same layer level with the first electrode. The first electrode has a film thickness that is different from that of the transparent layer.

With such configuration, the resonance length of the second optical resonance structure and the resonance length of the first optical resonance structure are different. That is, the light with the wavelength being different from the resonance wavelength in the light emitting section can be selectively transmitted in the optical filter section.

In the light emitting apparatus of the aforementioned applied example, the optical filter section is free of a transparent layer that is made of the same conducting film as the first electrode and is located in the same layer level with the first electrode.

With such configuration, the second optical resonance structure optically shortens the resonance length, which corresponds to the optical length of the first electrode, than the first optical resonance structure. That is, the light with the wavelength shorter than the resonance wavelength in the light emitting section can be selectively transmitted in the optical filter section.

In the light emitting apparatus of the aforementioned applied example, the optical filter section can be configured to transmit fluorescent excited by light emission in the light emitting section.

In the light emitting apparatus of the aforementioned applied example, a distance d1 from a center of the light emitting section to tan outer edge of the light emitting section measured in a direction directing toward a center of the optical filter section from the center of the light emitting section can satisfy a relationship of 5 µm≤d1≤0.7 mm.

With such configuration, when the distance d1 from the center to the outer edge of the light emitting section is more than or equal to 5 µm, the light emitting section can be arranged so as to avoid that a circuit element or a wire for driving the light emitting section is entered in the optical filter section. Further, by defining that the distance d1 from the center to the outer edge of the light emitting section is less than or equal to 0.7 mm, when the light emitting apparatus is used for the light receiving and emitting apparatus which is capable of obtaining, for example, various biometric information, the biometric information can be obtained as high-definition image information.

In the light emitting apparatus of the aforementioned applied example, the light emitting section can be configured to emit near-infrared light.

With such configuration, the near-infrared light can illuminate inside of a living body in comparison with the visible light so that it can be used as a lighting apparatus that is capable of obtaining biometric information related to, for example, blood vessel, blood, etc.

In the light emitting apparatus of the aforementioned applied example, a plurality of light emitting sections arranged in the first region of the substrate can be further provided. The light emitting sections have light emitting wavelength ranges that are shifted relative to each other.

With such configuration, by irradiating the light with the light emitting wavelength ranges that are shifted, the utilization range of the light emitting apparatus can be expanded.

In the light emitting apparatus of the aforementioned applied example, a plurality of optical filter sections arranged in the first region of the substrate can be further provide. The optical filter sections have wavelength ranges of transmitting light that are shifted relative to each other.

With such configuration, by being capable of transmitting the light with the wavelength ranges that are shifted, the utilization range of the light emitting apparatus can be expanded.

In the light emitting apparatus of the aforementioned applied example, the dielectric multilayer film can have a laminate structure that includes the first dielectric film having a first refractive index and the second dielectric film having a second refractive index that is larger than the first refractive index. The second dielectric film can be made of amorphous silicon.

With such configuration, the transmittance of the light with the visible light wavelength range that is transmitted the optical filter section can be reduced.

In the light emitting apparatus of the aforementioned applied example, the second electrode can include a layer made of alloy that includes Ag.

With such configuration, by adjusting the film thickness of the layer made of alloy that includes Ag, the second electrode having both light permeability and light reflectivity can be easily provided.

In the light emitting apparatus of the aforementioned applied example, the first electrode can extend along a first direction, and the second electrode can extend along a second direction that intersects with the first electrode. The light emitting section can include a part of the first electrode that extends along the first direction, and the optical filter section can include a part of the second electrode that does not overlap with the part of the first electrode.

With such configuration, the light emitting apparatus with a passive system in which the circuit structure for emitting the light in the light emitting section is simple can be provided.

Applied Example

A manufacturing method of a light emitting apparatus according to the present applied example is a manufacturing method of a light emitting apparatus including a translucent substrate, and a light emitting section and an optical filer section that are arranged in a first region of the substrate when viewed in a normal direction of a first surface of the substrate. The manufacturing method includes forming a dielectric multilayer film over the first region of the substrate, forming a first electrode on the dielectric multilayer film included in the light emitting section, forming a functional layer with a light emitting layer over the first electrode and the dielectric multilayer film included in the optical filter section, and forming a second electrode having semi-transmissive reflectivity on the functional layer over the first region of the substrate.

According to the applied example, the light emitting section and the optical filter section share the dielectric multilayer film, the functional layer, and the second electrode formed in the entire first region so that in comparison with a case that the light emitting section and the optical filter section are formed on the substrate by using respective separate members, the light emitting apparatus provided with the light emitting section and the optical filter section can be manufactured in a simple process.

In the manufacturing method of the light emitting apparatus of the aforementioned applied example, forming a reflection layer between the first surface of the substrate and the dielectric multilayer film included in the light emitting section can be further included. A first optical resonance structure is formed between the reflection layer and the second electrode included in the light emitting section. A second optical resonance structure is formed between the dielectric multilayer film and the second electrode included in the optical filter section.

In such method, the optical resonance structure is formed in the light emitting section and the optical filter section, respectively so that it is possible to obtain the light with a specific resonance wavelength from the light emitting section, and further, the light emitting apparatus capable of selectively transmitting the light with the specific resonance wavelength in the optical filter section can be manufactured.

Applied Example

A light receiving and emitting apparatus according to the present applied example has the light emitting apparatus described in the aforementioned applied example, and a light receiving section disposed in a position overlapping the optical filter section in an opposite side of the first surface of the substrate.

With such configuration, the light emitting apparatus has a simple formation and structure so that a compact light receiving and emitting apparatus can be provided. Therefore, the light receiving and emitting apparatus can be used as an imaging apparatus capable of obtaining the information of a subject.

In the light receiving and emitting apparatus of the aforementioned applied example, a microlens disposed between the optical filter section and the light receiving section can be further provided.

With such configuration, the light from the subject that was illuminated by the light emitting apparatus can be efficiently collected to the light receiving element by the microlens so that a light image can be obtained.

In the light receiving and emitting apparatus of the aforementioned applied example, a light shielding film having an opening section that is disposed between the microlens and the light receiving section can be further provided.

With such configuration, the light other than the necessary light is shielded by the light shielding film so that only the necessary light can be incident on the light receiving element through the opening section.

Applied Example

An electronic equipment according to the present applied example includes the light receiving and emitting apparatus described in the aforementioned applied example.

With such configuration, it is capable of taking a vivid image and compact electronic equipment can be provided.

BRIEF DESCRIPTION OF THE DRAWINGS

Referring now to the attached drawings which form a part of this original disclosure:

FIG. 10A is a table showing an optical film thickness in each layer of the light emitting section and the optical filter section in Example 1;

FIG. 10B is a table showing an optical film thickness in each layer of the light emitting section and the optical filter section in Example 2;

FIG. 14A is a table showing a detailed configuration of the light emitting section and the optical filter section in the second light emitting apparatus;

FIG. 14B is a table showing a wavelength dependency of a refractive index in each layer configuring the light emitting section and the optical filter section;

DETAILED DESCRIPTION OF EXEMPLARY EMBODIMENTS

Hereinafter, the embodiments that specify the present invention will be described in reference to the drawings. The drawings are used to show portions that will be described in recognizable state by enlarging or contracting it appropriately.

First Embodiment

Electronic Equipment

Figure 1:
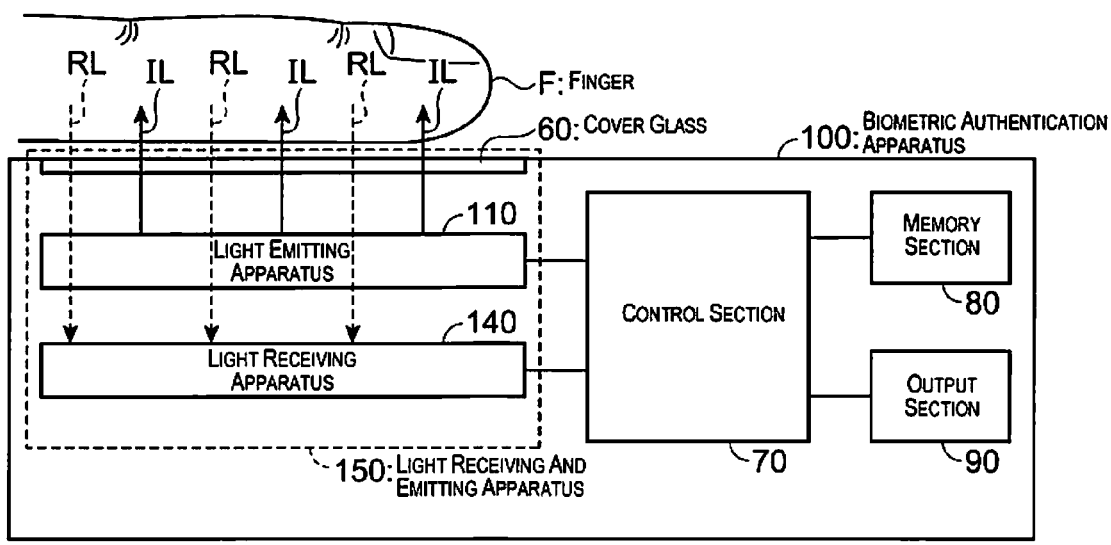
FIG. 1 is a block diagram showing a mechanical and electrical configuration of a biometric authentication apparatus.
Figure 2A:
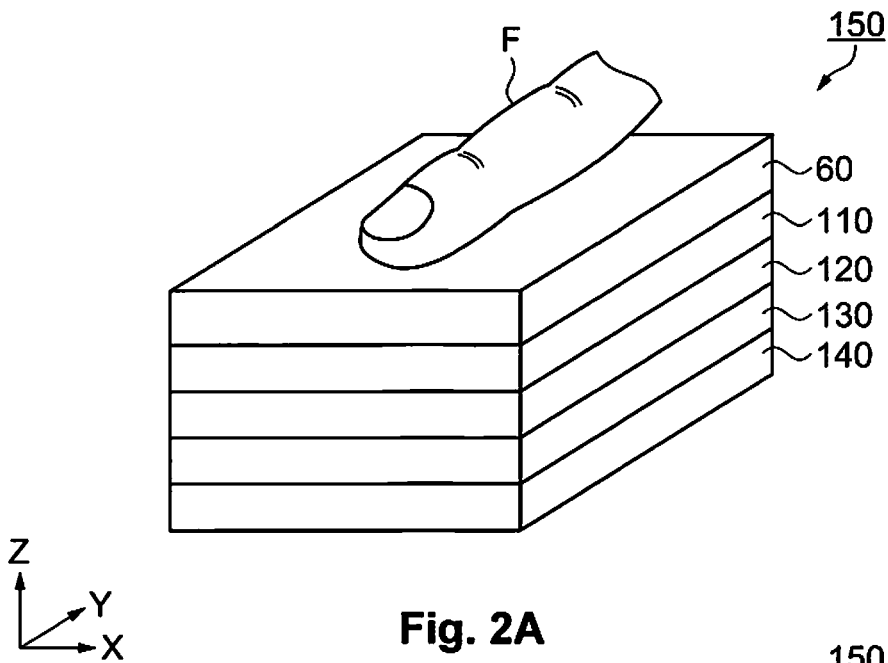
FIG. 2A is a perspective view of a light receiving and emitting apparatus.
Figure 2B:
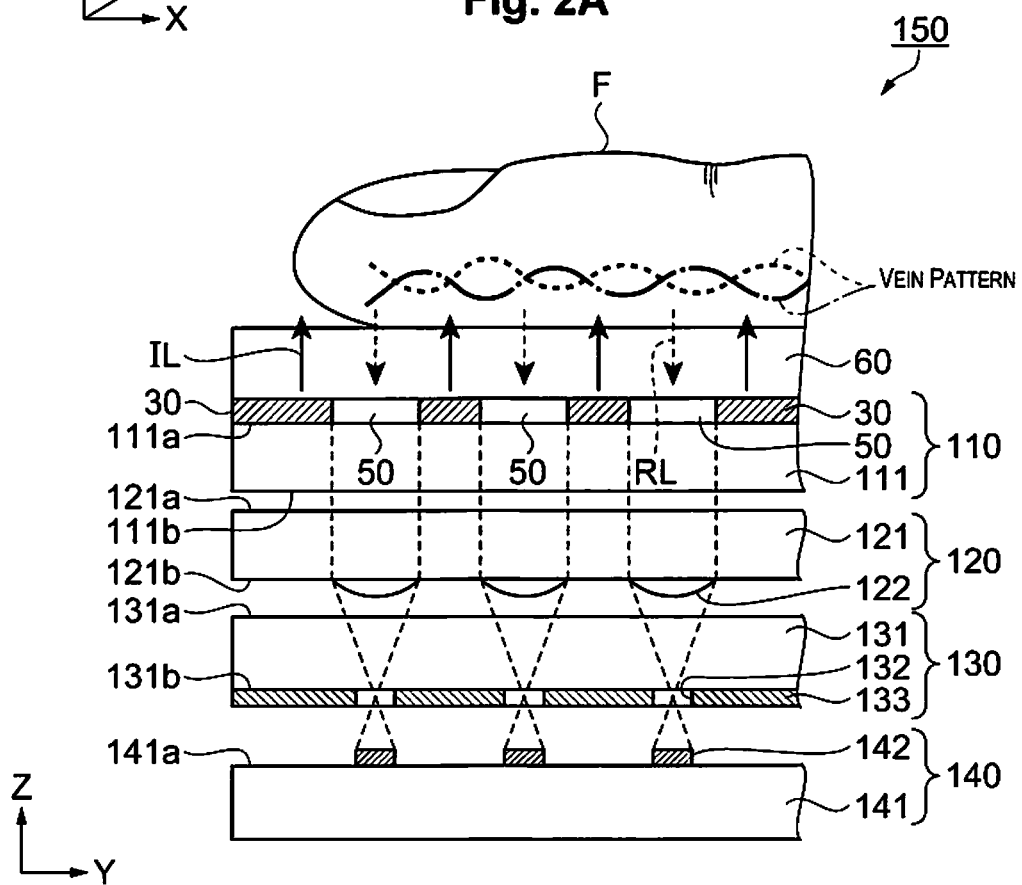
FIG. 2B is a schematic cross-sectional diagram showing a configuration of the light receiving and emitting apparatus.

First, a biometric authentication apparatus as an example of electronic equipment in which a light receiving and emitting apparatus provided with a light emitting apparatus of the present invention is applied will be described in reference to FIG. 1, FIG. 2A and FIG. 2B. FIG. 1 is a block diagram showing a mechanical and electrical configuration of a biometric authentication apparatus, and FIG. 2A is a perspective view of the light receiving and emitting apparatus, and FIG. 2B is a schematic cross-sectional diagram showing a configuration of the light receiving and emitting apparatus.

As shown in FIG. 1, a biometric authentication apparatus 100 as the electronic equipment of the present embodiment is an apparatus to perform identity authentication by taking a vein image of a finger F as a living body (subject), and is provided with a light receiving and emitting apparatus 150, a memory section 80, an output section 90, and a control section 70 that integrates and controls these sections.

The light receiving and emitting apparatus 150 is provided with a cover glass 60, a light emitting apparatus 110 that illuminates the finger F, and a light receiving apparatus 140. The light emitting apparatus 110 is arranged between the cover glass 60 and the light receiving apparatus 140.

The cover glass 60 is a protection cover made of glass that covers at least the light emission region of the light emitting apparatus 110. The finger F (e.g., index finger of the right hand) of a person as a subject of the authentication is placed on the cover glass 60.

The structure of the light emitting apparatus 110 will be described in detail later, and the near-infrared light IL is irradiated as an illumination light from the light emitting section provided on the translucent substrate and illuminates the finger F. The wavelength range of the near-infrared light IL is, for example, 700 nm to 1500 nm.

The near-infrared light IL irradiated from the light emitting section irradiates to the finger F from the lower side of the cover glass 60, and when it reaches to the inside of the finger F, it scatters and a part of the light as a reflected light RL transmits the substrate of the light emitting apparatus 110 and goes toward the light receiving apparatus 140. The reduced hemoglobin (deoxygenated hemoglobin) flowing in veins has the property of absorbing the near-infrared light IL. Therefore, when the near-infrared light IL is irradiated and an image of the finger F is taken, the vein segment under the skin of the finger F is taken darker in comparison with the surrounding tissue. A pattern of a difference of brightness and darkness becomes a vein image (vein pattern). The light receiving apparatus 140 is an image sensor for near-infrared light, and is provided with a plurality of light receiving sections 142 (see FIG. 2B) arranged on the substrate 141. Each light receiving section 142 covers the incident light (the reflected light RL from the finger F) to an electrical signal (light receiving signal) having a signal level in response to the amount of light.

The memory section 80 is a nonvolatile memory such as a flash memory, a hard disk, etc., and stores a vein image (vein pattern) of the finger F (e.g., index finger of the right hand) that has already been registered as a master vein image for identity authentication (vein pattern). The control section 70 is provided with a CPU or a RAM, and controls the lighting on or the lighting off of the light emitting apparatus 110. Further, the control section 70 reads out a receiving signal from each light receiving section 142 provided in the light receiving apparatus 140, and generates a vein image (vein pattern) of the finger F based on the receiving signal per one frame (per imaging region) that has been read. Further, the control section 70 verifies the generated vein image (vein pattern) with the master vein image (vein pattern) that has been registered in the memory section 80, and performs identity authentication. For example, the control section 70 compares the characteristics (e.g., the numbers or the positions of branching of veins) of two vein images (vein patterns), and when it is more than or equal to the predetermined threshold values, the person who placed the finger F on the cover glass 60 is authenticated as the identical person that the master vein image (vein pattern) has been registered in the memory section 80. The output section 90 is, for example, a display section or a voice informing section, and the authentication result is notified by display or voice.

<Light Receiving and Emitting Apparatus>

As shown in FIG. 2A, the light receiving and emitting apparatus 150 of the present embodiment has a configuration that laminates in the order of the light receiving apparatus 140, a pinhole substrate 130, a microlens array 120, the light emitting apparatus 110, and the cover glass 60. The light receiving and emitting apparatus 150 is an apparatus that takes a vein image (vein pattern) as the biometric information of the finger F in order to identify an individual of the finger F as the living body placed on the cover glass 60.

The surface of the cover glass 60 on which the finger F is placed is defined by the X-direction and the Y-direction. A direction from the light receiving apparatus 140 to the cover glass 60 is defined as the Z-direction. For example, the finger F is placed on the cover glass 60 along the Y-direction. To place the finger F in a predetermined position on the cover glass 60, a guideline, etc. for guiding the finger F may be printed on the surface of the cover glass 60.

The light emitting apparatus 110 and the light receiving apparatus 140 are laminated within a planar surface that is defined by the X-direction and the Y-direction so that in comparison with the case that the light emitting apparatus 110 for illuminating a subject is separately provided, a compact light receiving and emitting apparatus 150 can be provided.

As shown in FIG. 2B, the light emitting apparatus 110 is provided with a translucent substrate 111, a light emitting section 30 arranged on the first surface 111a of the substrate 111, and an optical filter section 50. The light emitting section 30 and the optical filter section 50 are two-dimensionally adjacent to each other on the first surface 111a, and a plurality of the light emitting sections and the optical filter sections are respectively arranged.

As described above, the near-infrared light IL is irradiated from the light emitting section 30 to the cover glass 60 side (that is, the Z-direction). The IL is not only reflected on the surface of the finger F, but also entering and scattering the inside of the finger F. Further, it may not be only the reflected light RL of the near-infrared light IL, but there is a possibility to mix with external light depending on the environment where the light receiving and emitting apparatus 150 is existed. To perform the individual identification accurately, it is desired to obtain a vivid vein image (vein pattern) of the finger F. That is, a specific wavelength of the light, which is capable of performing the imaging for a vein image (vein pattern) without unnecessary wavelength of the light, is preferably guided to the light receiving apparatus 140. The optical filter section 50 is configured so that in the reflected light RL which was incident to the optical filter section 50, the transmittance of the specific wavelength of the light, which is capable of performing the imaging for a vein image (vein pattern), is higher than the transmittance of the light other than the specific wavelength. The detailed configuration of the light emitting section 30 and the optical filter section 50 will be described later.

The microlens array 120 and the pinhole substrate 130 are arranged between the light emitting apparatus 110 and the light receiving apparatus 140.

The microlens array 120 is provided with a translucent substrate 121, and a plurality of microlenses 122 provided on the surface 121b which is opposite side with respect to the surface 121a in the light emitting apparatus 110 side of the substrate 121. The microlenses 122 are formed on the surface 121b of the substrate 121 corresponding to the arrangement of the optical filter section 50 of the light emitting apparatus 110. The light transmitted through the optical filter section 50 is collected by the microlenses 122 and guides to the light receiving section 142 of the light receiving apparatus 140.

The arrangement of the microlens array 120 is not limited to this, and it may be arranged between the cover glass 60 and the light emitting apparatus 110.

The pinhole substrate 130 is provided with a translucent substrate 131, and a light shielding film 133 provided on the surface 131b which is opposite side with respect to the surface 131a in the microlens array 120 side of the substrate 131. In the light shielding film 133, opening sections (pinholes) 132 are formed in positions corresponding to the arrangement of the optical filter sections 50 of the light emitting apparatus 110. The pinhole substrate 130 is arranged between the microlens array 120 and the light receiving apparatus 140 so as to transmit the light collected by the microlenses 122 through the opening sections (pinholes) 132 and shield other light by the light shielding film 133.

The light receiving apparatus 140 is an image sensor for near-infrared light as described above, and is provided with a substrate 141 and a plurality of light receiving sections 142 provided on the surface 141a of the light emitting apparatus 110 side of the substrate 141. For example, a glass epoxy substrate, a ceramic substrate, etc. capable of mounting a light receiving section 142 can be adopted as the substrate 141, and it is provided with an electric circuit (omitted in the drawing) in which the light receiving section 142 is connected. On the surface 141a of the substrate 141, a plurality of light receiving sections 142 is arranged in positions corresponding to the arrangement of the optical filter sections 50 in the light emitting apparatus 110. For example, an optical sensor such as a CCD, a CMOS, etc. can be used as the light receiving section 142. It is well known that the sensitivity of the optical sensor is different depending on the wavelength of the light. For example, the CMOS sensor has better sensitivity of the visible light than the sensitivity of the near-infrared light IL. When the visible light is mixed with the near-infrared light IL received through the finger F and irradiated from the light emitting section 30, it is outputted as a noise from the CMOS sensor. The optical filter section 50 of the present embodiment is configured so that the transmittance of the visible light is lower than the transmittance of the specific wavelength which is within the wavelength range of the near-infrared light IL.

For example, a filter that shields the light in the visible light wavelength range (400 nm to 700 nm) may be arranged corresponding to the opening sections 132 of the pinhole substrate 130.

The cover glass 60, the light emitting apparatus 110, the microlens array 120, the pinhole substrate 130, and light receiving apparatus 140 are respectively bonded opposite each other at intervals, and an adhesive agent, etc. (omitted in FIG. 2B) is used to stick each other.

The configuration of the light receiving and emitting apparatus 150 is not limited to this. For example, the light emitting apparatus 110 seals the light emitting section 30, and by using the cover glass 60 as a protection substrate for the protection, the cover glass 60 may be included in the configuration. Further, there is a possibility that the light transmitted through the optical filter section 50 may be deteriorated since it is reflected at the interface of members each having different refractive index. Thus, for example, the substrate 111 and the substrate 121 may be bonded so as to contact the surface IIIb of the substrate Ill of the light emitting apparatus 110 with the surface 121a of the substrate 121 of the microlens array 120. Further, the microlenses 122 and the surface 131a of the pinhole substrate 130 may be bonded to contact each other. In this way, the position relationships of these members each other in the Z-direction can be more ensured.

<Light Emitting Apparatus>

Figure 3:
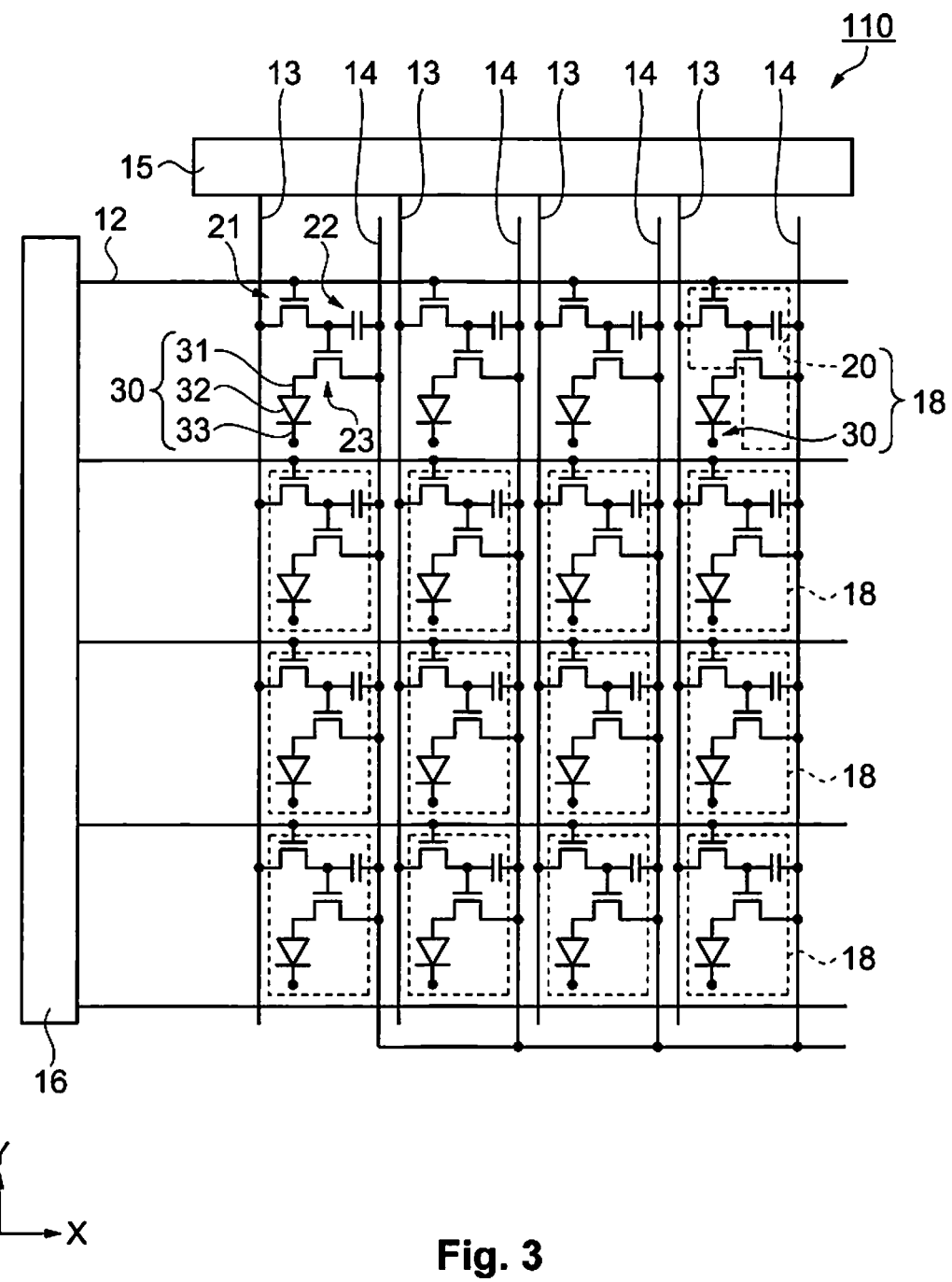
FIG. 3 is an equivalency circuit diagram showing an electrical configuration of the light emitting apparatus.
Figure 4:
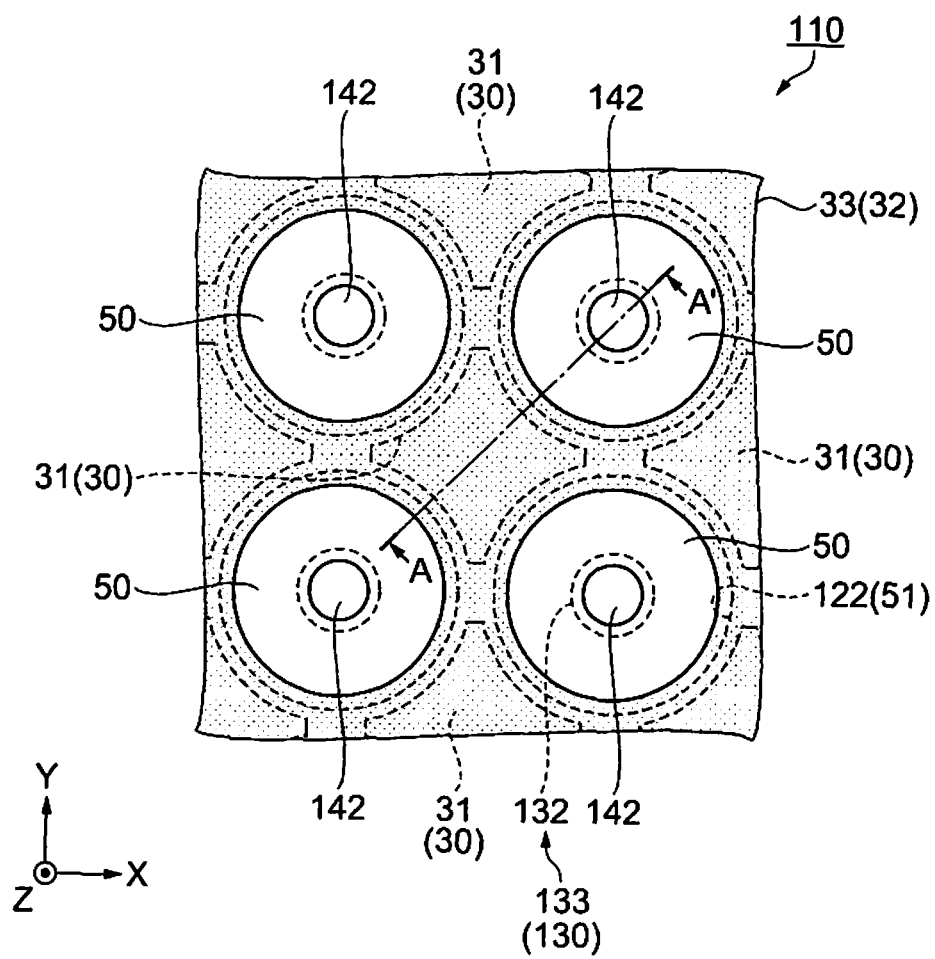
FIG. 4 is a plan view showing an arrangement of a light emitting sections and an optical filter sections in the light emitting apparatus.
Figure 5:
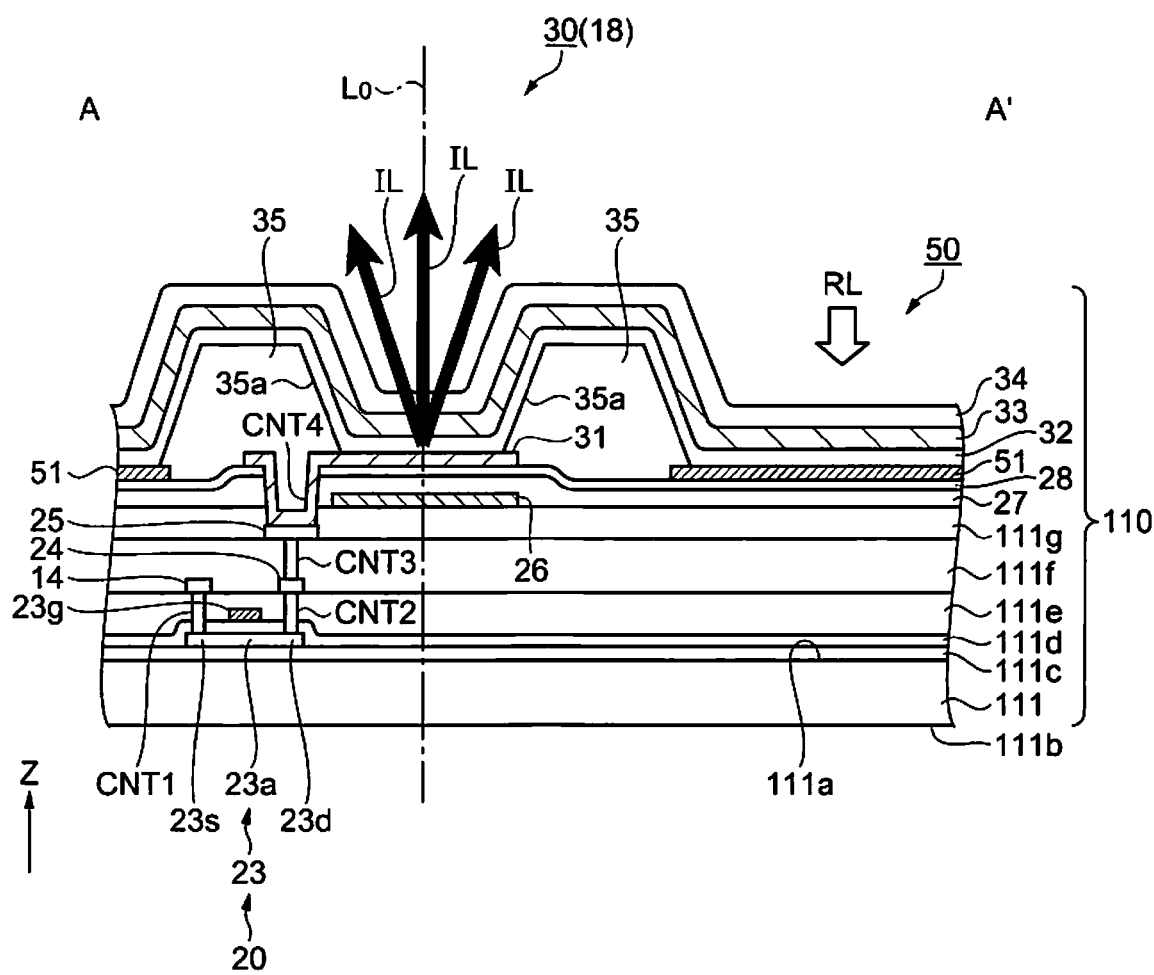
FIG. 5 is a schematic cross-sectional diagram showing a configuration of the light emitting section and the optical filter section in the light emitting apparatus along the A-A' line of FIG. 4.

Next, the configuration of the light emitting apparatus 110 will be described in reference to FIG. 3 to FIG. 5. FIG. 3 is an equivalency circuit diagram showing an electrical configuration of the light emitting apparatus; FIG. 4 is a plan view showing an arrangement of light emitting sections and optical filter sections in the light emitting apparatus; and FIG. 5 is a schematic cross-sectional diagram showing a configuration of the light emitting section and the optical filter section in the light emitting apparatus along the A-A' line of FIG. 4.

As shown in FIG. 3, the light emitting apparatus 110 of the present embodiment is provided with a plurality of scanning lines 12 and a plurality of data lines 13 that are intersected each other, and a plurality of power lines 14 that is connected in parallel with respect to the plurality of data lines 13, respectively. A scanning line drive circuit 16 in which the plurality of scanning lines 12 is connected, and a data line drive circuit 15 in which the plurality of data lines 13 is connected are provided. Further, light emitting pixels 18 that are arranged in a matrix shape with respect to each intersection between the plurality of scanning lines 12 and the plurality of data lines 13 are provided.

The light emitting pixels 18 are provided with the light emitting section 30 and a pixel circuit 20 that controls to drive the light emitting section 30.

The light emitting section 30 is provided with a positive electrode 31 as the first electrode, a negative electrode 33 as the second electrode, and a functional layer 32 provided between the positive electrode 31 and the negative electrode 33. The functional layer 32 includes a light emitting layer made of an organic semiconductor material, and such light emitting section 30 is called as an organic EL element. The light emitting section 30 can be indicated as an electrical diode. It will be described in detail later, but the negative electrode 33 is formed as a common negative electrode for the plurality of light emitting pixels 18.

The pixel circuit 20 includes a switching transistor 21, a storage capacitor 22, and a driving transistor 23. The two of the transistors 21, 23 can be configured by using, for example, an n-channel type or a p-channel type thin film transistor (TFT: Think Film Transistor) or a MOS transistor.

A gate of the switching transistor 21 is connected to the scanning line 12, and one of the source and the drain is connected to the data line 13, and the other one of the source and the drain is connected to the gate of the driving transistor 23.

One of the source and the drain of the driving transistor 23 is connected to the positive electrode 31 of the light emitting section 30, and the other one of the source and the drain is connected to the power line 14. A storage capacitor 22 is connected between the gate of the driving transistor 23 and the power line 14.

When the switching transistor 21 is turned on by driving the scanning line 12, an electric potential based on a control signal supplied from the data line 13 is retained in the storage capacitor 22 through the switching transistor 21. A state of turning on or off of the driving transistor 23 is determined in response to the gate potential of the driving transistor 23, that is, the electric potential of the storage capacitor 22. When the driving transistor 23 is turned on, the electric current with the amount in response to the gate potential flows to the functional layer 32, which is sandwiched between the positive electrode 31 and the negative electrode 33, from the power line 14 via the driving transistor 23. The light emitting section 30 irradiates in response to the amount of the electric current that flows in the functional layer 32.

Next, the arrangement of the light emitting sections 30 and the optical filter sections 50 in a plan view will be described in reference to FIG. 4.

As shown in FIG. 4, the optical filter sections 50 are a circular shape in a plan view in order to efficiently obtain the reflected light RL from the finger F, and are arranged in an equal interval in the X-direction and the Y-direction. In other words, the optical filter sections 50 are arranged in a matrix shape with an interval in between within the planar surface defined by the X-direction and the Y-direction.

An outline of the optical filter section 50 is slightly smaller than the outline of the microlens 122 when viewed from the Z-direction, and the microlens 122 is arranged to overlap the optical filter section 50. In the center of the circular-shaped optical filter section 50, the light receiving section 142 having a circular-shaped light receiving surface, which is the same shape, is arranged. A light shielding film 133 (pinhole substrate 130) is arranged so as to position an opening section 132 that surrounds the light receiving section 142. A diameter of the light receiving section 142 is, for example, 15 μm to 20 μm, and the diameter of the optical filter section 50 is, for example, 70 μm, and an arrangement interval (arrangement pitch) of the optical filter sections 50 in the X-direction and the Y-direction is, for example, 98 μm.

The positive electrode 31 of the light emitting section 30 is arranged between the optical filter sections 50 that are arranged in a matrix shape. In a state that four optical filter sections 50 are arranged to surround one positive electrode 31, the outline of the positive electrode 31 is configured to include a portion of a circular arc, and it is a substantially cross shape. The positive electrodes 31 are also arranged in a matrix shape in the X-direction and the Y-direction.

The functional layer 32 and the negative electrode 33 of the light emitting section 30 are formed in the entire region (the first region in the present invention) where the plurality of light emitting sections 30 and the plurality of optical filter sections 50 are arranged.

A shape, a size, and an arrangement of the light emitting section 30 and the optical filter section 50 are not limited to this.

Next, the configuration and the formation method of the light emitting section 30 and the optical filter section 50 will be described in reference to FIG. 5.

As shown in FIG. 5, first, for example, a translucent alkali-free glass substrate, quartz substrate, etc. is used as the substrate 111. A base insulating film 111c that covers the first surface 111a of the substrate 111 is formed. Next, a semiconductor layer 23a that configures the driving transistor 23 of the pixel circuit 20 is formed on the base insulating film 111c. It is not shown in the drawing, but the semiconductor layer 23a is not only formed on the base insulating film 111c, but also, a semiconductor layer of the switching transistor 21. The semiconductor layer 23a can be formed by using, for example, amorphous silicon or polysilicon.

Next, the gate insulating film 111d that covers the semiconductor layer 23a is formed. A gate electrode 23g that is opposite to the channel region of the semiconductor layer 23a is formed through the gate insulating film 111d. A first interlayer insulating film 111e that covers the gate electrode 23g is formed. A contact hole CNT1, which passes through the first interlayer insulating film 111e and reaches to a first source drain region 23s of the semiconductor layer 23a, and a contact hole CNT2, which reaches to a second source drain region 23d of the semiconductor layer 23a in the same manner, are formed. These contact holes CNT1, CNT2, are both coated, and a conducting film that covers the first interlayer insulating film 111e is formed, and the power line 14 that is electrically connected to the first source drain region 23s through the contact hole CNT1 is formed by patterning the conducting film. Further, the first relay electrode 24 that is electrically connected to the second source drain region 23d through the contact hole CNT2 is formed.

Next, a second interlayer insulating film 111f that covers the power line 14 and the first relay electrode 24 is formed. A contact hole CNT3, which passes through the second interlayer insulating film 111f and reaches to the first relay electrode 24, is formed. The contact hole CNT3 is coated, and a conducting film that covers the second interlayer insulating film 111f is formed, and the second relay electrode 25 is formed by patterning the conducting film.

Next, a third interlayer insulating film 111g that covers the second relay electrode 25 is formed. The reflection layer 26 is formed in an island shape (electrically independent) in a portion that is opposite to the second relay electrode 25 through the third interlayer insulating film 111g. A reflection layer 26 is formed by using, for example, alloy of Al (aluminum) and Nd (neodymium) having light reflectivity.

Next, a dielectric multilayer film 27 that covers the reflection layer 26 and an insulating film 28 are formed. The dielectric multilayer film 27 and the insulating film 28 will be described in detail later. A contact hole CNT4 that passes through the dielectric multilayer film 27 and the insulating film 28 and reaches to the second relay electrode 25 is formed. The contact hole CNT4 is coated, and a transparent conducting film that covers the insulating film 28 is formed, and a positive electrode 31, which is electrically connected to the second relay electrode 25 through the contact hole CNT4, and a transparent layer 51 are formed by patterning the transparent conducting film. The transparent layer 51 is manufactured or processed in different film thickness from the positive electrode 31. In the present embodiment, the transparent layer 51 is etched to be thinner than the film thickness of the positive electrode 31.

A photosensitive resin layer that covers the positive electrode 31 and the transparent layer 51 is formed, and a partition wall 35 that respectively divides and surrounds the positive electrode 31 and the transparent layer 51 by exposing and developing the photosensitive resin layer. The partition wall 35 is formed and overlapped on the respective outer edges of the positive electrode 31 and the transparent layer 51. An opening is formed on the positive electrode 31 and the transparent layer 51 by the partition wall 35.

Next, the functional layer 32, which covers the opening and the partition wall 35 on the positive electrode 31 and the transparent layer 51, is formed. The functional layer 32 includes a light emitting layer that is capable of emitting the near-infrared light IL. Next, a negative electrode 33 that covers the functional layer 32 is formed. In addition, a sealing layer 34 that covers the negative electrode 33 is formed. The functional layer 32, the negative electrode 33, the sealing layer 34 are formed on the entire surface of the substrate 111 by using a film formation method such as, for example, a vacuum vapor deposition, etc. The sealing layer 34 is provided to prevent the functional layer 32 from deteriorating or deactivating the light emitting function by entering moisture or oxygen from an external section to the functional layer 32 through the negative electrode 33. As a material of the sealing layer 34, an inorganic material having both properties of transparency and gas barrier such as, for example, silicon oxynitride, etc. is selected.

The negative electrode 33 is formed as a semi-transmissive reflectivity common electrode having light permeability and light reflectivity. The light emission from the functional layer 32 is not only emitted from the negative electrode 33 side but also emitting from the negative electrode 33 side by transmitting the light through the positive electrode 31, which has translucency, and reflecting the light on the surface of the reflection layer 26 provided in the lower layer. Therefore, the region where the positive electrode 31 and the functional layer 32 are contacted becomes an individual light emission region in the light emitting section 30 (light emitting pixel 18). The partition wall 35 obtains a desired brightness of the light emission from the functional layer 32, and in other words, in order to not interrupt the light emission from the functional layer 32 or the light emission reflected in the reflection layer 26, the aforementioned photosensitive resin layer is formed by exposing and developing to form an angle between the side wall 35a, which forms the aforementioned opening, and the positive electrode 31 in a range of 30 to 60 degrees. Therefore, the cross-sectional shape of the partition wall 35 is a trapezoidal shape.

Figure 6:
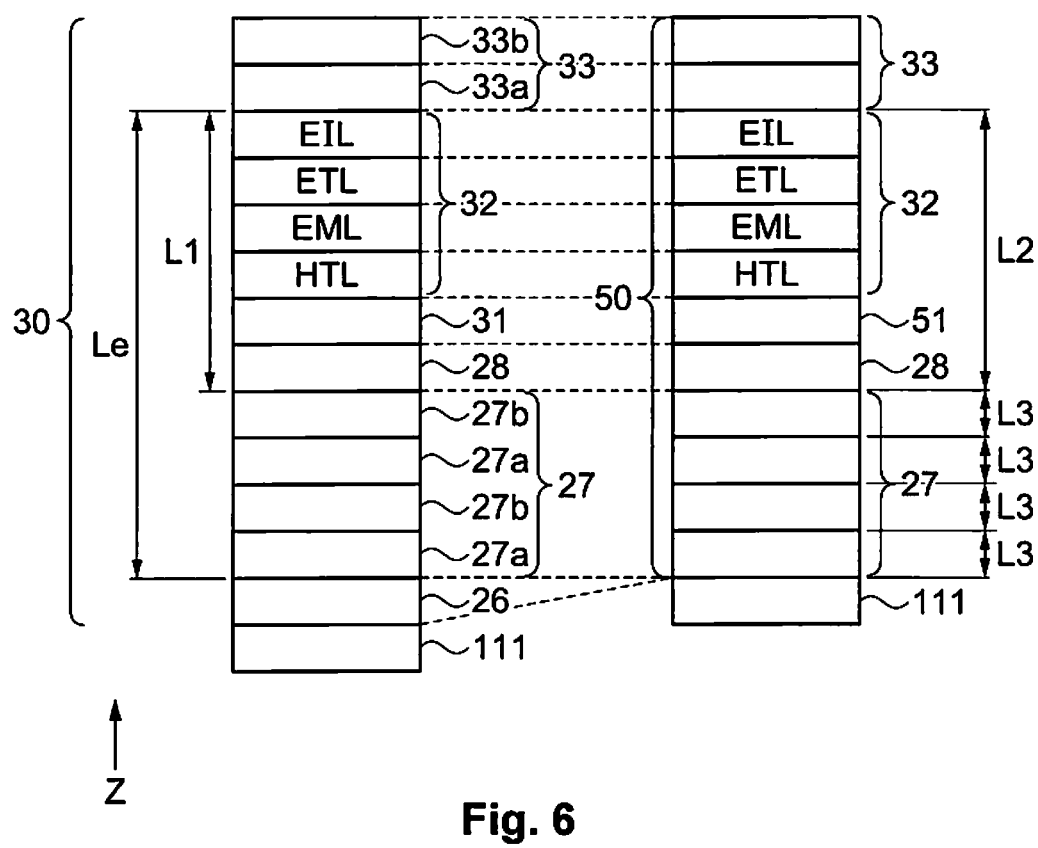
FIG. 6 is a pattern cross-sectional diagram showing a configuration of the light emitting section and the optical filter section.

Next, the configuration of the light emitting section 30 and the optical filter section 50 will be described in more detail in reference to FIG. 6. FIG. 6 is a pattern cross-sectional diagram showing a configuration of the light emitting section and the optical filter section.

As shown in FIG. 6, the light emitting section 30 includes the reflection layer 26, the dielectric multilayer film 27, the insulating film 28, the positive electrode 31, the functional layer 32, and the negative electrode 33 that are laminated and formed in this order on the substrate 111.

The negative electrode 33 is the lamination of the first layer 33a, which is made of alloy of Ag and Mg, and the second layer 33b, which is made of Mg. The first layer 33a is formed by using alloy including Ag, and both of the light permeability and the light reflectivity are functioned by controlling the film thickness of the first layer 33a. The second layer 33b is a single layer of Mg because the first layer 33a made of the alloy including Ag is easily subjected to deterioration under the influence of moisture or oxygen so that the second layer 33b functions as a protection layer of the first layer 33a. The second layer 33b is not limited to a single layer of Mg, and MgO (magnesium oxide) may be used. Further, a translucent resin layer that moisture or oxygen is hardly permeable may be used.

As described above, the negative electrode 33 has the semi-transmissive reflectivity so that the light emission from the functional layer 32 is repeatedly reflected between the reflection layer 26 and the negative electrode 33, and after that, it is transmitted and emitted through the negative electrode 33. Therefore, in the light emitting section 30, the resonance occurs in response to an optical distance (length) Le between the reflection layer 26 and the negative electrode 33. That is, the light intensity of the specific resonance wavelength within the light emitting wavelength range of the functional layer 32 is enhanced and emitted. In the present embodiment, the configuration of such light emitting section 30 is called as the first optical resonance structure. The aforementioned optical distance (length) Le in the first optical resonance structure is called as a resonance length Le.

The reflection layer 26 is not indispensable member in the first optical resonance structure, but even though the light intensity of the specific resonance wavelength becomes smaller in comparison with the case that the reflection layer 26 is provided, the optical resonance structure may be configured between the dielectric multilayer film 27 and the negative electrode 33.

The optical filter section 50 includes the dielectric multilayer film 27, the insulating film 28, the transparent layer 51, the functional layer 32, and the negative electrode 33 that are laminated and formed in this order on the substrate 111. Since the negative electrode 33 has the semi-transmissive reflectivity, the light entered to the optical filter section 50 is repeatedly reflected between the dielectric multilayer film 27 and the negative electrode 33, and after that, it is transmitted through the dielectric multilayer film 27 and is emitted from the substrate 111 side. Therefore, the resonance occurs in response to an optical distance (length) L2 between the dielectric multilayer film 27 and the negative electrode 33 in the optical filter section 50. That is, the light intensity of the specific resonance wavelength within the wavelength range of the light (including the reflected light RL) entered to the optical filter section 50 is enhanced, and the intensity of the light other than the specific resonance wavelength is reduced and it is transmitted through the substrate 111. In this embodiment, the configuration of such optical filter section 50 is called as the second optical resonance structure. The aforementioned optical distance (length) L2 in the second optical resonance structure is called as a resonance length L2.

The dielectric multilayer film 27, the insulating film 28, the functional layer 32, the negative electrode 33 are shared in the light emitting section 30 and the optical filter section 50.

Dielectric Multilayer Film:

The dielectric multilayer film 27 is configured by four layers in which the first dielectric film 27a and the second dielectric film 27b having different refractive indexes are alternately laminated.

The first dielectric film 27a can be formed by, for example, silicon oxide or silicon nitride. In the present embodiment, silicon nitride is used. The second dielectric film 27b is formed by using a material that has larger refractive index than the first dielectric film 27a. In the present embodiment, the second dielectric film 27b is formed by using a-Si (amorphous silicon) in the present embodiment. The material that has larger refractive index than silicon nitride used in the first dielectric film 27a includes titanium oxide, etc., but in view of suppressing the transmission of the visible light, and in view of realizing an optical distance (length) as the dielectric multilayer film 27 in the minimum numbers of laminating layers, a-Si that has larger refractive index that titanium oxide, etc. is employed.

The optical distance (length) L3 in each of the first dielectric film 27a and the second dielectric film 27b is set to become ¼ of the specific wavelength λ. An optical distance (length) L3 in the Z-direction of each layer in the dielectric multilayer film 27 is obtained by the product of the film thickness and the refractive index. Therefore, the optical distance (length) of the dielectric multilayer film 27 that is the four layers configuration is four times of L3, and that is, it is the same as the specific wavelength λ.

The insulating film 28 is provided between the dielectric multilayer film 27 and the positive electrode 31 or the transparent layer 51. The surface side of the positive electrode 31 of the dielectric multilayer film 27 or the transparent layer 51 becomes the second dielectric film 27b in which a-Si having conductivity is used so that the positive electrode 31 and the second dielectric film 27b are electrically insulated. In the present embodiment, the insulating film 28 is formed by using the silicon nitride. When the dielectric multilayer film 27 is made of an insulating material, the insulating film 28 may be omitted.

The light entered from the first substance having the first refractive index to the second substance having the second refractive index, which is higher than the first refractive index, is reflected at a boundary surface between the first substance and the second substance. That is, in the light emitting section 30, a part of the light, which emits from the light emitting layer (EML) and transmits through the positive electrode 31 and goes toward the reflection layer 26, is reflected at the boundary surface between the insulating film 28 made of silicon nitride and the second dielectric film 27b made of a-Si. In the same manner, it is reflected at the boundary surface between the first dielectric film 27a made of silicon nitride and the second dielectric film 27b made of a-Si. In each of the first dielectric film 27a and the second dielectric film 27b, the optical distance (length) L3 is set to λ/4 and the phase of the light reflected at the aforementioned boundary surface is inverted so that the dielectric multilayer film 27 in the light emitting section 30 functions as a dielectric mirror in which the light of the specific wavelength λ is selectively reflected. The light transmitting the dielectric multilayer film 27 is reflected in the reflection layer 26 so that in the reflection layer 26, the first dielectric film 27a that the refractive index is smaller than the second dielectric film 27b is laminated.

The positive electrode 31 and the transparent layer 51 are formed by using, for example, a transparent conducting film such as ITO film, etc. As described above, the positive electrode 31 and the transparent layer 51 have different film thickness. An optical distance (length) is obtained by the product of the film thickness of the layer (substance) that the light is transmitted as described above and the refractive index.

The film thickness of the positive electrode 31 is larger than the transparent layer 51. Therefore, an optical distance (length) between the dielectric multilayer film 27 and the negative electrode 33 in the light emitting section 30, that is, resonance length L1 is longer than a resonance length L2 between the dielectric multilayer film 27 and the negative electrode 33 in the optical filter section 50. When the discussion of the optical distance (length) of each layer configuring the light emitting section 30 and the optical filter section 50 is presented, the value indicated by the product of each layer of the film thickness and the refractive index is called as an optical film thickness. The refractive index is relied on the wavelength of the light that transmits through each layer, and as the wavelength of the light is longer, the refractive index becomes smaller.

Functional Layer:

The functional layer 32 is configured to include the HTL (hole injection transport layer), the EML (light emitting layer), the ETL (electron transport layer), and the EIL (electron injection layer) that are laminated in this order from the positive electrode 31 side.

The light emitting section 30 in the present embodiment is to emit the near-infrared light IL as described above. As the configuration of the functional layer 32 that emits the near-infrared light IL, the well-known configuration can be applied. In the present embodiment, the following material constitution of each layer is employed considering the luminance efficiency and the light emission lifetime.

Hole Injection Transport Layer:

The HTL (hole injection transport layer has a function to transport a hole received from the positive electrode 31 to the light emitting layer (EML). Therefore, it is preferable that the hole injection transport material included in the HTL (hole injection transport layer) has the injectability and the transportability of the holes, and an aromatic amine compound as shown in the following chemical formula (1), in which a part of the skeleton A is selected from phenylenediamine series, benzidine series, and terphenylenediamine series, is preferably used.

Chemical formula (I):

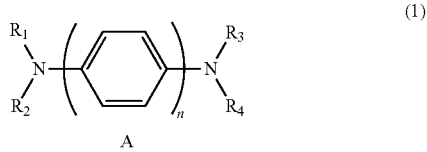

$R_1$ to $R_4$ independently represent a substituted or unsubstituted aromatic functional group, and specifically, a substituted or unsubstituted aryl functional group is preferable, and a phenyl group, a biphenyl group, a terphenyl group, and a triaryl amino group are preferable. It is n=1 to 3.

As phenyldiamine compounds that A is n=1, it includes the following compounds indicated in chemical formulas HTL1 to HTL7.

Chemical formula (2):
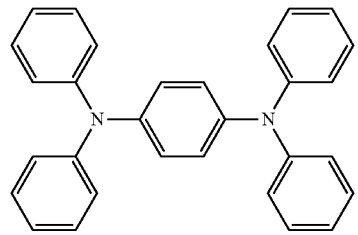
HTL1
HTL2
HTL3
HTL4

HTL5
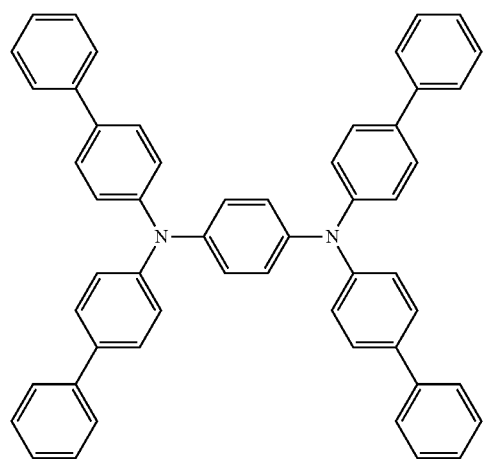
HTL6
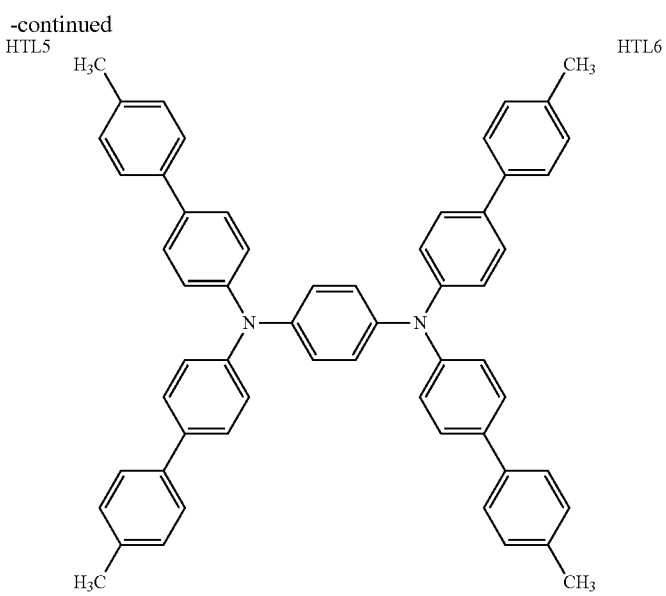
HTL7
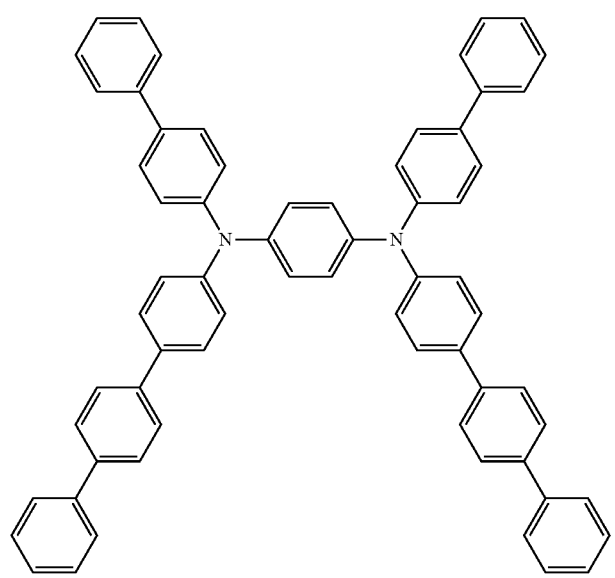
As the compounds of bezidine series that A is n=2, it includes the following compounds represented in the chemical formulas HTL8 to HTL16.
Chemical formula (3):
HTL8
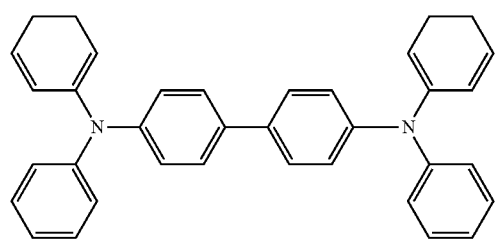

HTL9
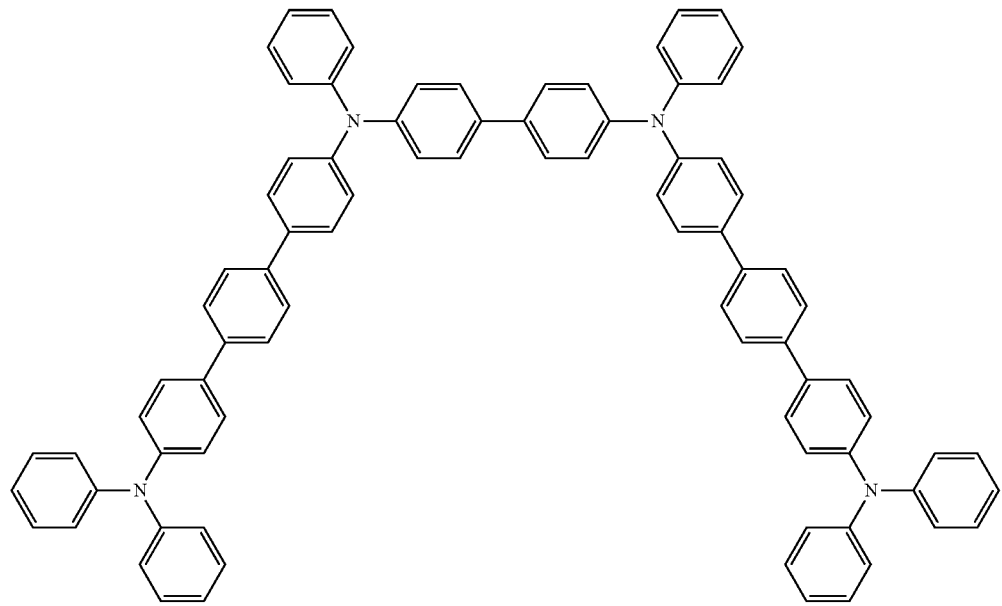
HTL10
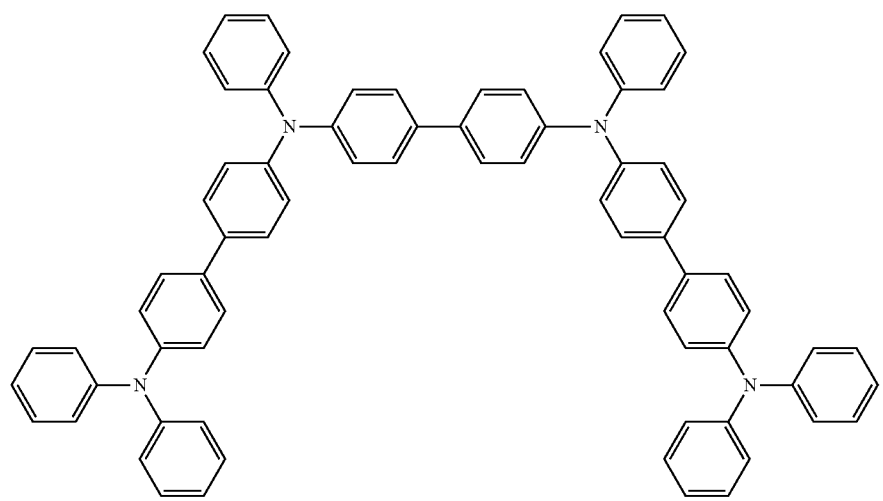
HTL11 HTL12
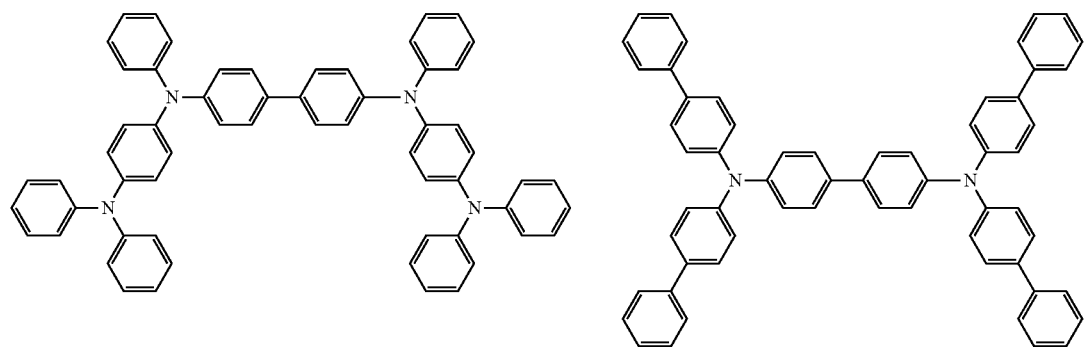

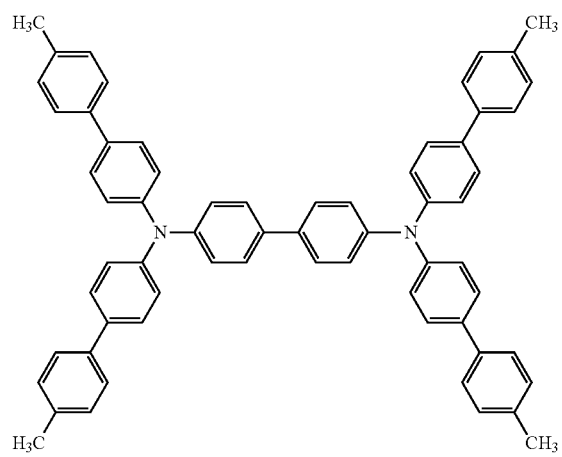
HTL13
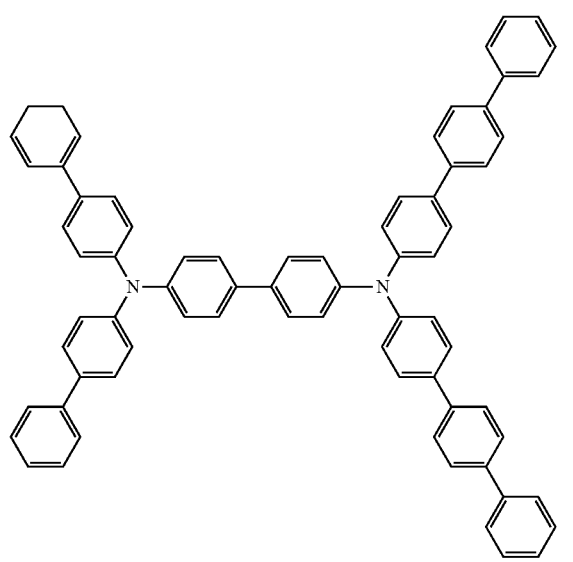
HTL14
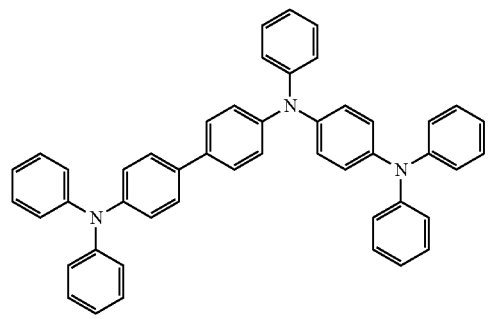
HTL15
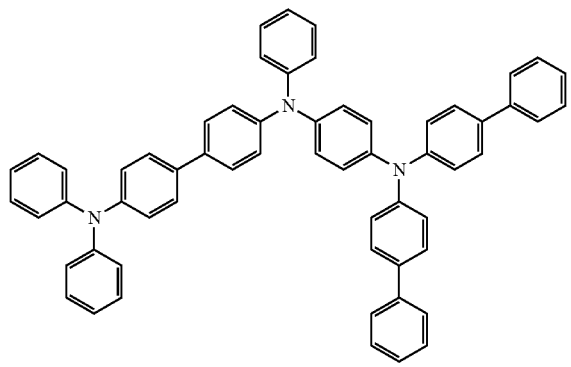
HTL16
As the compounds of terphenylenediamine series that A is n=3, it includes the following compounds represented in the chemical formulas HTL17 to HTL25.
Chemical formula (4):
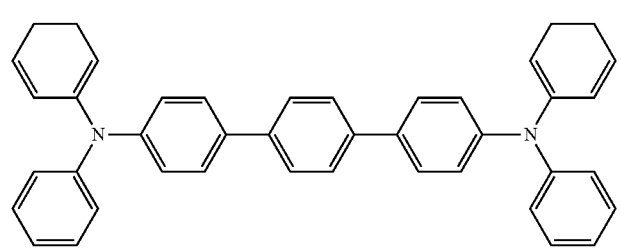
HTL17

HTL18
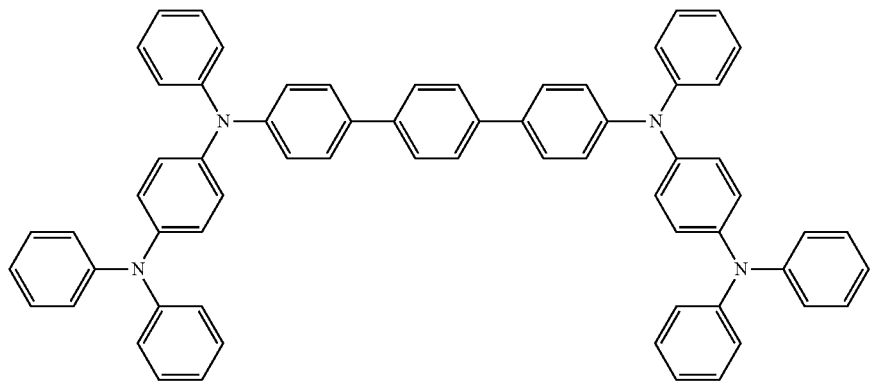
HTL19
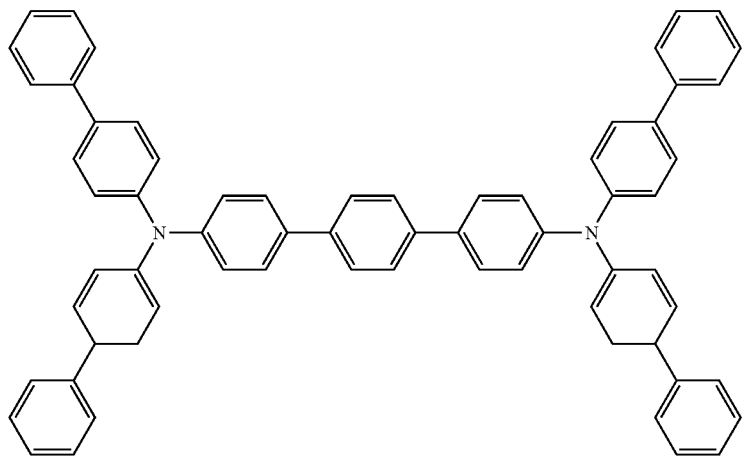
HTL20
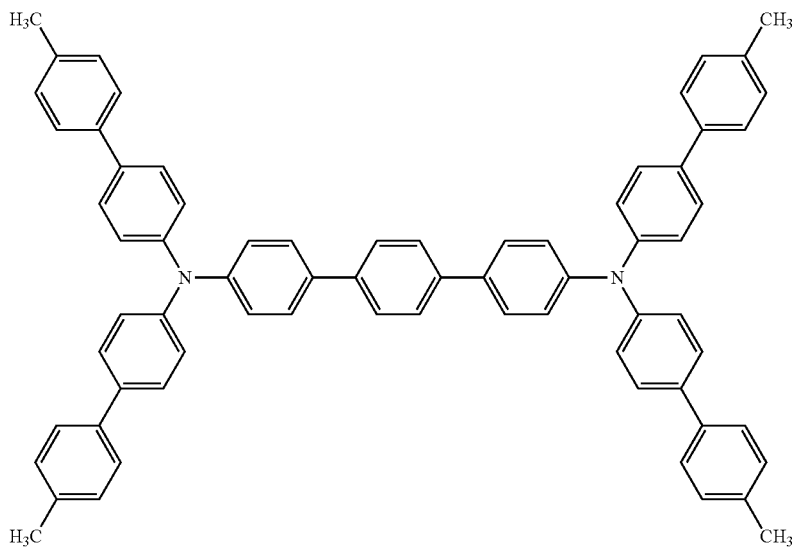

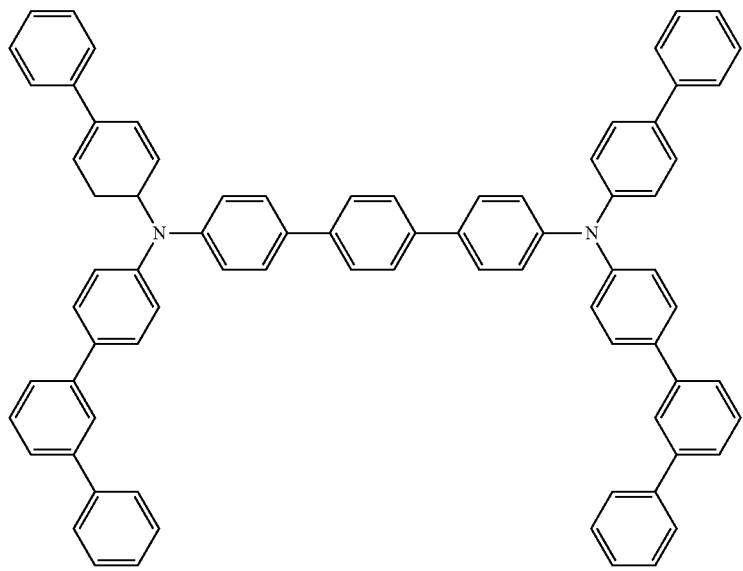
HTL21
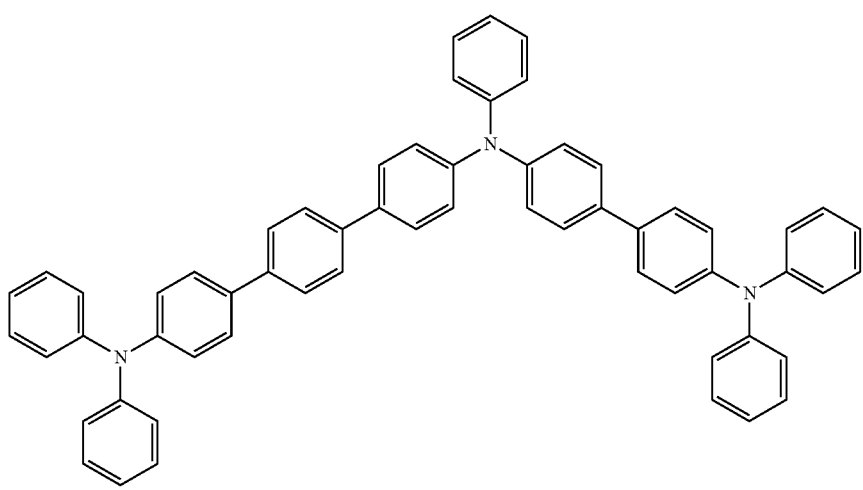
HTL22
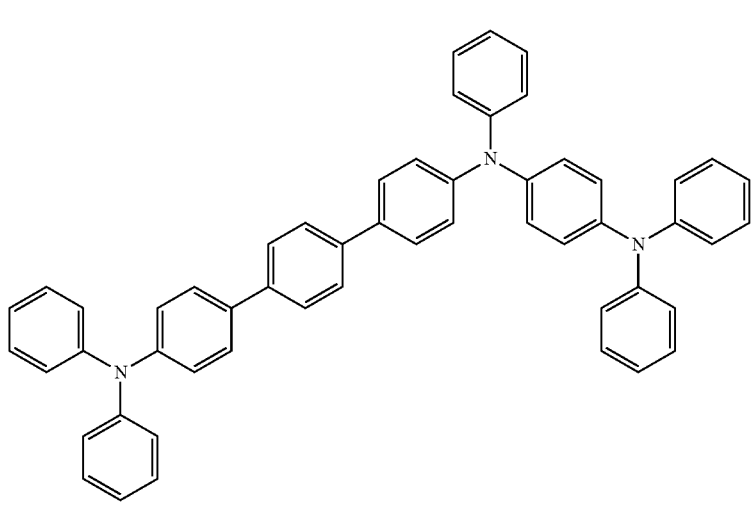
HTL23

-continued

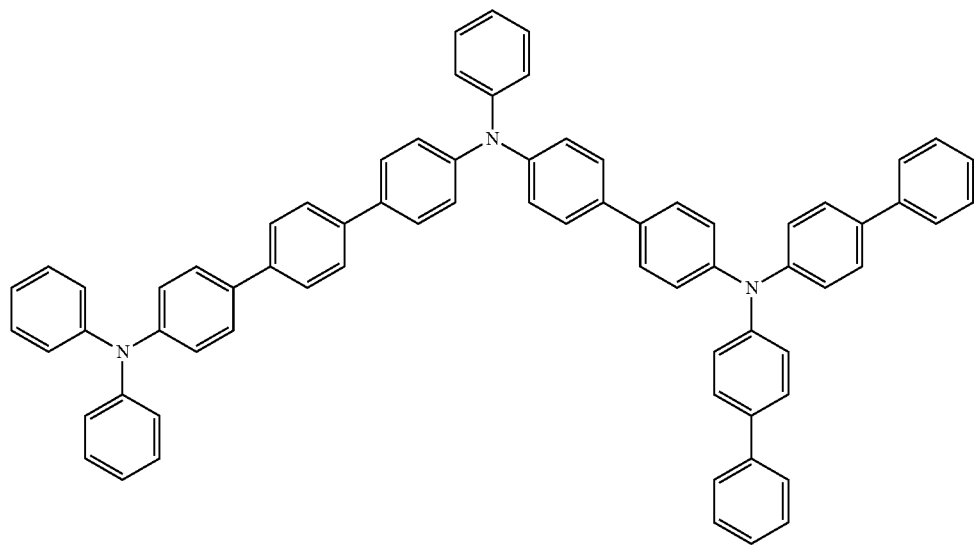

HTL24

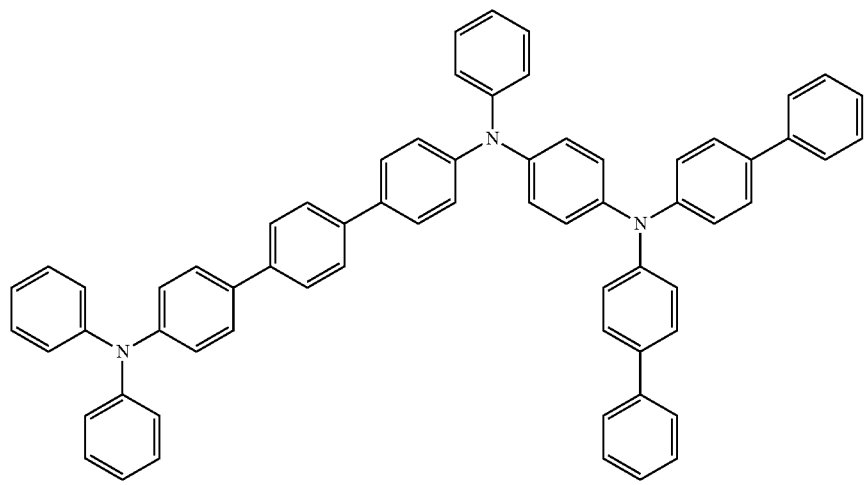

HTL25

An average thickness of such HTL (hole injection transport layer) is not specifically limited, but it is preferably approximately 5 nm to 200 nm, and more preferably, it is approximately 10 nm to 100 nm.

It is not limited to that the HTL (hole injection transport layer) is only provided between the positive electrode 31 and the light emitting layer. For example, it may be a plurality of layers including a hole injection layer that easily injects hole from the positive electrode 31 and a hole transportation layer that easily transports hole to the light emitting layer. Further, it may include a layer that has a function to block electrons leaking from the light emitting layer to the positive electrode 31 side.

Light Emitting Layer:

As a luminescent material, the EML (light emitting layer) is configured to include compounds (hereinafter simply referred to as "thiadiazole-based compounds or selenadiazole-based compounds") that the basic skeleton is represented in the following chemical formula (5).

Chemical formula (5):

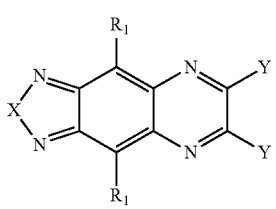

(5)

In chemical formula (5), X represents S or Se, Y represents a functional group, and a ring may be formed.

Specifically, it is preferable to use thiadiazole-based compounds in the following chemical formulas EML1 to EML8.

Chemical formula (6):
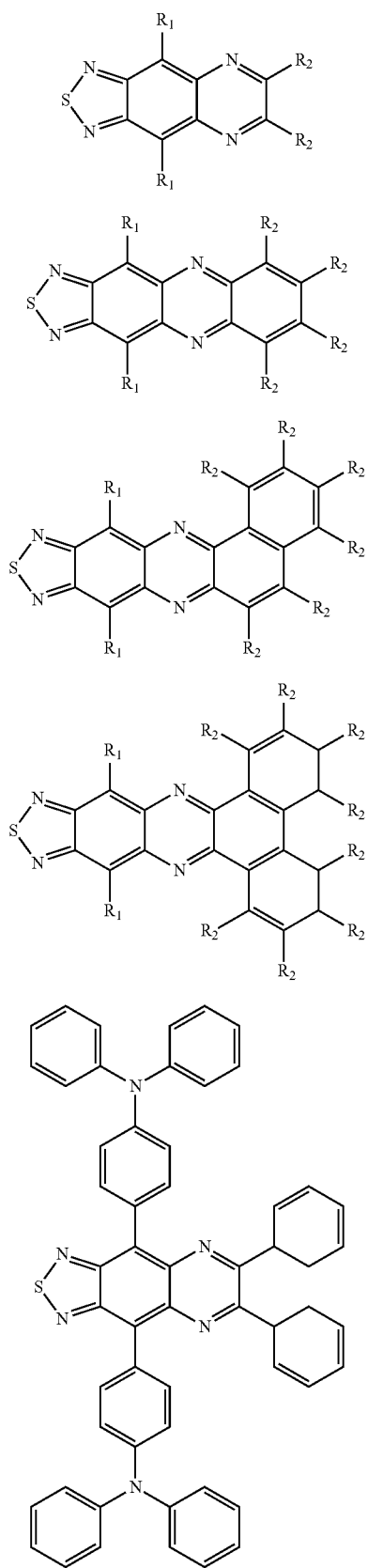
EML1
EML2
EML3
EML4
EML5
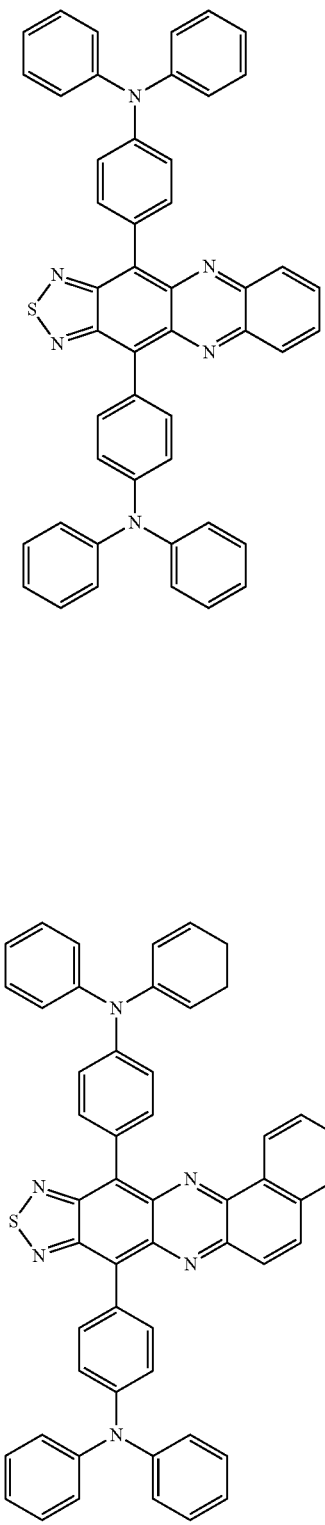
EML6
EML7

EML8

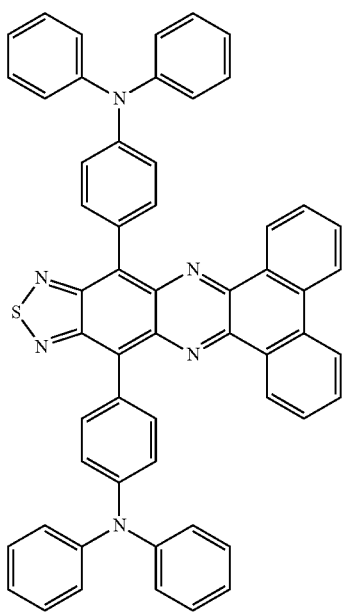

R₁ is preferably aromatic compound (it may have substituent or may not have substituent). Specifically, aryl group, aryl group having substituent, arylamino group, and thiophenyl group are preferable. As the aryl group, phenyl group, and naphthyl group are preferable. As the aryl group having substituent, triphenyl amino group is preferable.

R₂ is preferably hydrogen, alkyl group, alkoxy group, ester group, or aromatic compound (it may have substituent or may not have substituent). Specifically, aryl group, aryl group having substituent, arylamino group, and thiophenyl group are preferable. As the aryl group, phenyl group, and naphthyl group are preferable.

The EML (light emitting layer) including such compounds can obtain the light emission in the wavelength region (near-infrared region) of 700 nm to 1500 nm.

The EML (light emitting layer) may include luminescent materials (various types of fluorescent materials, various types of phosphorescent materials) other than the aforementioned luminescent material.

Further, as the constituent material of the EML (light emitting layer), in addition to the aforementioned luminescent material, a host material is used so that the luminescent material is added (supported) as a guest material (dopant). The host material is recombined with the holes and the electrons and generates excitons, and the energy of the excitons are transferred to the luminescent material (Forscter transfer or Dexter transfer), and it has a function to excite the luminescent material. Therefore, the luminance efficiency of the light emitting section 30 can be enhanced. As such host material, for example, the luminescent material which is the guest material is used by doping as a dopant.

Specifically, as the host material, quinoinolato metal complex or acene-based organic compound is preferably used. An anthracene-based material or a tetracene-based material is preferable, and the tetracene-based material is more preferable. When the host material of the EML (light emitting layer) includes the acene-based material, the electrons can be efficiently delivered from the electron transport material of the ETL (electron transport layer) to the acene-based material in the EML (light emitting layer).

Further, an acene-based material has excellent resistance for the electrons or the holes. Also, the acene-based material has excellent thermostability. Therefore, the long life of the light emitting section 30 can be provided. Further, the acene-based material has excellent thermostability so that when the EML (light emitting layer) is formed by using a vapor phase film deposition method, it prevents the host material from degradation by the heat when the film is forming. Therefore, the EML (light emitting layer) having excellent membranous can be formed, and as the results, in this point, also, the luminance efficiency of the light emitting section 30 can be enhanced and the long life can be provided.

In addition, the acene-based material is hart to emit itself so that it can prevent an emission spectrum of the light emitting section 30 from affecting negative influence from the host material.

The tetracene-based material has at least one tetracene skeleton in one molecule, and also, it is not specifically limited if the material demonstrates a function as the aforementioned host material. For example, for the basic skeleton, the following compound represented in chemical formula IRH-1 is preferable, the following compound represented in chemical formula IRH-2 is more preferable, and the following compound represented in chemical formula IRH-3 is further preferable. Therefore, the voltage rise at the time of continuous drive can be suppressed, and in addition, the luminance efficiency of the light emitting section 30 is enhanced, and the long life of the light emitting section 30 can be provided.

Chemical formula (7):

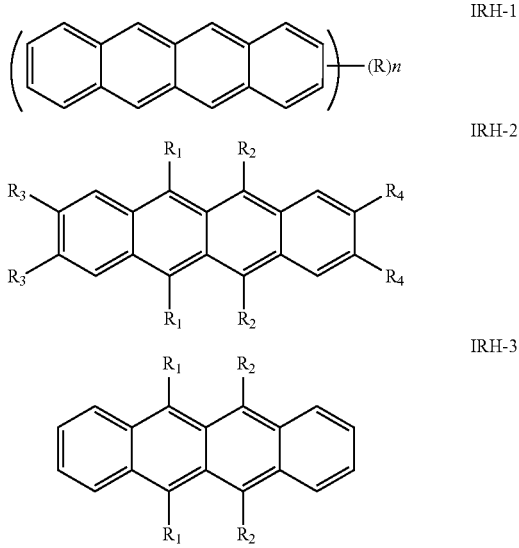

In the aforementioned chemical formula IRH-1, n represents natural numbers 1 to 12, and R represents a substituent or a functional group, indicating aryl group, arylamino group that may individually include hydrogen atom, alkyl group, and substituent. Also, in the aforementioned chemical formulas IRH-2, IRH-3, $R_1$ to $R_4$ indicate aryl group, arylamino group that may individually include hydrogen atom, alkyl group, and substituent. Further, $R_1$ to $R_4$ may be the same each other or may be different each other.

Further, the tetracene-based material used as the host material is preferably configured by carbon atom and hydrogen atom. Because of this, it can prevent the host material and the luminescent material from occurring unexpected interactions. Therefore, the luminance efficiency of the light emitting section 30 can be enhanced. Further, the resistance of the host material for the electrons or holes can be enhanced. Therefore, the voltage rise at the time of continuous drive can be suppressed, and also, the long life of the light emitting section 30 can be provided.

Specifically, as the tetracene-based material, for example, the compounds represented in the following chemical formulas H-1 to H-27 are preferably used.

Chemical formula (8):

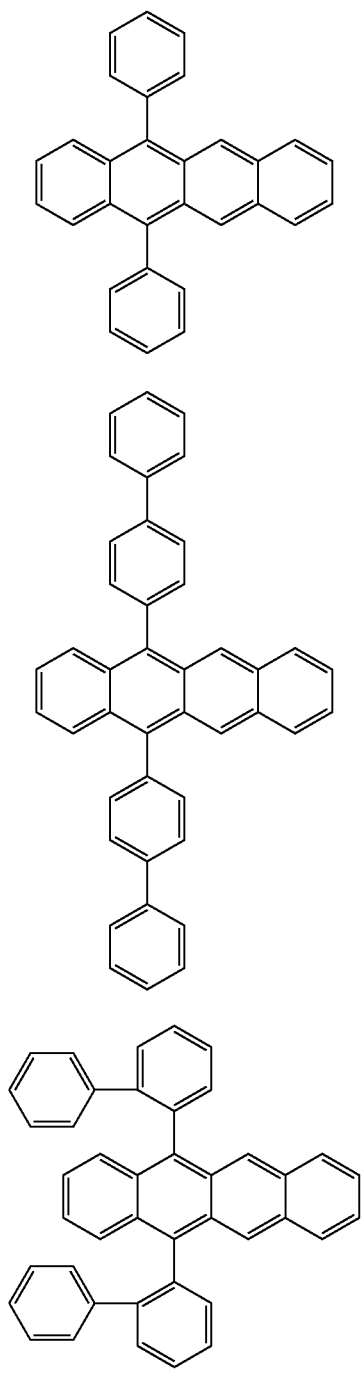

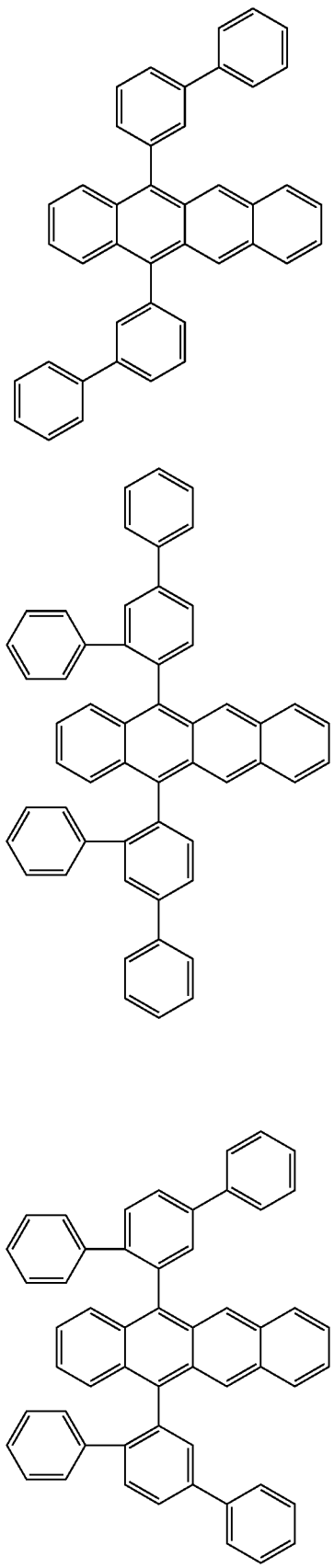

H-7
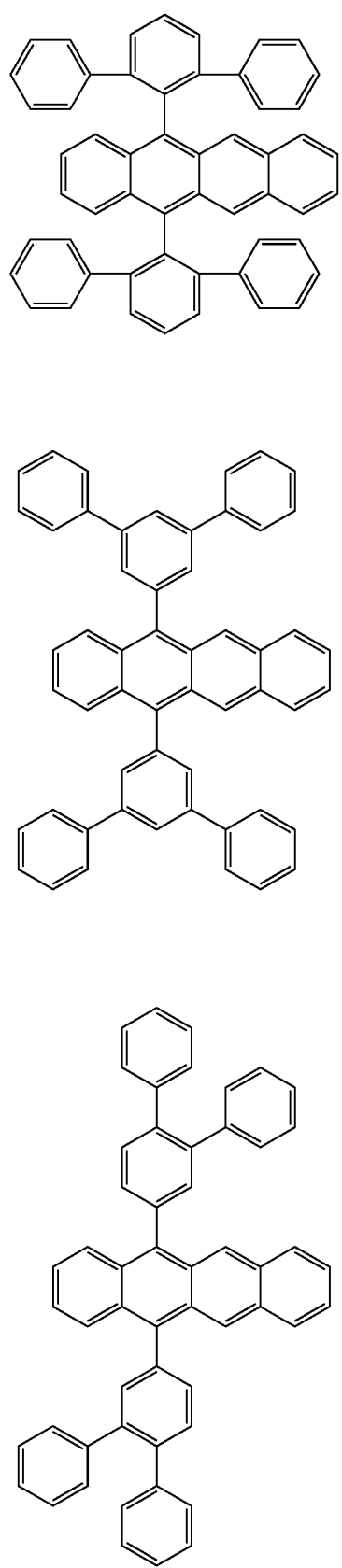
H-8
H-9
H-10
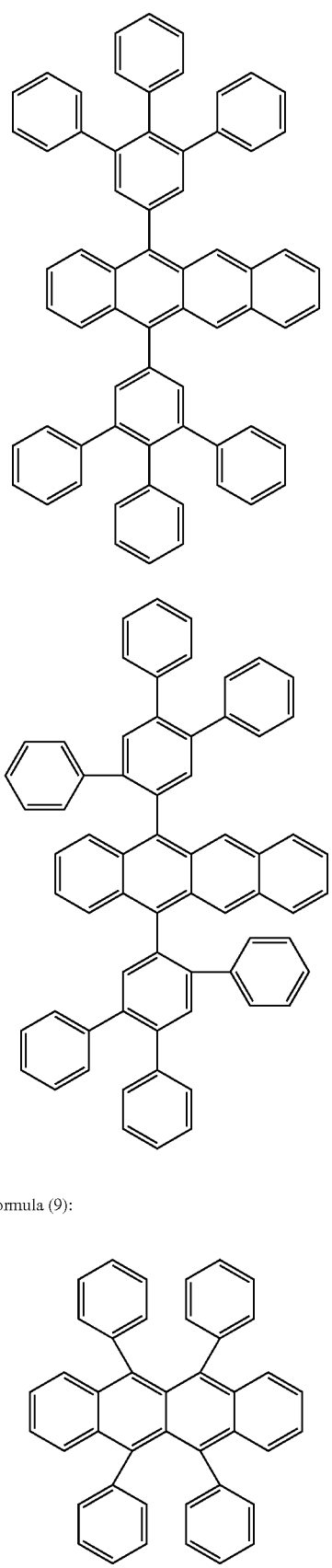
H-11
Chemical formula (9):
H-12

H-13
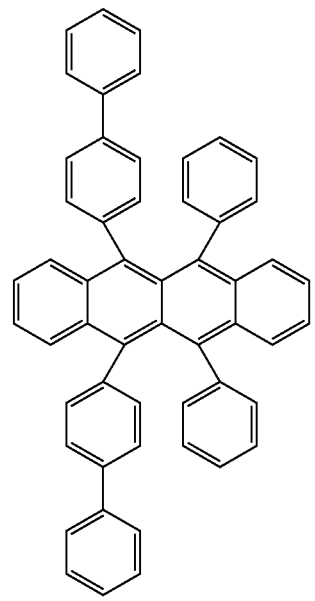
H-14
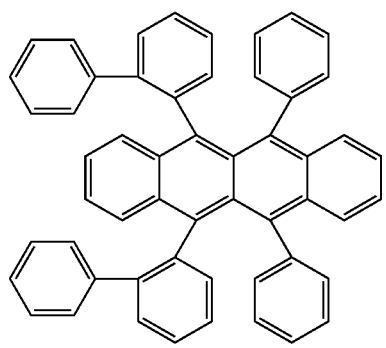
H-15
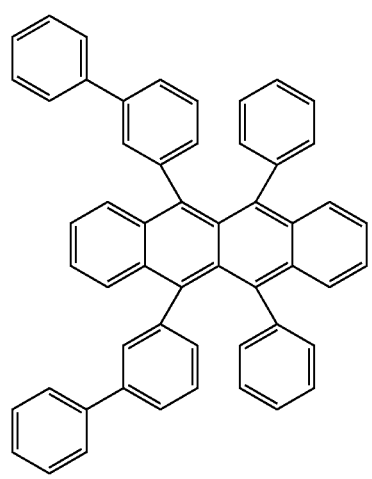
H-16
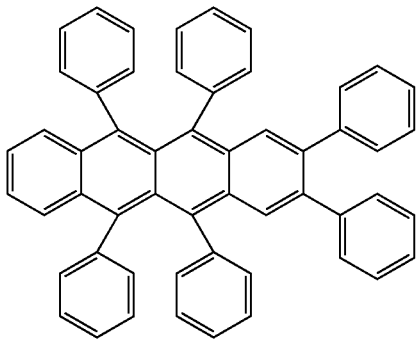
H-17
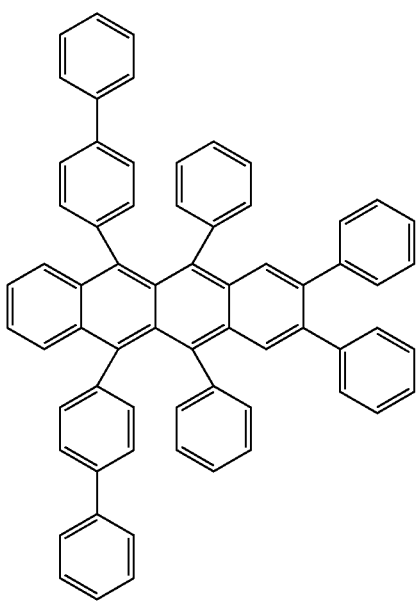
H-18
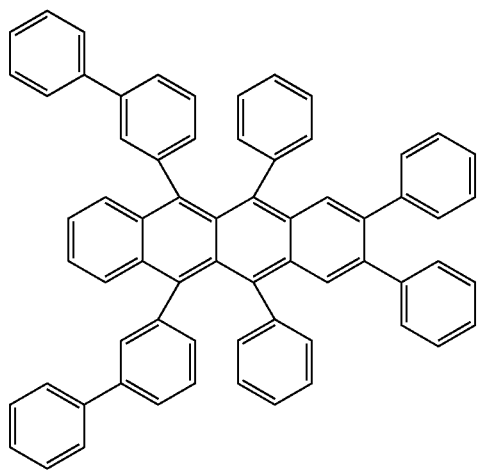

H-19
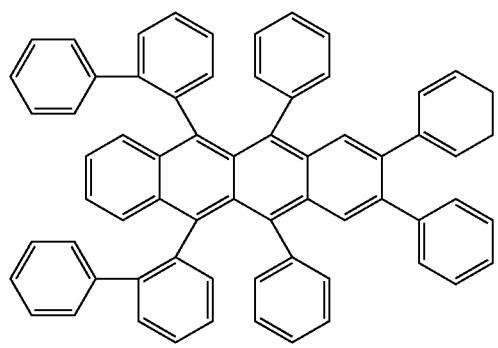
H-20
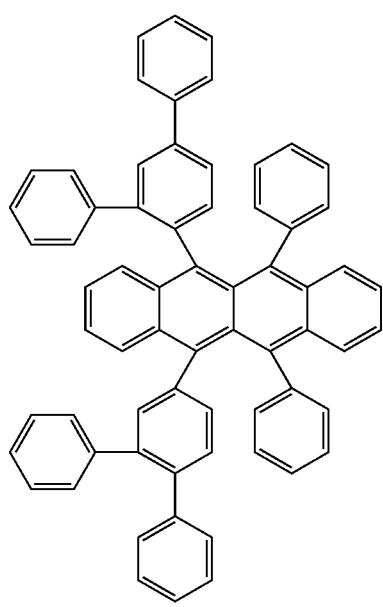
H-21
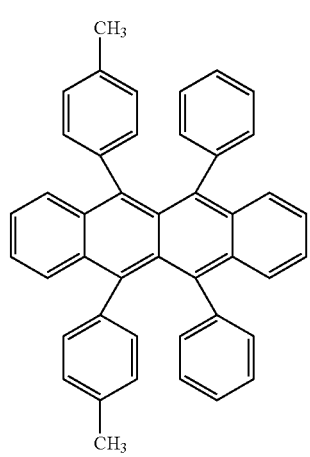
H-22
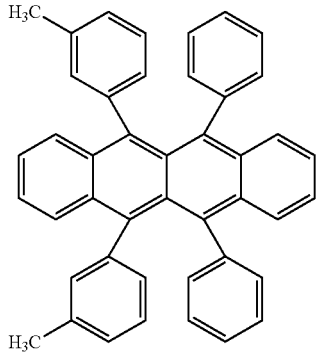
H-23
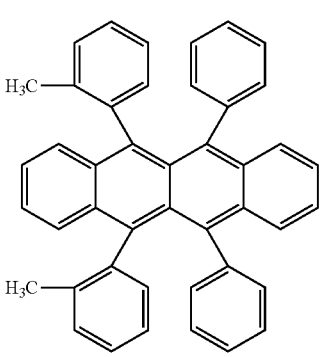
H-24
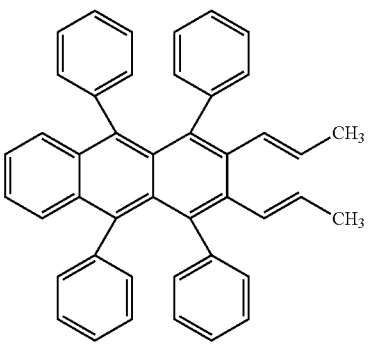
H-25
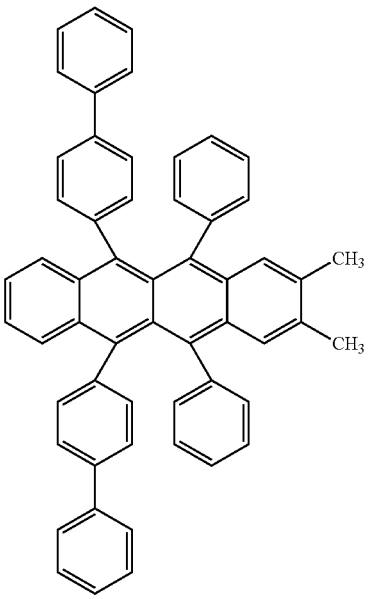

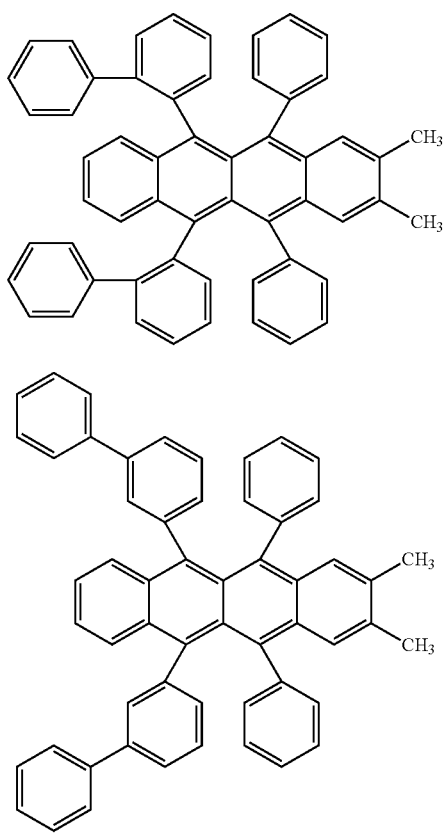

H-26

H-27

The content (doping amount) of the luminescent material in the EML (light emitting layer) that includes such luminescent material and host material is preferably 0.01 wt % to 10 wt %, and it is more preferably 0.1 wt % to 5 wt %. By setting the content of the luminescent material in this range, the luminance efficiency can be optimized.

Further, an average thickness of the EML (light emitting layer) is not specifically limited, but it is preferably approximately 1 nm to 60 nm, and more preferably, it is approximately 3 nm to 50 nm.

Electron Transport Layer:

The ETL (electron transport layer) has a function that transports the electrons, which are injected from the negative electrode 33 through the EIL (electron injection layer), to the EML (light emitting layer).

As a constituent material (electron transport material) of the ETL (electron transport layer), for example, it includes phenanthroline derivative such as 2,9-dimethyl-4,7-diphenyl-1,10-phenanthroline (BCP), etc., 8-quinolinol such as tris(8-quinolinolato)aluminum (Alq3), etc. or quinolone derivative such as organic metal complex, etc. and its derivative as ligand, azaindolizine derivative, oxadiazole derivative, perylene derivative, pyridine derivative, pyrimidine derivative, quinoxaline derivative, dephenyl quinone derivative, nitro-substituted fluorine derivative, etc., and among them, one or more can be used together.

Further, when the ETL (electron transport layer) is used by combining more than two among the aforementioned electron transport materials, it may be configured in a mixed material that mixes more than two electron transport materials or it may be configured by laminating a plurality of layers that configuring different electron transport materials.

Specifically, in the EML (light emitting layer), when tetracene derivative is used as a host material, it is preferable that the ETL (electron transport layer) includes azaindolizine derivative. More preferably, it includes azaindolizine derivative having anthracenen skeleton in molecule. The electrons can be efficiently delivered to the host material from the anthracenen skeleton in the azaindolizine derivative molecule.

As the azaindolizine derivative, it includes the compounds represented in the following chemical formulas ETL-A1 to A24, ETL-B1 to B12, and ETL-C1 to C20.

Chemical formula (10):

ETL-A1

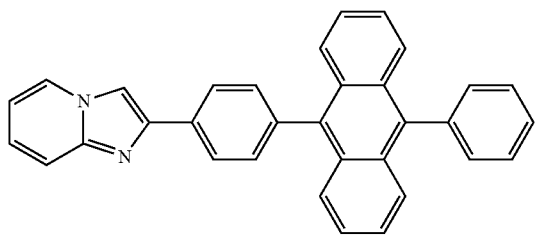

ETL-A2

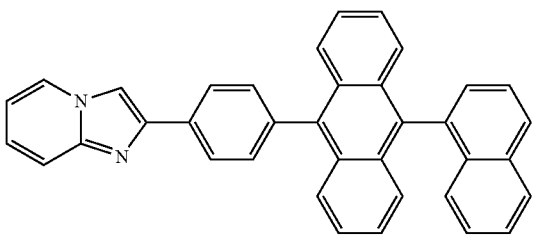

ETL-A3

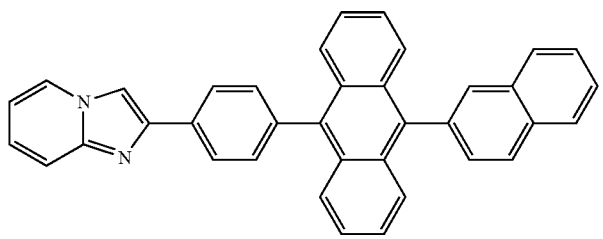

ETL-A4

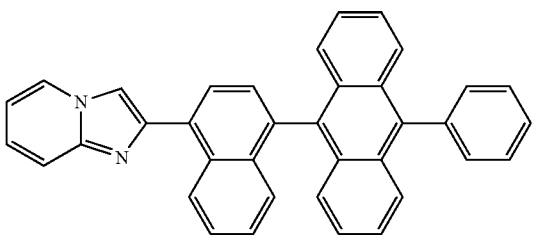

-continued
ETL-A5
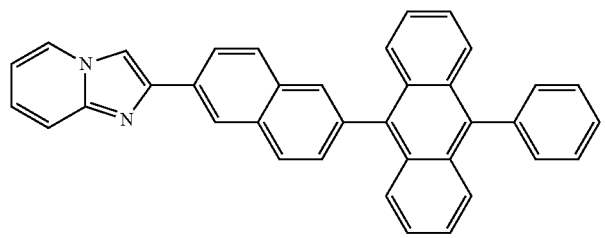
ETL-A6
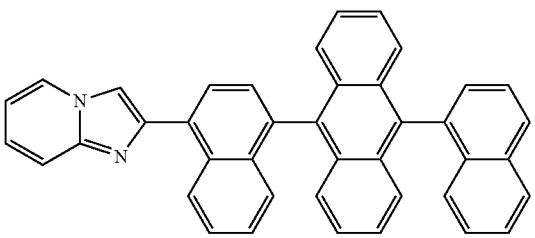
ETL-A7
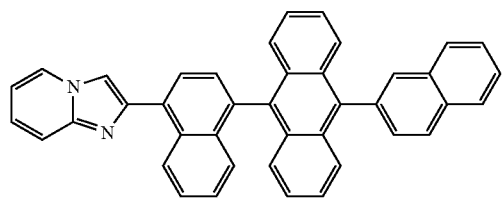
ETL-A8
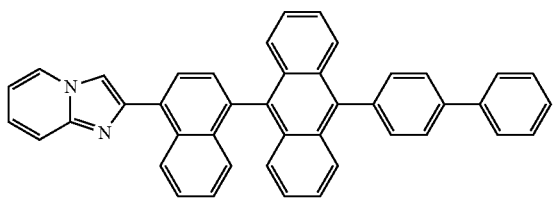
ETL-A9
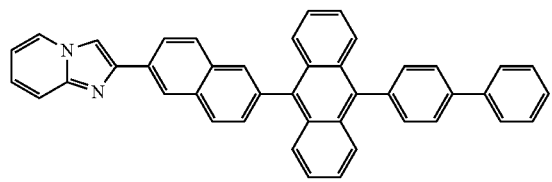
ETL-A10
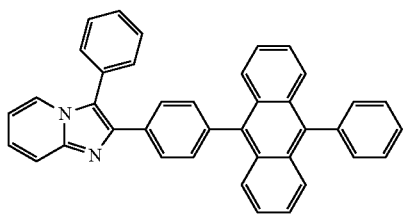
ETL-A11
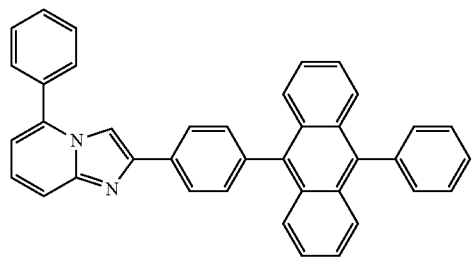
ETL-A12
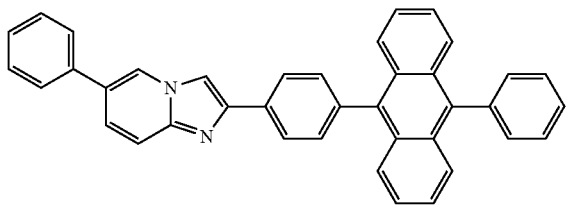
ETL-A13
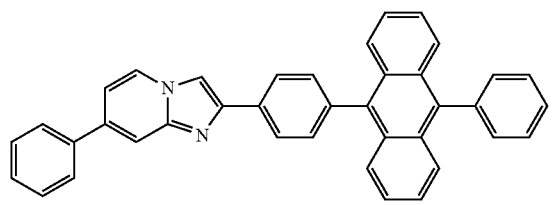
ETL-A14
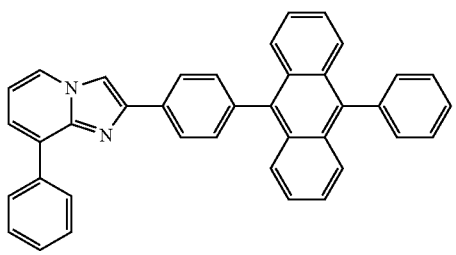
ETL-A15
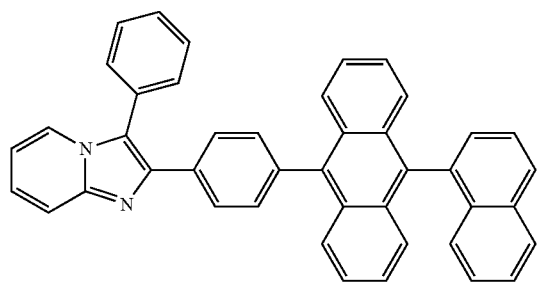
ETL-A16
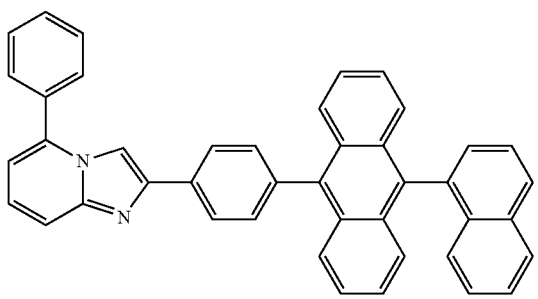

-continued
ETL-A17
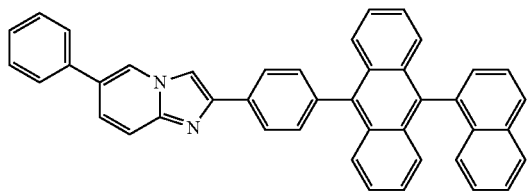
ETL-A18
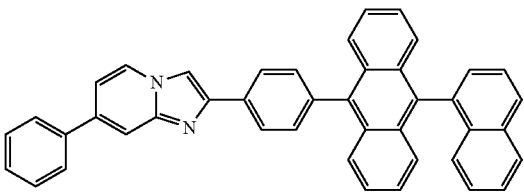
ETL-A19
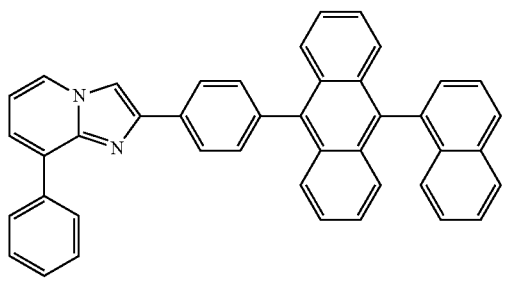
ETL-A20
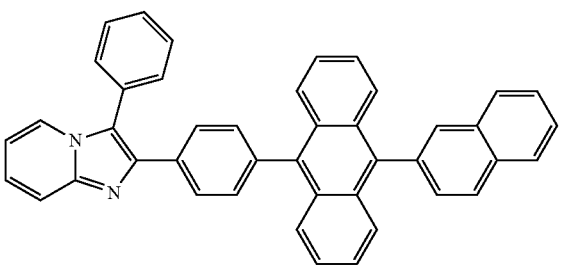
ETL-A21
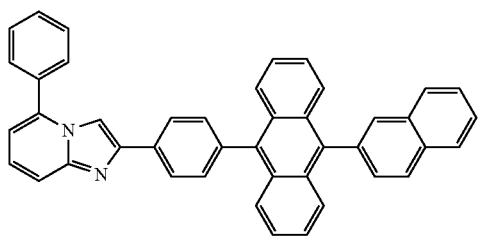
ETL-A22
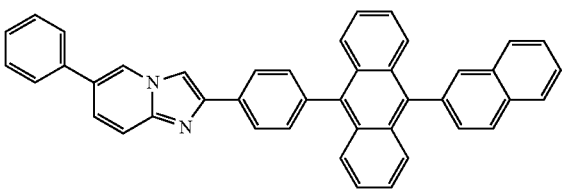
ETL-A23
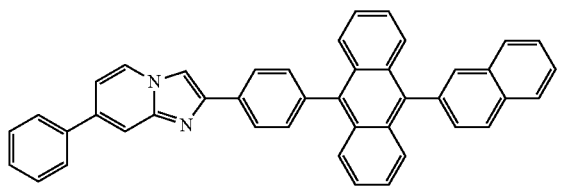
ETL-A24
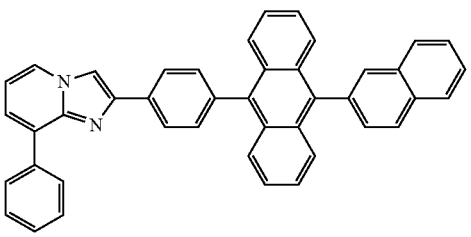
Chemical formula (11):
ETL-B1
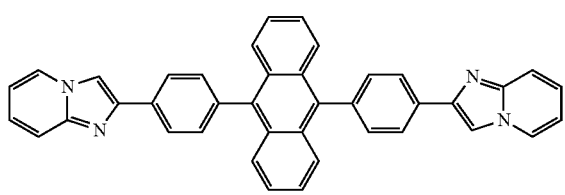
ETL-B2
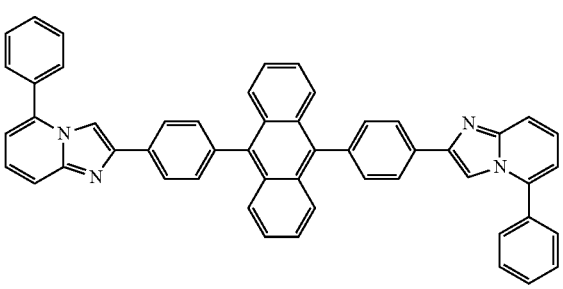

-continued
ETL-B3
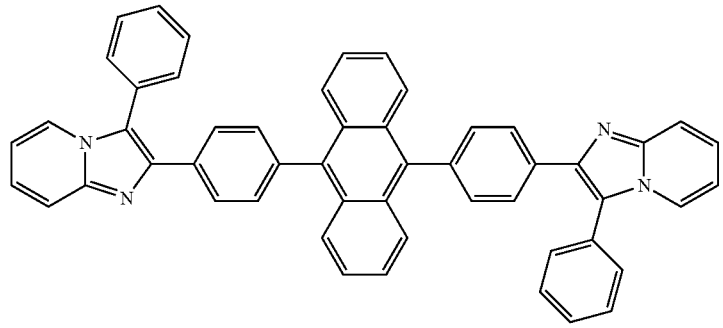
ETL-B4
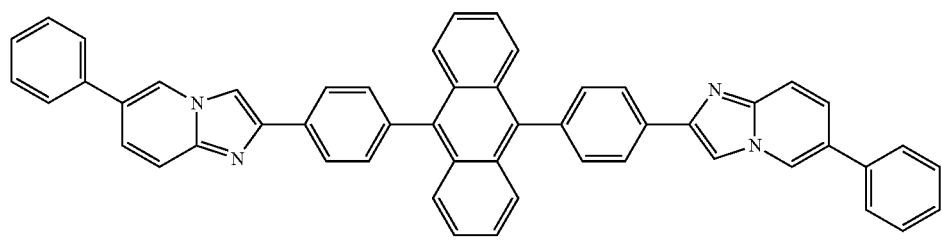
ETL-B5
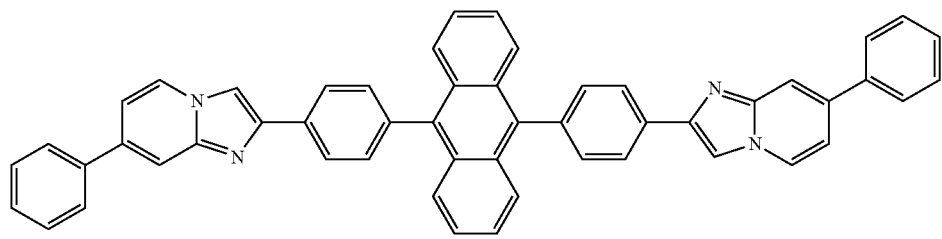
ETL-B6
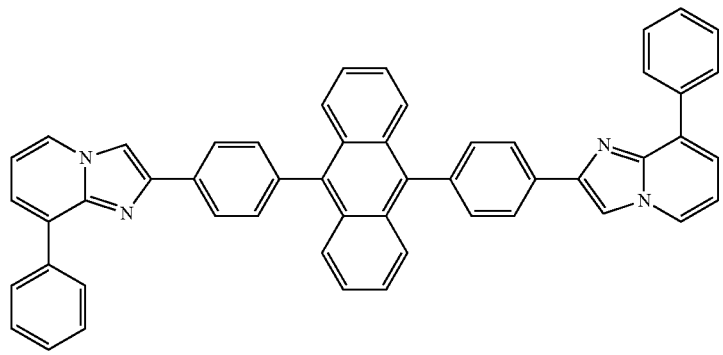
ETL-B7
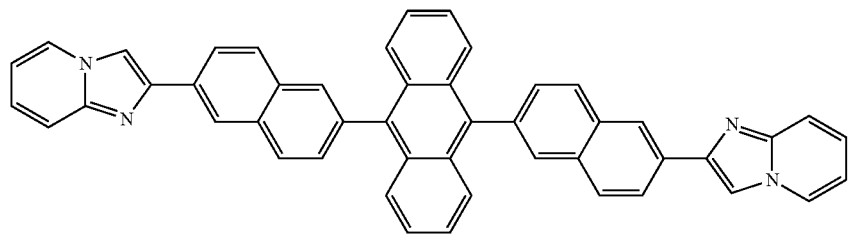

ETL-B8
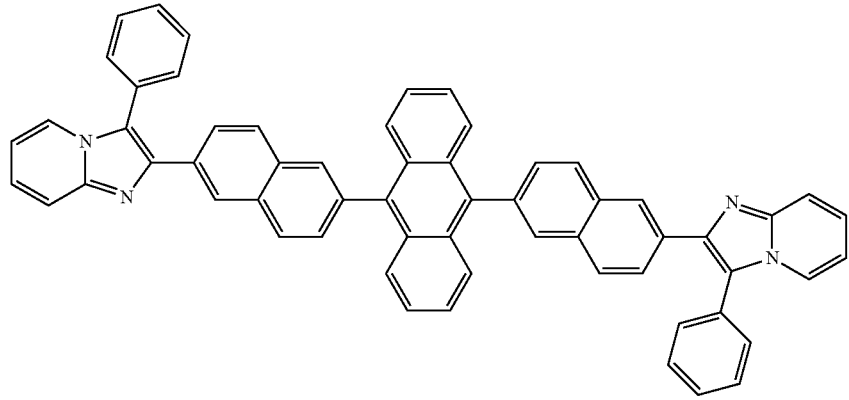
ETL-B9
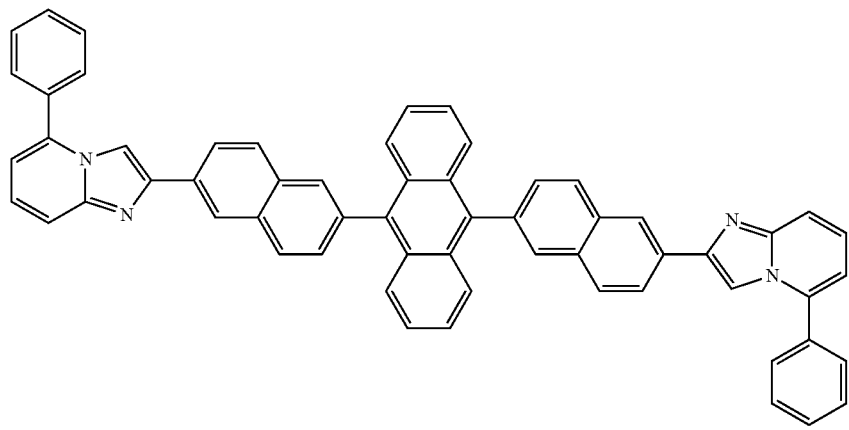
ETL-B10
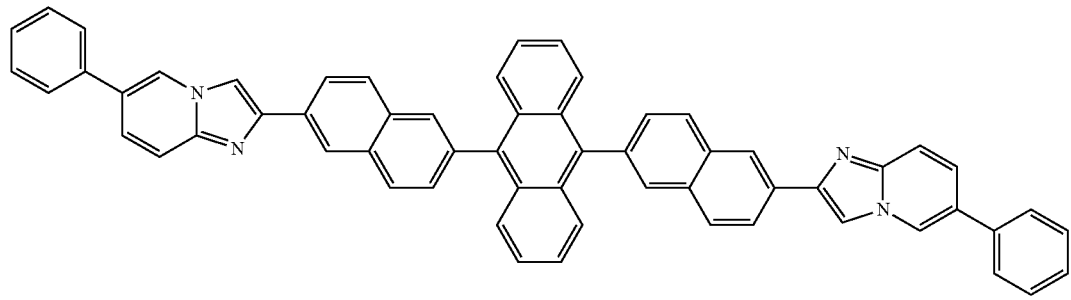
ETL-B11
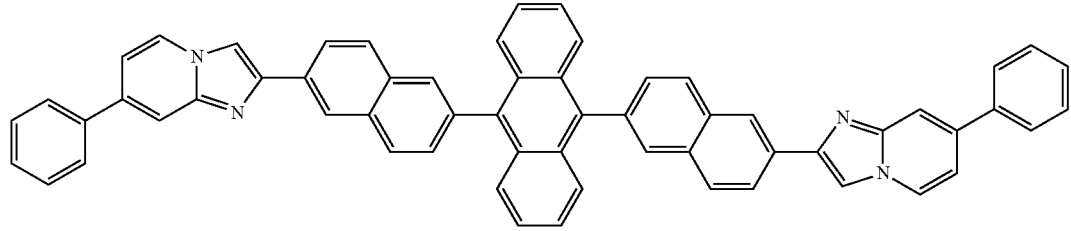

-continued
ETL-B12
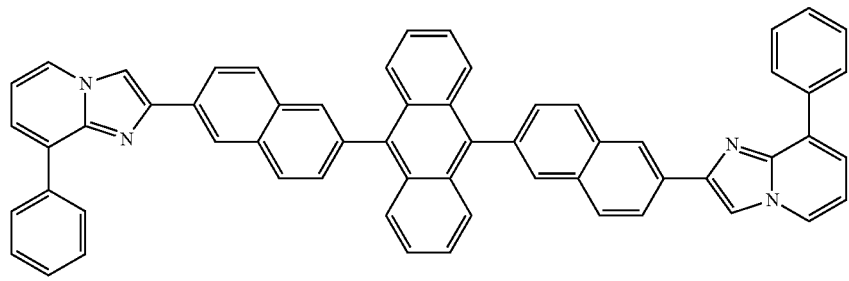
Chemical formula (12):
ETL-C1
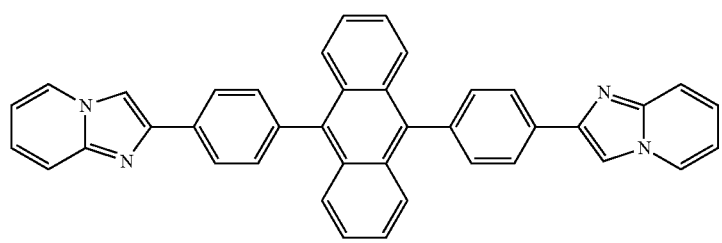
ETL-C2
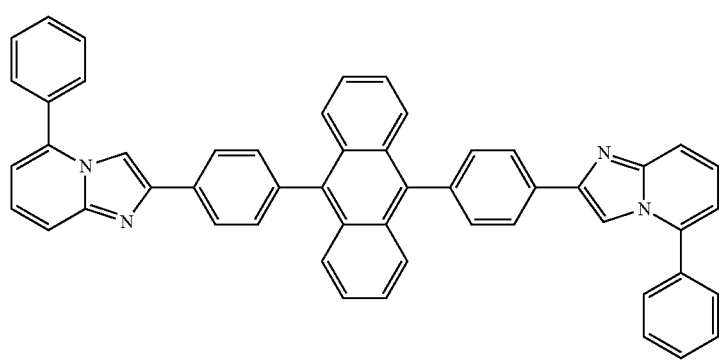
ETL-C3
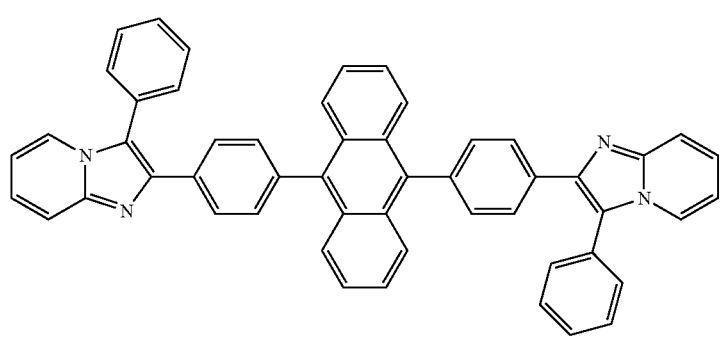
ETL-C4
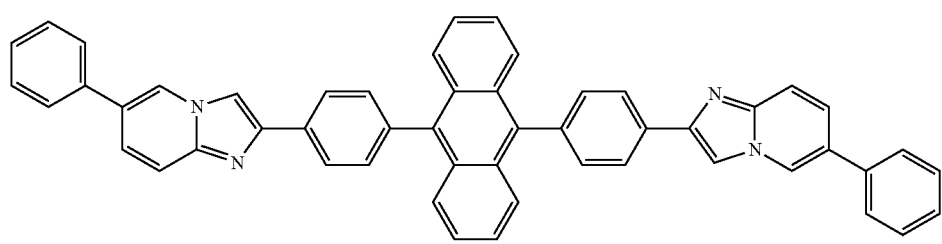

ETL-C5
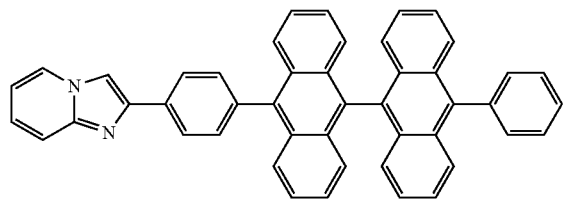
ETL-C6
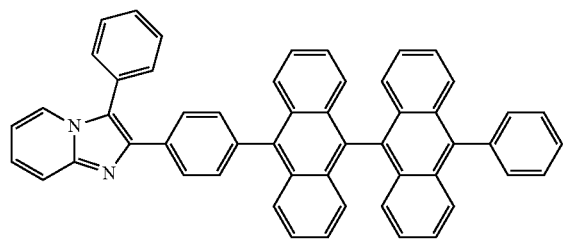
ETL-C7
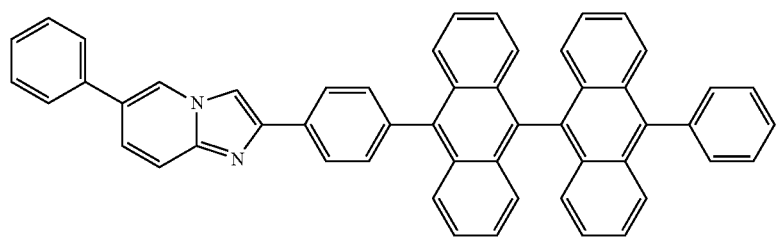
ETL-C8
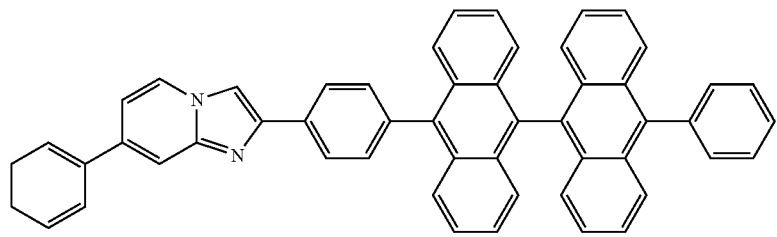
ETL-C9
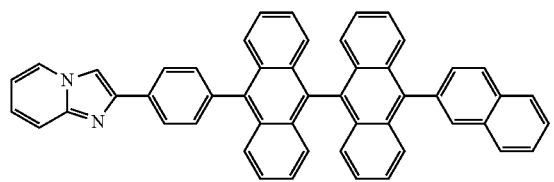
ETL-C10
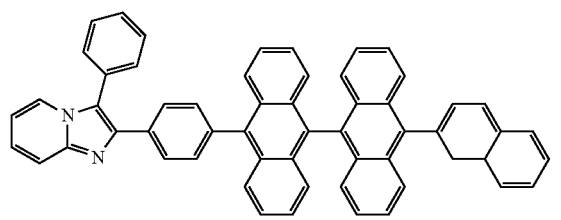
ETL-C11
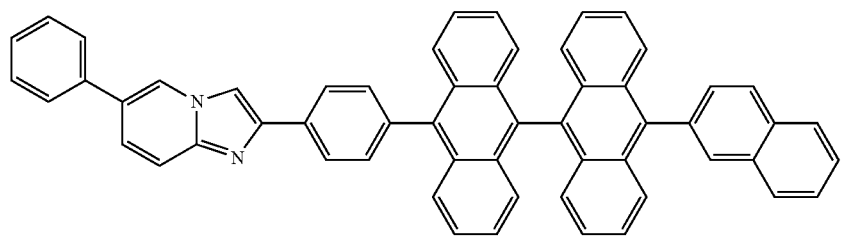
ETL-C12
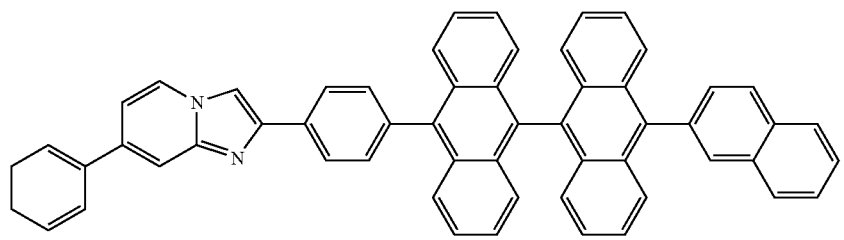

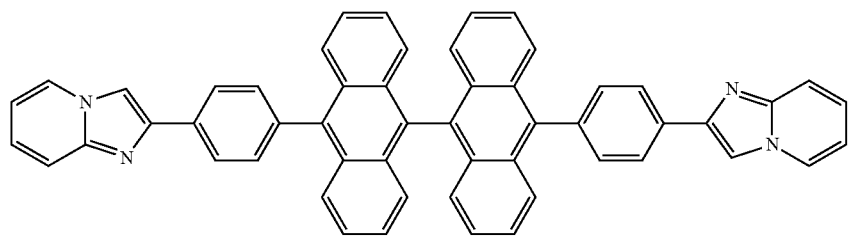
ETL-C13
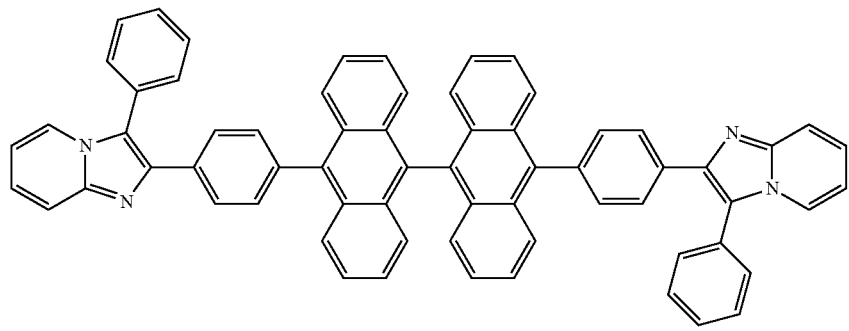
ETL-C14
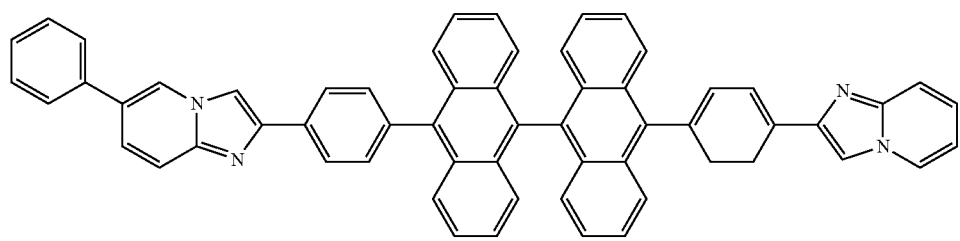
ETL-C15
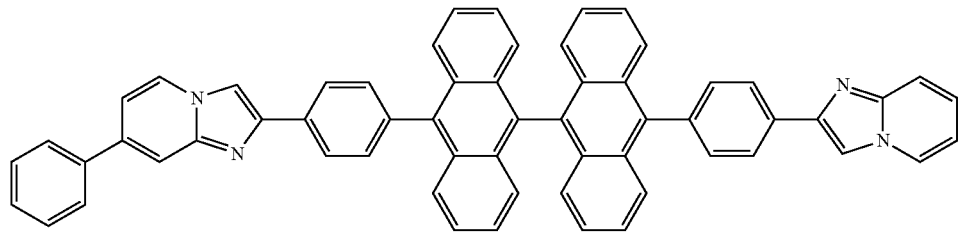
ETL-C16
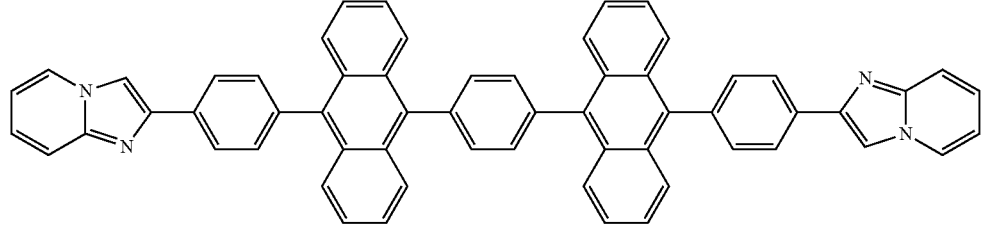
ETL-C17
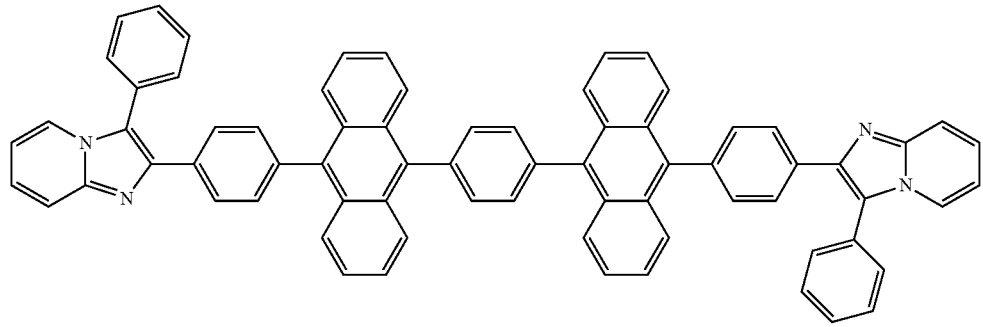
ETL-C18

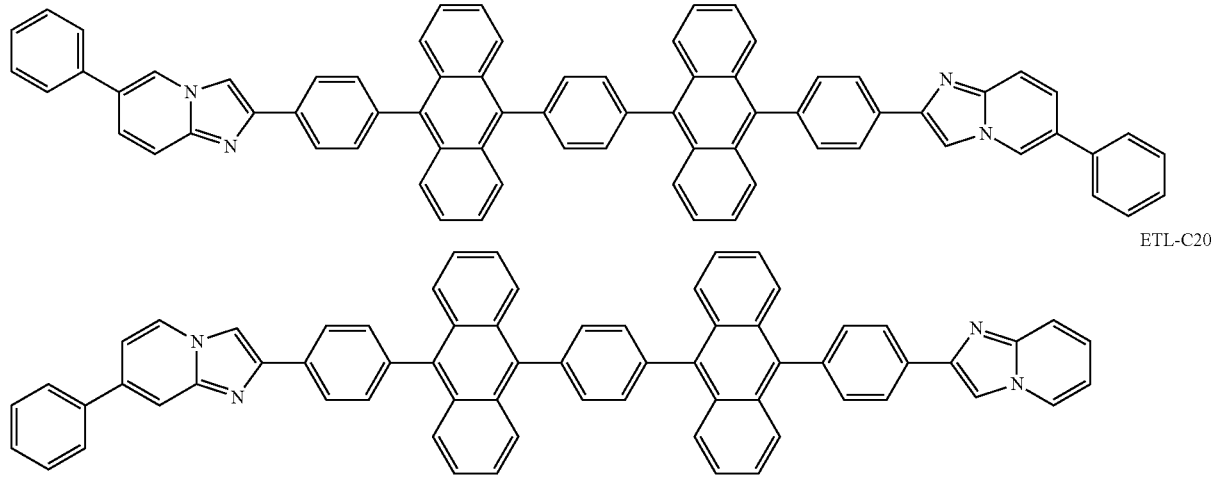

The average thickness of the ETL (electron transport layer) is not specifically limited, but it is preferably approximately 1 nm to 200 nm, and more preferably, it is approximately 10 nm to 100 nm.

The layer provided between the EML (light emitting layer) and the EIL (electron injection layer) is not limited to the ETL (electron transport layer). For example, a plurality of layers such as a layer that the electrons are easily injected from the EIL (electron injection layer), a layer that the electrons are easily transported to the light emitting layer, or a layer that controls the amount of the electrons, which are injected to the EML (light emitting layer) may be included. Further, a layer that has a function to block the leaking of the holes from the EML (light emitting layer) to the EIL (electron injection layer) may be included.

Electron Injection Layer:

The EIL (electron injection layer) has a function that improves the electron injection efficiency from the negative electrode 33.

As the constituent material (electron injectability material) of such EIL (electron injection layer), for example, it includes various types of inorganic insulating materials, and various types of inorganic semiconductor materials.

As such inorganic insulating materials, for example, it includes alkali metal chalcogenide (oxide, sulfide, selenide, telluride), alkaline earth metal chalcogenide, a halide of alkali metal, a halide of alkali earth metal, etc., and one or more materials may be used together. By configuring the EIL (electron injection layer) with such material as a main material, the electron injectability can be improved. Specifically, the work function of alkali metal compound (alkali metal chalcogenide, a halide of alkali metal, etc.) is very small, and by using such compound for the configuration of the EIL (electron injection layer), the high luminance can be obtained in the light emitting section 30.

As alkali metal chalcogenide, for example, it includes $Li_2O$, LiO, $Na_2S$, $Na_2Se$, NaO, etc.

As alkaline earth metal chalcogenide, for example, it includes CaO, BaO, SrO, BeO, BaS, MgO, CaSe, etc.

As a halide of alkali metal, for example, it includes CsF, LiF, NaF, KF, LiCl, KCl, NaCl, etc.

As a halide of alkali earth metal, for example, it includes $CaF_2$, $BaF_2$, $SrF_2$, $MgF_2$, $BeF_2$, etc.

Further, as the inorganic semiconductor materials, for example, it includes oxide, nitride, oxynitride, etc. including at least one element of Li, Na, Ba, Ca, Sr, Yb, Al, Ga, In, Cd, Mg, Si, Ta, Sb and Zn, and one or more materials may be used together.

An average thickness of the EIL (electron injection layer) is not specifically limited, but it is preferably approximately 0.1 nm to 1000 nm, and more preferably, it is approximately 0.2 nm to 100 nm, and further more preferably, it is approximately 0.2 nm to 50 nm.

The EIL (electron injection layer) may be omitted depending on the constituent material of the negative electrode 33 and the ETL (electron transport layer), or the thickness.

Figure 7A:
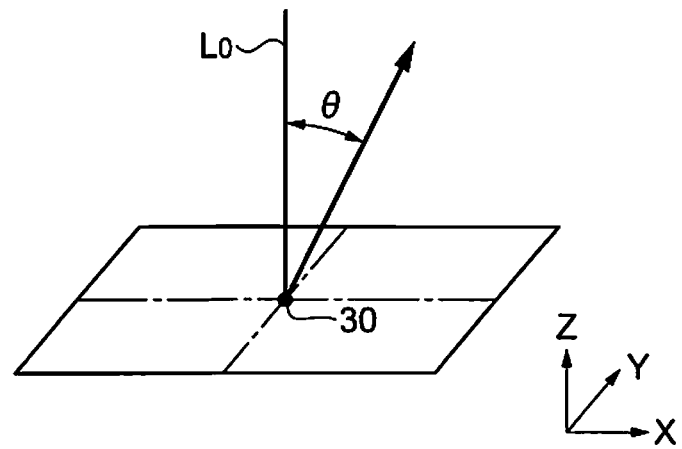
FIG. 7A is a schematic diagram showing an emission angle of light emission with respect to a light axis of the light emitting section.
Figure 7B:
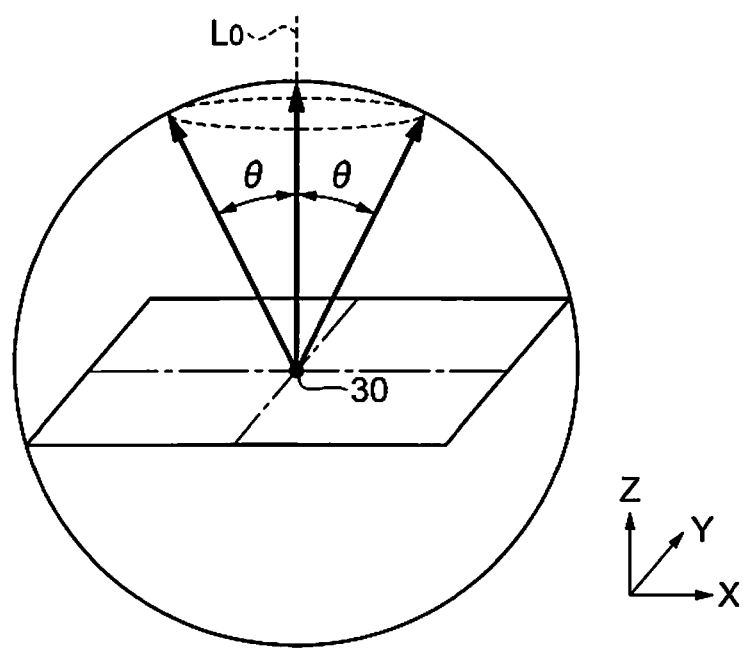
FIG. 7B is a schematic diagram showing an integrating sphere that describes an intensity of light of the light emitting section.
Figure 8:
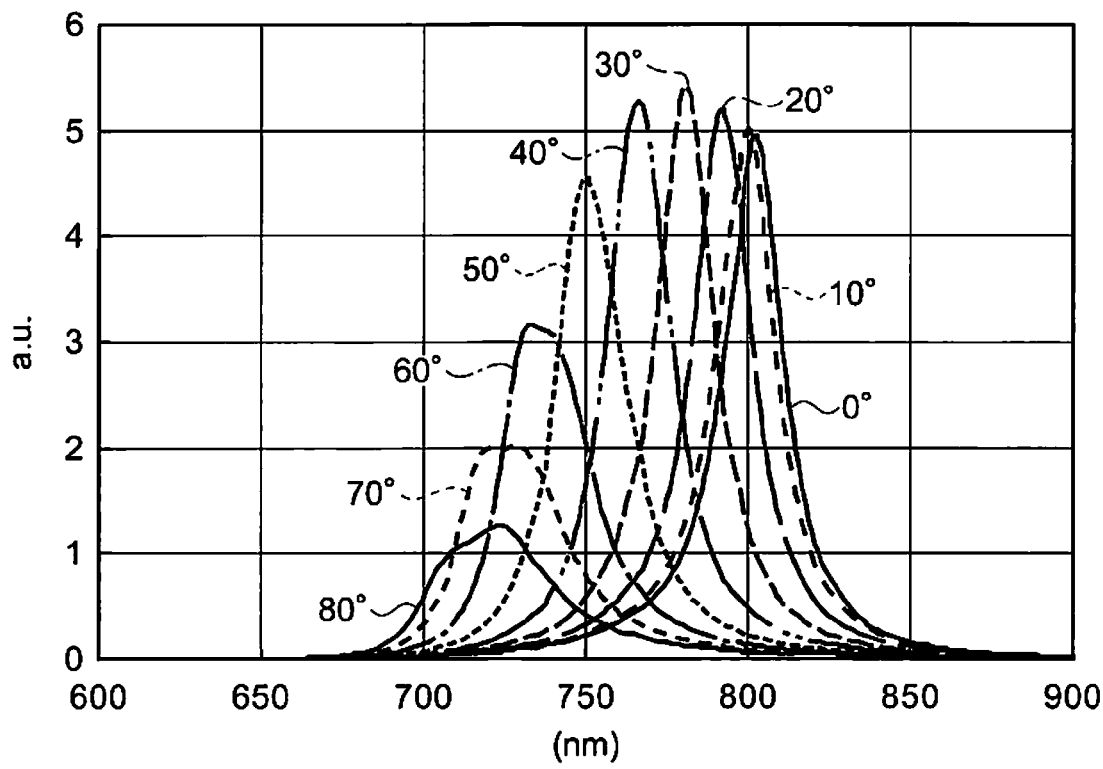
FIG. 8 is a graph showing a relationship between an emission angle of the light emission and a peak wavelength of the light intensity in the light emitting section.
Figure 9:
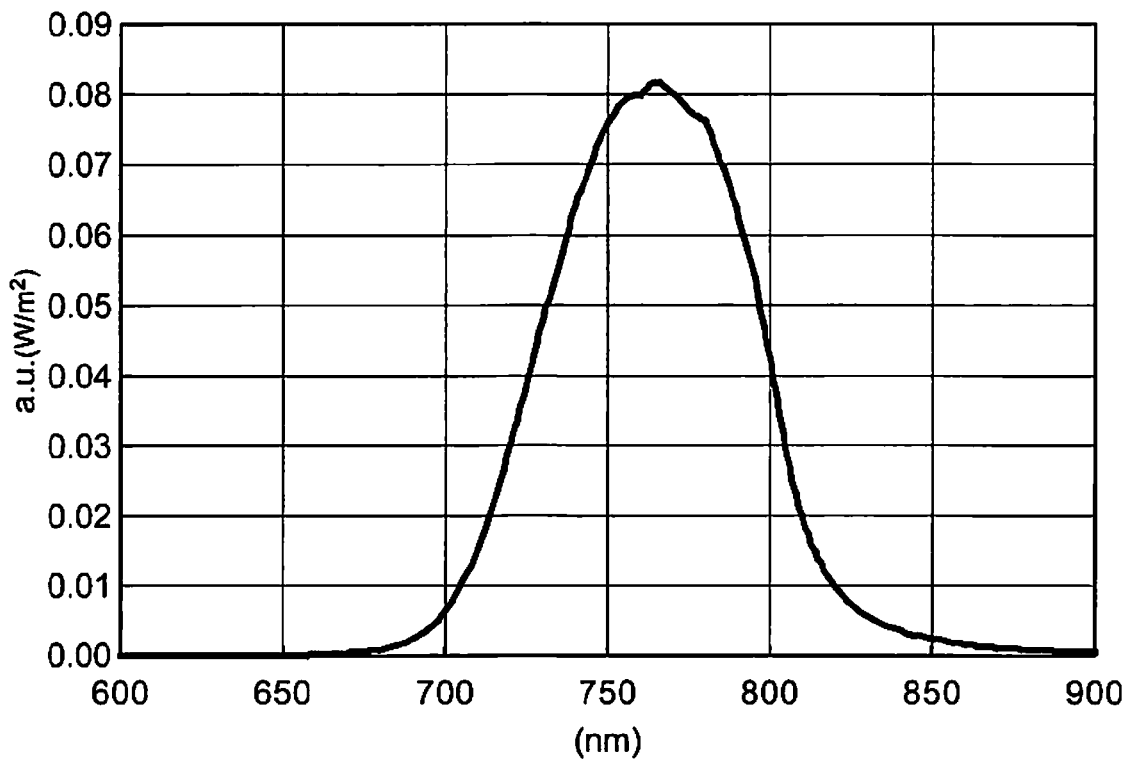
FIG. 9 is a graph showing a relationship between an emission wavelength from the light emission section and an omnidirectional integral value of the light intensity.

Next, the spectral characteristics of the light emitted from the light emitting section 30 will be described in reference to FIG. 7A to FIG. 9. FIG. 7A is a schematic diagram showing an emission angle of light emission with respect to a light axis of the light emitting section; FIG. 7B is a schematic diagram showing an integrating sphere that describes an intensity of the light of the light emitting section; FIG. 8 is a graph showing a relationship between an emission angle of the light emission and a peak wavelength of the light intensity; and FIG. 9 is a graph showing a relationship between an emission wavelength from the light emission section and an omnidirectional integral value of the light intensity. FIG. 8 shows the observation of the light intensity when the emission angle θ with respect to the light axis L0 is 0° to 80°, and a relative intensity is converted into a numerical value on the basis of the light intensity when the vertical axis is 0°.

As shown in FIGS. 7A and 7B, the light axis L0 of the light emitting section 30 arranged on the surface defined by the X-direction and the Y-direction is defined along the Z-direction that intersects the X-direction and the Y-direction. As described above, the light emission region in each light emitting section 30 is the region where the positive electrode 31 divided by the partition wall 35 and the functional layer 32 are contacted, and however, here, it defines that the light emitting section 30 is approximately the point light source.

In the light emitted from the light emitting section 30 that has the first optical resonance structure, the light intensity of the resonance wavelength is enhanced, but the peak wavelength of the light intensity is changed depending on the emission angle θ with respect to the light axis L0 of the light. Specifically, as shown in FIG. 8, in the present embodiment, the emission angle θ is 0°, that is, the peak wavelength in the intensity of the light emitted in the direction along the light axis L0 is the largest, and as the angle is larger than the emission angle 0°, the peak wavelength in the light intensity becomes smaller. This indicates that by relying on the emission angle θ of the light in the light emitting section 30, as the emission angle θ is larger, the resonance length Le becomes smaller (shorter).

Further, the emission angle θ of the light emitted from the light emitting section 30 is actually limited in an angular range of the partition wall 35, which is formed in a trapezoid shape when viewed in the cross-section, but the intensity of the light emitted in the angular range includes the light in the peak wavelength in response to the emission angle θ. When the light intensity from which the emission angle θ as shown in FIG. 8 is 0° to 80° is integrated, it becomes the graph of the spectral characteristics shown in FIG. 9. As shown in FIG. 9, the intensity of the light emitted from the light emitting section 30 becomes the emission characteristics that are close to the spectral characteristics in the photoluminescence (PL) of the luminescent material in the EML (light emitting layer).

As described above, the light receiving and emitting apparatus 150 is to take a vein image (vein pattern) by irradiating the near-infrared light IL from the light emitting section 30 to the finger F as a living body. At this point, a method of which the light that the near-infrared light IL was emitted in the emission angle θ with respect to the light axis L0 and was reflected at the finger F is selectively received in the light receiving section 142 reduces the influence of the light, which was reflected at the finger F, than a method of which the light that the near-infrared light IL was emitted in the direction of the light axis L0, that is, the Z-direction from the light emitting section 30 and was reflected at the finger F is received in the light receiving section 142 so that the light reached to and reflected at the inside of the finger F can be received in the light receiving section 142.

In the present embodiment, as shown in FIG. 8 and FIG. 9, based on the spectral characteristics of the light emission from the light emitting section 30, the configuration of each layer of the light emitting section 30 and the optical filter section 50 is set in a condition that the Z-direction of the light emitting apparatus 110, that is, the peak wavelength $\lambda_1$ of the front surface is set as, for example, 805 nm, and the peak wavelength $\lambda_2$ when the emission angle θ is 40 degree that the actual intensity of the light emission from the light emitting section 30 becomes the largest, is set as, for example, 770 nm. That is, the light emitting apparatus 110 is applied to the light receiving and emitting apparatus 150 of the biometric authentication apparatus 100 so that in order to obtain a vivid vein image (vein pattern), the target peak wavelength $\lambda_2$ in the light emitting section 30 and the optical filter section 50 is 770 nm.

Figure 11A:
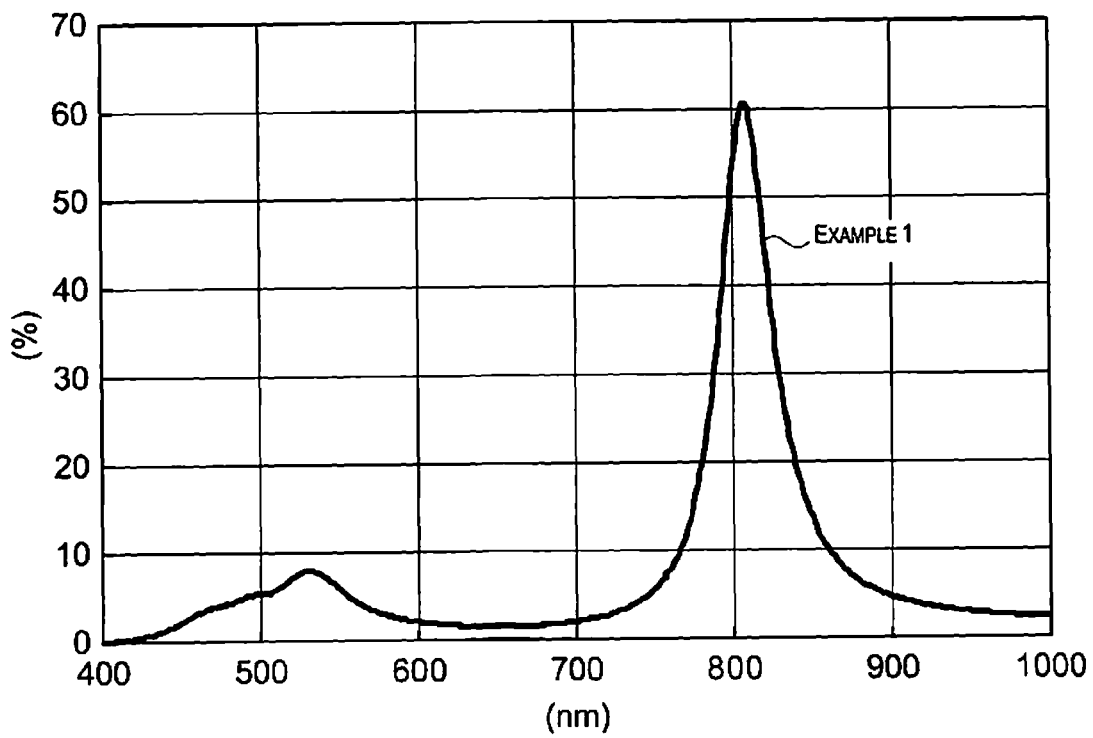
FIG. 11A is a graph showing spectral characteristics of a transmittance in the optical filter section in Example 1.
Figure 11B:
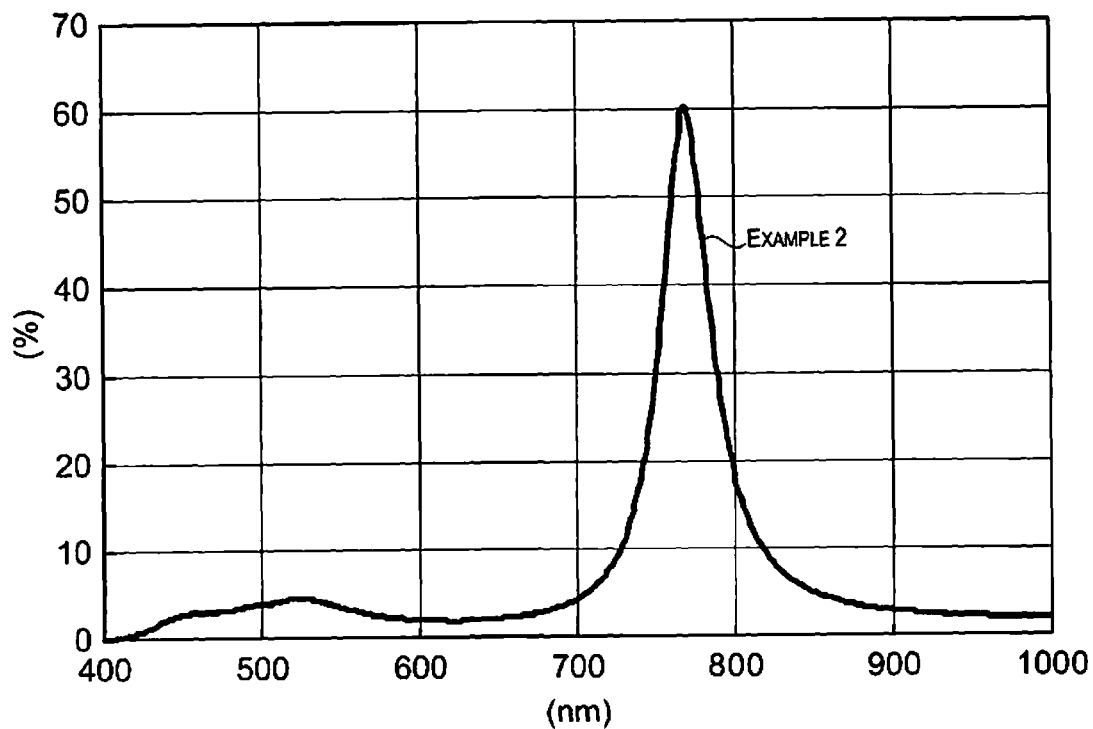
FIG. 11B is a graph showing spectral characteristics of a transmittance in the optical filter section in Example 2.

Hereinafter, the examples of the light emitting section 30 and the optical filter section 50 will be described in reference to FIG. 10 and FIG. 11. FIG. 10A is a table showing an optical film thickness in each layer of the light emitting section and the optical filter section in Example 1; and FIG. 10B is a table showing an optical film thickness in each layer of the light emitting section and the optical filter section in Example 2. FIG. 11A is a graph showing spectral characteristics of a transmittance in the optical filter section in Example 1; and FIG. 11B is a graph showing spectral characteristics of a transmittance in the optical filter section in Example 2.

Example 1

As shown in FIG. 10A, the configuration of the light emitting section 30 in Example 1 is that in the order from the lower side, the film thickness of the reflection layer 26 made of Al and Nd is 80 nm; the film thickness of the first dielectric film 27a made of silicon nitride is 104 nm; the film thickness of the second dielectric film 27b made of a-Si is 48 nm; the film thickness of the insulating film 28 made of silicon nitride is 50 nm; the film thickness of the positive electrode 31 is 63 nm; the film thickness of the HTL (hole injection transport layer) is 30 nm; the film thickness of the EML (light emitting layer) is 25 nm; the film thickness of the ETL (electron transport layer) is 60 nm; the film thickness of the EIL (electron injection layer) made of LiF is 1 nm; the film thickness of the first layer 33a (MgAg alloy layer in which volume ratio is 1:20) of the negative electrode 33 is 20 nm; and the film thickness of the second layer 33b (Mg layer) of the negative electrode 33 is 5 nm.

The HTL (hole injection transport layer) uses benzidine series and aromatic amine compound indicated in the aforementioned chemical formula HTL12 as a hole injection transport material.

The EML (light emitting layer) uses thiadiazole-based compound indicated in the aforementioned chemical formula EML5 as a luminescent material (dopant), and tetracene-based compound indicated in the aforementioned chemical formula H-5 is used.

The ETL (electron transport layer) uses azaindolizine derivative indicated in the aforementioned chemical formula ETL-A3.

In the functional layer formation steps, by using the vacuum vapor deposition, the functional layer 32 is configured by forming each of the HTL (hole injection transport layer), the EML (light emitting layer), the ETL (electron transport layer), and the EIL (electron injection layer) over the region (the first region) where the plurality of light emitting sections 30 and the plurality of optical filter sections 50 are arranged so that the light emitting sections 30 and the optical filter sections 50 are commonly formed.

Since the configuration of the optical filter section 50 of Example 1 shares the light emitting section 30, the dielectric multilayer film 27, and the functional layer 32, only the film thickness of the transparent layer 51 is different from the light emitting section 30. The film thickness of the transparent layer 51 is 52 nm. The positive electrode 31 and the transparent layer 51 are formed by patterning the ITO film that was filmed in the same layer on the substrate 111. Further, a portion corresponding to the transparent layer 51 within the patterned ITO film is selectively etched to provide a reduction film so that the film thickness of the transparent layer 51 is smaller than the positive electrode 31.

As shown in FIG. 10A, in Example 1, the optical film thickness of the first dielectric film 27a is 192.4 nm, and the optical film thickness of the second dielectric film 27b is 193.9 nm. Therefore, the respective optical film thicknesses of the first dielectric film 27a and the second dielectric film 27b is approximately ¼ of the value (770 nm) that was set as the peak wavelength $\lambda_2$ when the emission angle θ of the light emitting section 30 is 40 degree. In other words, the specific wavelength λ that enhances the light intensity than the dielectric multilayer film 27 of Example 1 is approximately 770 nm.

In Example 1, the optical film thickness of the insulating film 28 is 92.5 nm; the optical film thickness of the positive electrode 31 is 106.5 nm; the optical film thickness of the transparent layer 51 is 87.9 nm; the optical film thickness of the HTL (hole injection transport layer) is 51.6 nm; the optical film thickness of the EML (light emitting layer) is 43 nm; the optical film thickness of the ETL (electron transport layer) is 108 nm; and the optical film thickness of the EIL (electron injection layer) is 1.4 nm.

Therefore, the resonance length L1 between the dielectric multilayer film 27 and the negative electrode 33 in the light emitting section 30 of Example 1 is 403 nm which is the total optical film thicknesses of the respective layers. The resonance length L1 is approximately half of the value (805 nm) that was set as the peak wavelength $\lambda_1$ of the front surface of the light emitting section 30. That is, the resonance length L1 is approximately $\lambda_1/2$.

The resonance length L2 between the dielectric multilayer film 27 and the negative electrode 33 in the optical filter section 50 of Example 1 is 384.4 nm that is the total of the optical film thicknesses of the respective layers. The peak wavelength of the front surface in the optical filter section 50, that is, the setting of the wavelength that indicates the highest transmittance within the light transmitting the optical filter section 50 assumes the light that has the peak wavelength $\lambda_2$ when the emission angle θ in the light emitting section 30 is 40 degree. In other words, the optical filter section 50 is configured to selectively transmit the light in the wavelength range including the peak wavelength $\lambda_2$. The resonance length L2 of the optical filter section 50 of Example 1 is approximately $\lambda_2/2$.

According to such configuration of the light emitting section 30 and the optical filter section 50 in Example 1, as shown in FIG. 11A, the spectral characteristics of the light transmitted through the optical filter section 50 of Example 1 generate a peak that the transmittance in the wavelength of 805 nm exceeds 60%, and more than or equal to 20% of the near-infrared light in the wavelength range of 780 nm to 840 nm was transmitted. In other words, the transmittance of the near-infrared light in the near-infrared wavelength range other than the wavelength range of 780 nm to 840 nm is less than 20%. Further, the transmittance in vicinity of 530 nm in the visible light wavelength region generates a peak of approximately 8%, and more than or equal to 5% of the visible light in the wavelength range of 480 nm to 560 nm was transmitted. The transmittance of the visible light other than the wavelength range of 480 nm to 560 nm is less than 5%.

That is, in Example 1, even though the optical filter section 50 does not sufficiently transmit the near-infrared light of the peak wavelength $\lambda_2$ (770 nm) that the emission angle θ is 40 degree and the intensity of the light emission from the light emitting section 30 is strong, however, the light in the wavelength of the vicinity of 800 nm which is larger than 770 nm is sufficiently transmitted. Therefore, the light receiving and emitting apparatus 150 in which the light emitting apparatus 110 of Example 1 is applied replaces the light of the vicinity of 800 nm within the reflected light RL from the finger F to an electrical signal by the light receiving section 142, and also, the influence of the visible light is suppressed so that a vivid vein image (vein pattern) can be taken.

Example 2

As shown in FIG. 10B, the configuration of the light emitting section 30 of Example 2 is that in the order from the lower layer side, the film thickness of the reflection layer 26 made of Al and Nd is 80 nm; the film thickness of the first dielectric film 27a made of silicon nitride is 104 nm, the film thickness of the second dielectric film 27b made of a-Si is 48 nm; the film thickness of the insulating film 28 made of silicon nitride is 50 nm; the film thickness of the positive electrode 31 is 48 nm; the film thickness of the HTL (hole injection transport layer) is 30 nm; the film thickness of the EML (light emitting layer) is 25 nm; the film thickness of the ETL (electron transport layer) is 60 nm; the film thickness of the EIL (electron injection layer) made of LiF is 1 nm; the film thickness of the first layer 33a (MgAg alloy layer in which volume ratio is 1:20) of the negative electrode 33 is 20 nm; and the film thickness of the second layer 33b (Mg layer) of the negative electrode 33 is 5 nm.

Since the configuration of the optical filter section 50 of Example 2 shares the light emitting section 30, the dielectric multilayer film 27, and the functional layer 32, only the film thickness of the transparent layer 51 is different from the light emitting section 30. The film thickness of the transparent layer 51 is 32 nm.

That is, with respect to Example 1, Example 2 makes smaller (thinner) the film thickness of the positive electrode 31 and the transparent layer 51, and the configuration of the respective layers and the formation method are the same as Example 1.

As shown in FIG. 10B, in Example 2, the optical film thickness of the first dielectric film 27a is 192.4 nm, and the optical film thickness of the second dielectric film 27b is 193.9 nm. Therefore, as described above, it is approximately ¼ of the value (770 nm) that was set as the peak wavelength $\lambda_2$.

In Example 2, the optical film thickness of the insulating film 28 is 92.5 nm; the optical film thickness of the positive electrode 31 is 81.1 nm; the optical film thickness of the transparent layer 51 is 54.1 nm; the optical film thickness of the HTL (hole injection transport layer) is 51.6 nm; the optical film thickness of the EML (light emitting layer) is 43 nm; the optical film thickness of the ETL (electron transport layer) is 108 nm; and the optical film thickness of the EIL (electron injection layer) is 1.4 nm.

Therefore, the resonance length L1 between the dielectric multilayer film 27 and the negative electrode 33 in the light emitting section 30 of Example 2 is 377.6 nm which is the total optical film thicknesses of the respective layers. The resonance length L1 is smaller than ½ of the value (805 nm) that was set as the peak wavelength $\lambda_1$ of the front surface of the light emitting section 30.

The graph showing the spectral characteristics corresponding to the emission angle θ as shown in FIG. 8 and the graph showing the spectral characteristics due to an omnidirectional integral as shown in FIG. 9 indicate the spectral characteristics of the light emitting section 30 of Example 2. That is, the peak wavelength of the actual light intensity of the light emission from the light emitting section 30 is 770 nm.

The resonance length L2 between the dielectric multilayer film 27 and the negative electrode 33 in the optical filter section 50 of Example 2 is 350.6 nm that is the total of the optical film thicknesses of the respective layers. The peak wavelength of the front surface in the optical filter section 50, that is, as described above, the wavelength that indicates the highest transmittance within the light transmitting the optical filter section 50 assumes the light that has the peak wavelength $\lambda_2$ when the emission angle θ in the light emitting section 30 is 40 degree. In other words, the optical filter section 50 is configured to selectively transmit the light in the wavelength range including the peak wavelength $\lambda_2$. The resonance length L2 of the optical filter section 50 of Example 2 is smaller than the value of $\lambda_2/2$.

According to such configuration of the light emitting section 30 and the optical filter section 50 in Example 2, as shown in FIG. 11B, the spectral characteristics of the light transmitted through the optical filter section 50 of Example 2 generate a peak that the transmittance in the wavelength of 770 nm reaches 60%, and more than or equal to 20% of the near-infrared light in the wavelength range of 740 nm to 800 nm was transmitted. Further, the transmittance in vicinity of 530 nm in the visible light wavelength region generates a peak of approximately 5%, and the transmittance of the visible light other than the wavelength range of 480 nm to 560 nm is less than 3%. That is, the specific wavelength λ in Example 2 that transmits the optical filter section 50 almost corresponds to the target peak wavelength $\lambda_2$ than Example 1. In addition, the transmittance in the visible light wavelength region is reduced. That is, the light receiving and emitting apparatus 150 applied to the light emitting apparatus 110 of Example 2 is possible to take more vivid vein image (vein pattern) that has less noise in comparison with Example 1.

To be a configuration that the resonance length L1 of the light emitting section 30 is $\lambda_1/2$, and the resonance length L2 of the optical filter section 50 is $\lambda_2/2$ as described in Example 1, even though the optical film thickness of each layer is simply set, the peak wavelength in the spectral characteristics of the light that transmits through the optical filter section 50 slightly shifts to the long-wavelength side in Example 2 because it is considered the reason that the first optical resonance structure and the second optical resonance structure are respectively functioned as a dielectric mirror, and the dielectric multiplayer film 27, the functional layer 32, and the negative electrode 33 are shared.

The negative electrode has the semi-transmissive reflectivity and a property to absorb the light. Therefore, in Example 1 and Example 2, the film thickness of the first layer 33*a* made of MgAg is set to 20 nm to efficiently transmit the light in the wavelength of 770 nm set as the peak wavelength $\lambda_2$. The second layer 33*b* made of Mg that functions as the protection layer of the first 33*a* has smaller film thickness than the first layer 33*a* so that it is less effect to the transmittance of the light in the negative electrode 33. Further, when the light emitted from the light emitting layer is reflected on the surface in the functional layer 32 side of the negative electrode 33, it is known to shift a phase of the light emission. In the case that it is reflected at the border between the first dielectric film 27*a*, which has different refractive index in the dielectric multilayer film 27, and the second dielectric film 27*b*, the phase of the light emission is shifted in the same manner. Therefore, it is considered the occurrence of the complicated light reflection which does not depend on the simple resonance lengths L1, L2 between the negative electrode 33 and the dielectric multilayer film 27.

In Example 2, the optical film thickness (15 nm to 20 nm) corresponding to approximately half of the amount (35 nm) that the peak wavelength of the transmittance in the optical filter section 50 of Example 1 is shifted to the long-wavelength side than the target wavelength is reduced from the optical film thickness which is the simple target of the positive electrode 31 and the transparent layer 51. Such adjustment of the optical film thickness can realize the desired spectral characteristics of the light emitting section 30 and the desired permeability characteristics of the optical filter section 50 by repeating optical simulations and providing experimental productions of the light emitting apparatus 110.

According to the aforementioned first embodiment, the following effects can be obtained.

(1) According to the light emitting apparatus 110 and its production method, the light emitting section 30 and the optical filter section 50 are formed by sharing the dielectric multilayer film 27, the functional layer 32, and the negative electrode 33 on the substrate 111. Further, by providing the film thickness of the transparent layer 51 that is different with respect to the film thickness of the positive electrode 31, the transmittance of the light in the peak wavelength $\lambda_2$ in the optical filter section 50 is secured, and the transmittance of the light in the wavelength range (visible light wavelength range) other than the specific wavelength (wavelength in the near-infrared wavelength range) is reduced. That is, in comparison with the case that the light emitting section 30 and the optical filter section 50 are provided in respective separate materials, the light emitting apparatus 110 having the light emitting section 30, which obtains the light emission in the target peak wavelength $\lambda_2$, and the optical filter section 50, which is capable of selectively transmitting the light in the wavelength range including the target wavelength $\lambda_2$, can be provided in a simple configuration and structure.

(2) The light receiving and emitting apparatus 150 provided with the light emitting apparatus 110 can take a vivid vein image (vein pattern) with less noise.

(3) The biometric authentication apparatus 100 provided with the light receiving and emitting apparatus 150 can vividly take a vein image (vein pattern) of the finger F as a living body by the light receiving and emitting apparatus 150.

Second Embodiment

Figure 12:
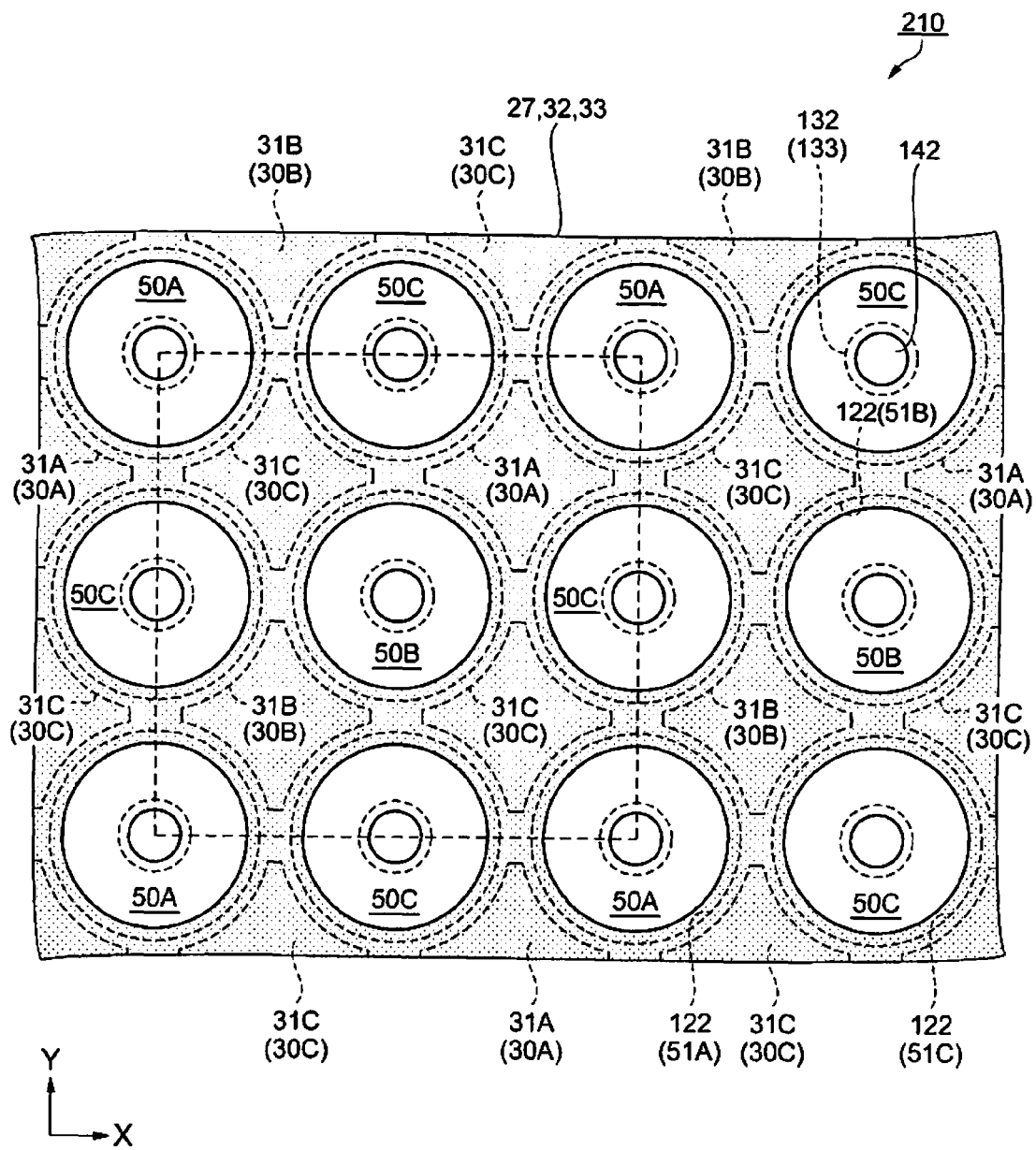
FIG. 12 is a schematic plan view showing an arrangement of the light emitting sections and the optical filter sections in the light emitting apparatus in the second embodiment.
Figure 13A:
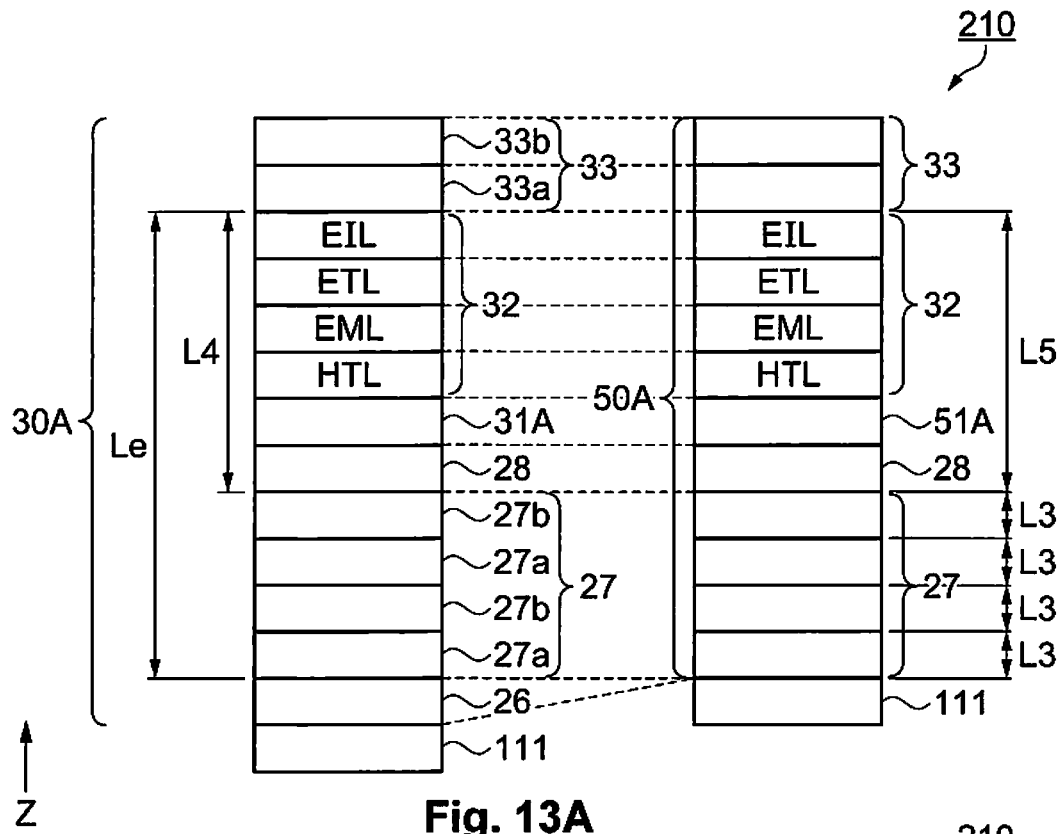
FIG. 13A is a schematic cross-sectional diagram showing a configuration of the first light emitting section and the first optical filter section.
Figure 13B:
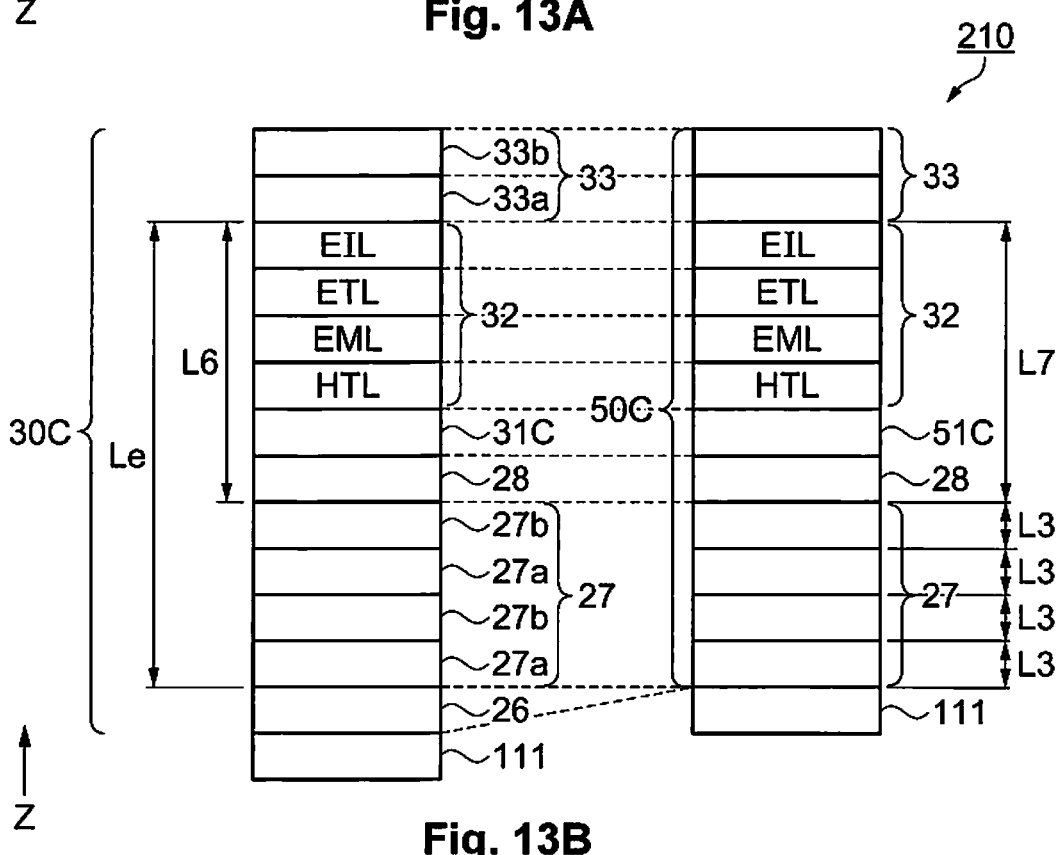
FIG. 13B is a schematic cross-sectional diagram showing a configuration of the third light emitting section and the third optical filter section.

Next, the light emitting apparatus of the second embodiment will be described in reference to FIG. 12 to FIG. 14B. FIG. 12 is a schematic plan view showing an arrangement of the light emitting sections and the optical filter sections in the light emitting apparatus of the second embodiment; FIG. 13A is a schematic cross-sectional diagram showing a configuration of the first light emitting section and the first optical filter section; and FIG. 13B is a schematic cross-sectional diagram showing a configuration of the third light emitting section and the third optical filter section. FIG. 14A is a table showing a detailed configuration of the light emitting section and the optical filter section in the second light emitting apparatus; and FIG. 14B is a table showing a wavelength dependency of a refractive index in each layer configuring the light emitting section and the optical filter section.

In comparison with the first embodiment of the light emitting apparatus 110, the light emitting apparatus of the second embodiment has a difference in a point that a plurality of light emitting sections, which has different value of the target peak wavelength $\lambda_1$ of the front surface in the light emission, and a plurality of optical filter sections, which has different value of the target peak wavelength $\lambda_2$ in the optical transmittance. The same symbols are used in the same structures of the first embodiment so that the detailed descriptions are omitted.

As shown in FIG. 12, the light emitting apparatus 210 of the present embodiment is provided with the first light emitting sections 30A, the second light emitting sections 30B, the third light emitting sections 30C, the first optical filter sections 50A, the second optical filter sections 50B, and the third optical filter sections 50C. The light emitting wavelength ranges of the first light emitting sections 30A, the second light emitting sections 30B, and the third light emitting sections 30C are shifted each other so that it has a configuration to obtain the light emission of the different peak wavelength $\lambda_1$ in the front surface side. Further, the size of the peak wavelength $\lambda_1$ is in the order of the first light emitting sections 30A<the second light emitting sections 30B<the third light emitting sections 30C.

The wavelength ranges of the transmitted light of the first optical filter sections 50A, the second optical filter sections 50B, and the third optical filter sections 50C are shifted each other so that the size of the peak wavelength $\lambda_2$ in the transmittance of the transmitted light is in the order of the first optical filter sections 50A<the second optical filter sections 50B<the third optical filter sections 50C.

In the present embodiment, when the size of the peak wavelength $\lambda_2$ indicates in the manner that the second optical filter section 50B is the center between the first optical filter sections 50A and the third optical filter sections 50C, the third optical filter sections 50C are arranged to surround the second optical filter section 50B in the X-direction and the Y-direction. Further, the first optical filter sections 50A are arranged in a diagonal direction that intersects the X-direction and the Y-direction with respect to the second optical filter section 50B. The first light emitting section 30A, the second light emitting section 30B, and two of the third light emitting sections 30C are arranged in an adjacent position with respect to the second optical filter section 50B. Two of the third light emitting sections 30C are arranged in a diagonal direction so as to sandwich the second optical filter section 50B.

Therefore, when the region indicated by the broken line in FIG. 12 in the imaging is defined as one pixel, the one pixel is configured to include nine optical filter sections 50 in which the second optical filter section 50B is located in the center, and the first light emitting sections 30A, the second light emitting sections 30B, and the third light emitting sections 30C that have different peak wavelengths $\lambda_1$ in the emission luminance. Further, the light emitting sections 30 that have the different peak wavelengths $\lambda_1$, that is, the light sources for illumination are arranged in equal distance with respect to one of the optical filter sections 50.

In addition, when the light receiving section 142 arranged corresponding to the optical filter section 50 is an optical sensor using, for example, amorphous silicon, the sensitivity of the optical sensor tends to get lowered as the incident light wavelength is larger (longer). In the present embodiment, two of the third light emitting sections 30C are arranged in the aforementioned one pixel so that the lowering sensitivity of the optical sensor in the long wavelength is compensated.

The shape of the first optical filter section 50A, the second optical filter section 50B, and the third optical filter section 50C is a circular shape, and in the center of it, the light receiving section 142 is arranged. Further, a light shielding film 133 that has an opening section 132 surrounding the light receiving section 142 is arranged between the respective of the first optical filter section 50A, the second optical filter section 50B, the third optical filter section 50C and the light receiving section 142. A microlens 122 is arranged between the respective of the first optical filter section 50A, the second optical filter section 50B, the third optical filter section 50C and the light shielding film 133 to overlap with the respective of the first optical filter section 50A, the second optical filter section 50B, the third optical filter section 50C.

The first optical filter section 50A has a circular-shaped transparent layer 51A with the same center. The second optical filter section 50B also has a circular-shaped transparent layer 51B with the same center. The third optical filter section 50C also has a circular-shaped transparent layer 51C with the same center. In FIG. 12, each of the transparent layers 51A, 51B, 51C is shown, but the film thickness of the transparent layer 51A in the first optical filter section 50A of the specific example is "0 nm", that is, the transparent layer 51A is not existed.

The first light emitting section 30A has a substantially cross-shape positive electrode 31A in plan view. The second light emitting section 30B has a substantially cross-shape positive electrode 31B in the plan view. The third light emitting section 30C has a substantially cross-shape positive electrode 31C in the plan view.

A shape, a size, and an arrangement of the first light emitting section 30A, the second light emitting section 30B, the third light emitting section 30C, the first optical filter section 50A, the second optical filter section 50B, the third optical filter section 50C are not limited to this.

The dielectric multilayer film 27, the functional layer 32, and the negative electrode 33 are arranged over the region where the first light emitting section 30A, the second light emitting section 30B, the third light emitting section 30C, the first optical filter section 50A, the second optical filter section 50B, and the third optical filter section 50C are arranged.

As shown in FIG. 13A, the first light emitting section 30A has the reflection layer 26, the dielectric multilayer film 27, the insulating film 28, the positive electrode 31A, the functional layer 32, and the negative electrode 33 on the substrate 111 and they are laminated in this order. The first optical filter section 50A has the dielectric multilayer film 27, the insulating film 28, the transparent layer 51A, the functional layer 32, and the negative electrode 33 on the substrate 111 and they are laminated in this order.

As shown in FIG. 13B, the third light emitting section 30C has the reflection layer 26, the dielectric multilayer film 27, the insulating film 28, the positive electrode 31C, the functional layer 32, and the negative electrode 33 on the substrate 111 and they are laminated in this order. The third optical filter section 50C has the dielectric multilayer film 27, the insulating film 28, the transparent layer 51C, the functional layer 32, and the negative electrode 33 on the substrate 111 and they are laminated in this order.

The illustration was omitted, but the configuration of the second light emitting section 30B and the second optical filter section 50B is basically the same configuration of the light emitting section 30 and the optical filter section 50 in the first embodiment. That is, the second light emitting section 30B has the reflection layer 26, the dielectric multilayer film 27, the insulating film 28, the positive electrode 31B (corresponding to positive electrode 31), the functional layer 32, and the negative electrode 33 on the substrate 111 and they are laminated in this order. The second optical filter section 50B has the dielectric multilayer film 27, the insulating film 28, the transparent layer 51B (corresponding to the transparent layer 51), the functional layer 32, and the negative electrode 33 on the substrate 111 and they are laminated in this order.

The first light emitting section 30A, the second light emitting section 30B, the third light emitting section 30C, the first optical filter section 50A, the second optical filter section 50B, and the third optical filter section 50C respectively share the dielectric multilayer film 27, the insulating film 28, the functional layer 32, and the negative electrode 33. Further, the configurations of the positive electrode and the transparent layer are respectively different.

The specific configuration in the first light emitting section 30A, the second light emitting section 30B, the third light emitting section 30C, the first optical filter section 50A the second optical filter section 50B, and the third optical filter section 50C will be described in FIG. 14A. Further, the optical film thickness of each layer is obtained by the product of the film thickness and the refractive index as described above, but the refractive index relies on the wavelength of the light transmitting through the layer so that the refractive index with respect to the targeted wavelength of each layer is shown in FIG. 14B.

As shown in FIG. 14A, the insulating film 28 respectively shared by the first light emitting section 30A, the second light emitting section 30B, the third light emitting section 30C, the first optical filter section 50A, the second optical filter section 50B, and the third optical filter section 50C is made of, for example, silicon nitride, and the film thickness is 50 nm. The optical film thickness of the insulating film 28 in the first light emitting section 30A and the first optical filter section 50A that the peak wavelength $\lambda_2$ when the emission angle θ is 40 degree is 710 nm is 93 nm. As the peak wavelength $\lambda_2$ is larger, the optical film thickness of the insulating film 28 of the second light emitting section 30B and the second optical filter section 50B, the third light emitting section 30C and the third optical filter section 50C becomes smaller, and it is 92.5 nm.

The functional layer 32 shared by the first light emitting section 30A, the second light emitting section 30B, the third light emitting section 30C, the first optical filter section 50A, the second optical filter section 50B, and the third optical filter section 50C respectively is the same as the first embodiment, and it has the HTL (hole injection transport layer), the EML (light emitting layer), the ETL (electron transport layer), and the EIL (electron injection layer). Further, the film thickness of the HTL (hole injection transport layer) is 30 nm; the film thickness of the EML (light emitting layer) is 25 nm, the film thickness of the ETL (electron transport layer) is 60 nm; and the film thickness of the EIL (electron injection layer) is 1 nm. The material configuration or the formation method of each layer in the functional layer 32 is the same content described in the examples of the first embodiment.

The film thickness of the positive electrode 31A of the first emitting section 30A is 16 nm. The film thickness of the transparent layer 51A of the first optical filter section 50A is 0 nm, that is, the transparent layer 51A is not actually provided in the first optical filter section 50A. The film thickness of the positive electrode 31B of the second light emitting section 30B is 48 nm, and the film thickness of the transparent layer 51B of the second optical filter section 50B is 32 nm. That is, it is the same as Example 2 in the first embodiment. The film thickness of the positive electrode 31C of the third light emitting section 30C is 80 nm and the film thickness of the transparent layer 51C of the third optical filter section 50C is 64 nm. Each of the positive electrodes 31A, 31B, 31C, and the transparent layers 51B, 51C is made of, for example, ITO film.

According to the configuration of each layer as described above, the resonance length L4 between the dielectric multilayer film 27 and the negative electrode 33 in the first light emitting section 30A is 328.5 nm. The resonance length L5 between the dielectric multilayer film 27 and the negative electrode 33 in the first optical filter section 50A is 300.5 nm. The resonance length L1 between the dielectric multilayer film 27 and the negative electrode 33 in the second light emitting section 30B is 379.9, and the resonance length L2 between the dielectric multilayer film 27 and the negative electrode 33 in the second optical filter section 50B is 352.8 nm. The resonance length L6 between the dielectric multilayer film 27 and the negative electrode 33 in the third light emitting section 30C is 428.7 nm and the resonance length L7 between the dielectric multilayer film 27 and the negative electrode 33 in the third optical filter section 50C is 402.6 nm (see FIG. 6, FIG. 13A and FIG. 13B).

The dielectric multilayer film 27 shared by the first light emitting section 30A, the second light emitting section 30B, the third light emitting section 30C, the first optical filter section 50A, the second optical filter section 50B, and the third optical filter section 50C respectively is configured by four layers in which for example, the first dielectric film 27a made of silicon nitride and the second dielectric film 27b made of a-Si are alternately laminated (see FIGS. 13A and 13B). The film thickness of the first dielectric film 27a is 95 nm, and the film thickness of the second dielectric film 27b is 47.4 nm. The optical film thickness of the first dielectric film 27a in the first light emitting section 30A is 176.7 nm, and it is approximately ¼ of the peak wavelength $\lambda_2$. The optical film thickness of the second dielectric film 27b in the first light emitting section 30A is 196.7 nm, and it is larger than ¼ of the peak wavelength $\lambda_2$.

In the present embodiment, it has a configuration that the dielectric multilayer film 27 is respectively shared by the first light emitting section 30A, the second light emitting section 30B, the third light emitting section 30C, the first optical filter section 50A, the second optical filter section 50B, and the third optical filter section 50C so that the configuration of the dielectric multilayer film 27 employs the condition of the first light emitting section 30A and the first optical filter section 50A that the target peak wavelength $\lambda_2$ is the smallest. Therefore, as the value of the target peak wavelength $\lambda_2$ is larger, the value of the optical film thickness of the dielectric multilayer film 27 becomes smaller in comparison with the first light emitting section 30A and the first optical filter section 50A.

Further, when the optical sensor by using, for example, the aforementioned amorphous silicon is employed as the light receiving section 142, the optical sensor maximizes the sensitivity for the light in the wavelength of 600 nm within the visible light wavelength range. Therefore, the noise caused by the visible light at the time of taking an image is reduced so that it is preferable that the optical filter section avoids transmitting through the light of 600 nm.

In the present embodiment, when the wavelength range of the transmitted light in the optical filter section is 700 nm to 850 nm, in the configuration of the dielectric multilayer film 27, the film thickness of each layer is preferably set on the basis of the third optical filter section 50C that the optical film thickness becomes the smallest. In other words, in view of the point that reduces the transmittance of the light in the visible light wavelength range, it is preferable that the dielectric multilayer film 27 is configured by which as an example, the film thickness of the first dielectric film 27a made of silicon nitride is set 95 nm, and the film thickness of the second dielectric film 27b made of a-Si is set 47.4 nm.

By setting the configuration of each layer of the first light emitting section 30A, the second light emitting section 30B, the third light emitting section 30C, the first optical filter section 50A, the second optical filter section 50B, and the third optical filter section 50C, respectively, as described above, the light emission of the peak wavelength $\lambda_1$ of the front surface and the peak wavelength $\lambda_2$ when the emission angle θ is 40 degree is obtained in the light emitting section, and the light in the wavelength range including the peak wavelength $\lambda_2$ is selectively transmitted in the optical filter section.

Figure 15A:
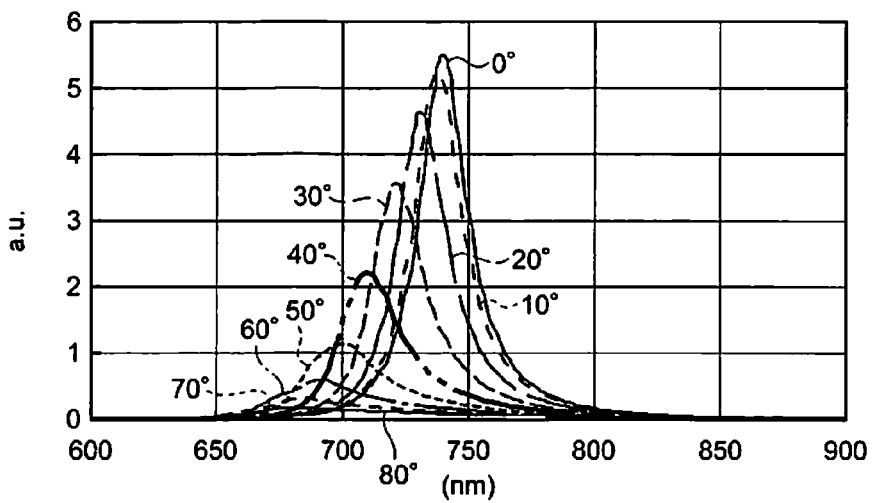
FIG. 15A shows the spectral characteristics in the first light emitting section.
Figure 15B:
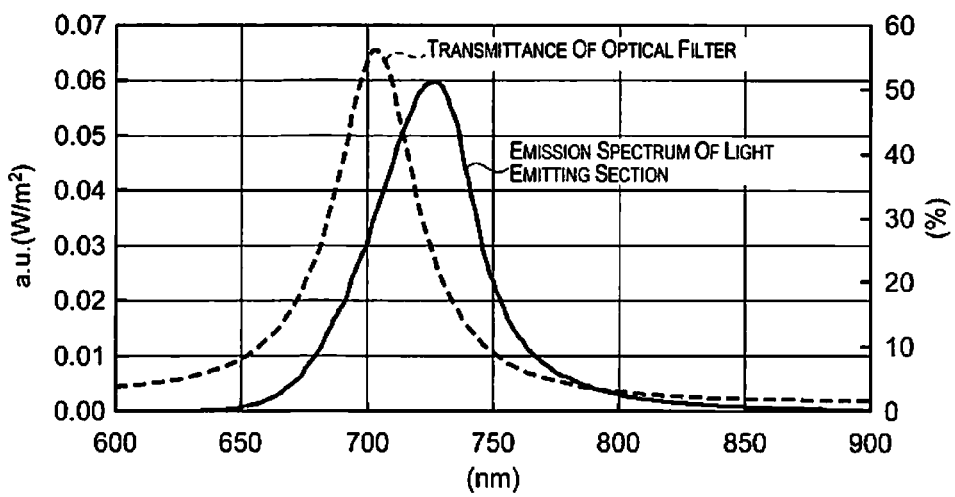
FIG. 15B shows the omnidirectional integral waveform of the light emission in the first light emitting section and the permeability characteristics of the first optical filter section.
Figure 15C:
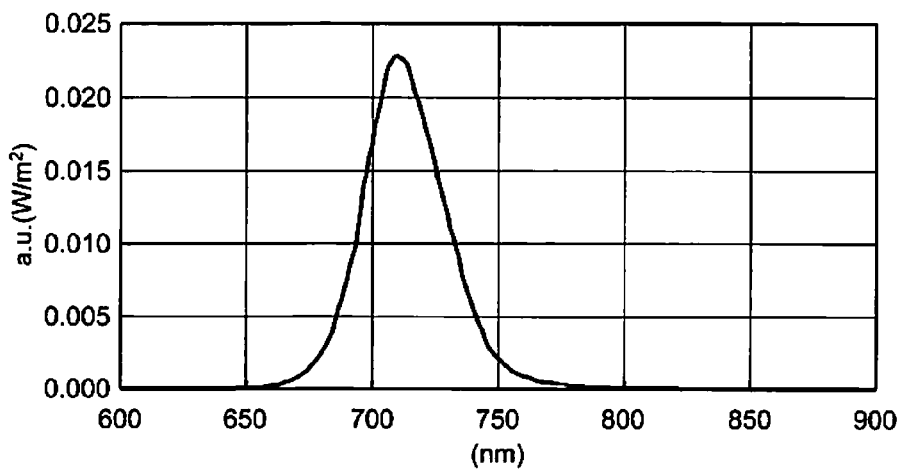
FIG. 15C is a graph showing the spectral characteristics of the light transmitted through the first optical filter section.
Figure 16A:
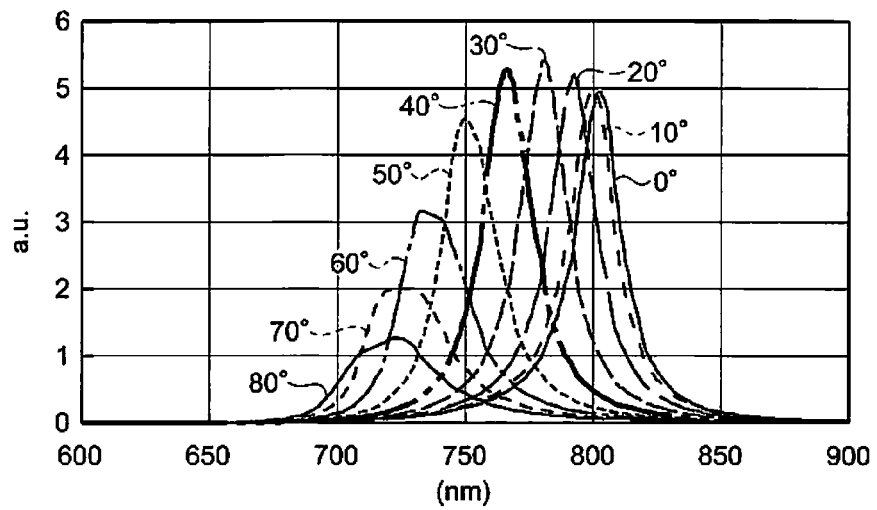
FIG. 16A shows the spectral characteristics in the second light emitting section.
Figure 16B:
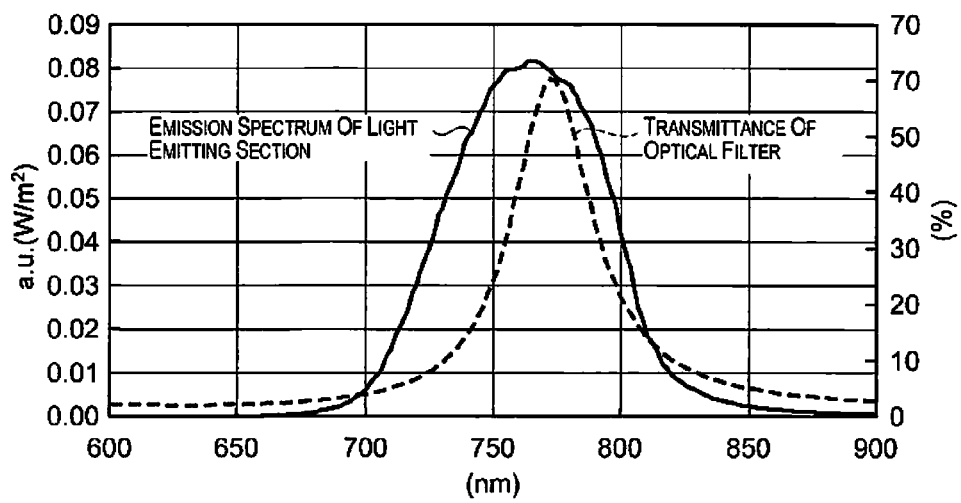
FIG. 16B shows the omnidirectional integral waveform of the light emission in the second light emitting section and the permeability characteristics of the second optical filter section.
Figure 16C:
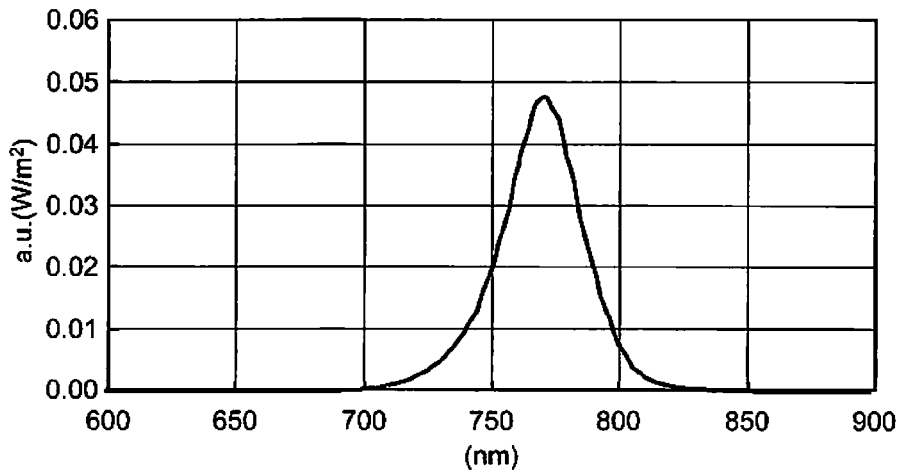
FIG. 16C is a graph showing the spectral characteristics of the light transmitted through the second optical filter section.
Figure 17A:
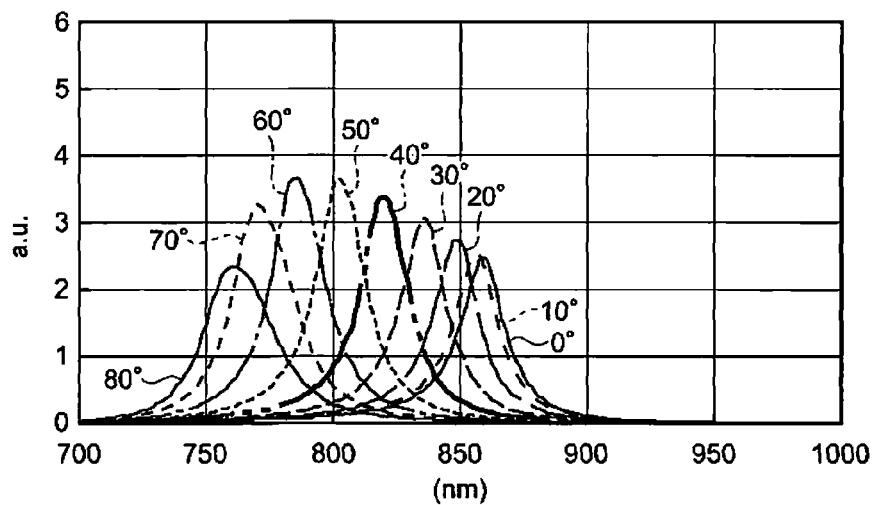
FIG. 17A shows the spectral characteristics in the third light emitting section.
Figure 17B:
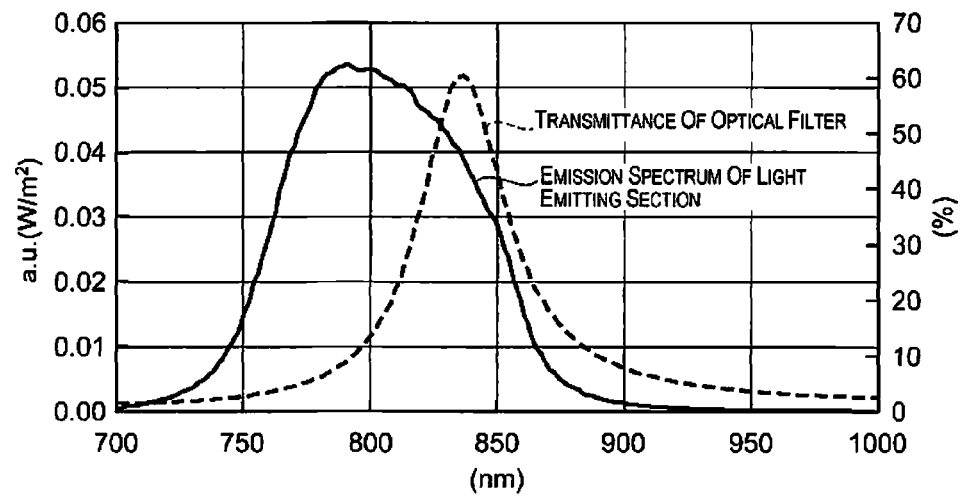
FIG. 17B shows the omnidirectional integral waveform of the light emission in the third light emitting section and the permeability characteristics of the third optical filter section.
Figure 17C:
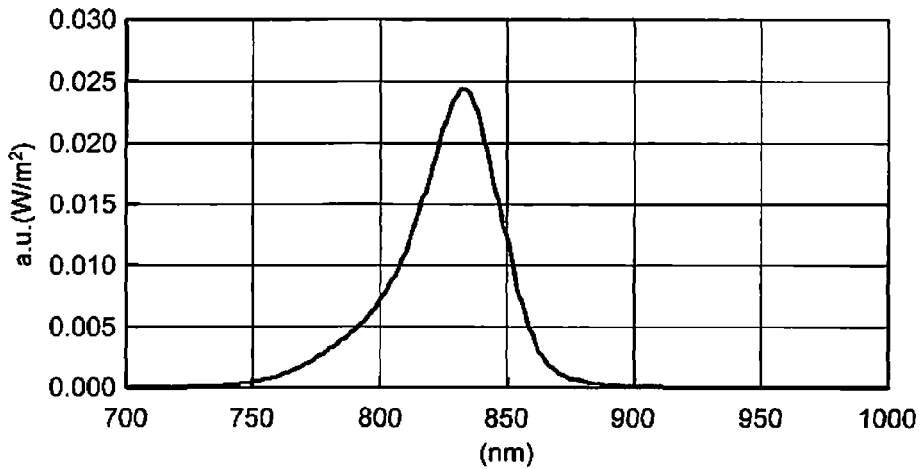
FIG. 17C is a graph showing the spectral characteristics of the light transmitted through the third optical filter section.

FIG. 15A shows the spectral characteristics in the first light emitting section; FIG. 15B shows the omnidirectional integral waveform of the light emission in the first light emitting section and the permeability characteristics of the first optical filter section; and FIG. 15C is a graph showing the spectral characteristics of the light transmitted through the first optical filter section. FIG. 16A shows the spectral characteristics in the second light emitting section; FIG. 16B shows the omnidirectional integral waveform of the light emission in the second light emitting section and the permeability characteristics of the second optical filter section; and FIG. 16C is a graph showing the spectral characteristics of the light transmitted through the second optical filter section. FIG. 17A shows the spectral characteristics in the third light emitting section; FIG. 17B shows the omnidirectional integral waveform of the light emission in the third light emitting section and the permeability characteristics of the third optical filter section; and FIG. 17C is a graph showing the spectral characteristics of the light transmitted through the third optical filter section. The permeability characteristics of the optical filter section is the permeability characteristics of the light including the substrate 111 on which the optical filter section is provided, and the transmittance of the light in a blank condition that the optical filter section is not provided on the substrate 111 is defined as 100%.

Specifically, as shown in FIG. 15A, in the first light emitting section 30A, the light emission that the peak wavelength $\lambda_1$ in the front surface is approximately 740 nm is obtained. The peak wavelength $\lambda_2$ when the emission angle $\theta$ is 40 degree is approximately 710 nm. Further, as shown in FIG. 15B, according to the omnidirectional integral waveform of the light emission in the first light emitting section 30A, the peak wavelength of the light intensity is approximately 730 nm. On the other hand, the permeability characteristics of the first optical filter section 50A are obtained in a peak of the transmittance in vicinity of approximately 700 nm, and as shown in FIG. 15C, the peak wavelength $\lambda_2$ of the light transmitted through the first optical filter section 50A is approximately 710 nm.

As shown in FIG. 16A, in the second light emitting section 30B, the light emission that the peak wavelength $\lambda_1$ in the front surface is approximately 805 nm is obtained. The peak wavelength $\lambda_2$ when the emission angle $\theta$ is 40 degree is approximately 770 nm. Further, as shown in FIG. 16B, according to the omnidirectional integral waveform of the light emission in the second light emitting section 30B, the peak wavelength of the light intensity is approximately 760 nm. On the other hand, the permeability characteristics of the second optical filter section 50B are obtained in a peak of the transmittance in vicinity of approximately 770 nm, and as shown in FIG. 16C, the peak wavelength $\lambda_2$ of the light transmitted through the second optical filter section 50B is approximately 770 nm.

As shown in FIG. 17A, in the third light emitting section 30C, the light emission that the peak wavelength $\lambda_1$ in the front surface is approximately 860 nm is obtained. The peak wavelength $\lambda_2$ when the emission angle $\theta$ is 40 degree is approximately 820 nm. Further, as shown in FIG. 17B, according to the omnidirectional integral waveform of the light emission in the third light emitting section 30C, the peak wavelength of the light intensity is approximately 790 nm. On the other hand, the permeability characteristics of the third optical filter section 50C are obtained in a peak of the transmittance in vicinity of approximately 830 nm, and as shown in FIG. 17C, the peak wavelength $\lambda_2$ of the light transmitted through the third optical filter section 50C is approximately 830 nm.

According to the second embodiment, a simple formation and configuration of the light emitting apparatus 210 provided with three types of the light emitting sections and the optical filter sections that can obtain the light emission of the peak wavelength $\lambda_2$ when the emission angle $\theta$ is 40 degree in the light emitting section and can selectively transmit the light in the wavelength range including the light of the peak wavelength $\lambda_2$ in the optical filter section can be provided by sharing the dielectric multilayer film 27, the insulating film 28, and the functional layer 32, and differentiating the film thickness of the transparent layer 51 with respect to the film thickness of the positive electrode 31.

Figure 18:
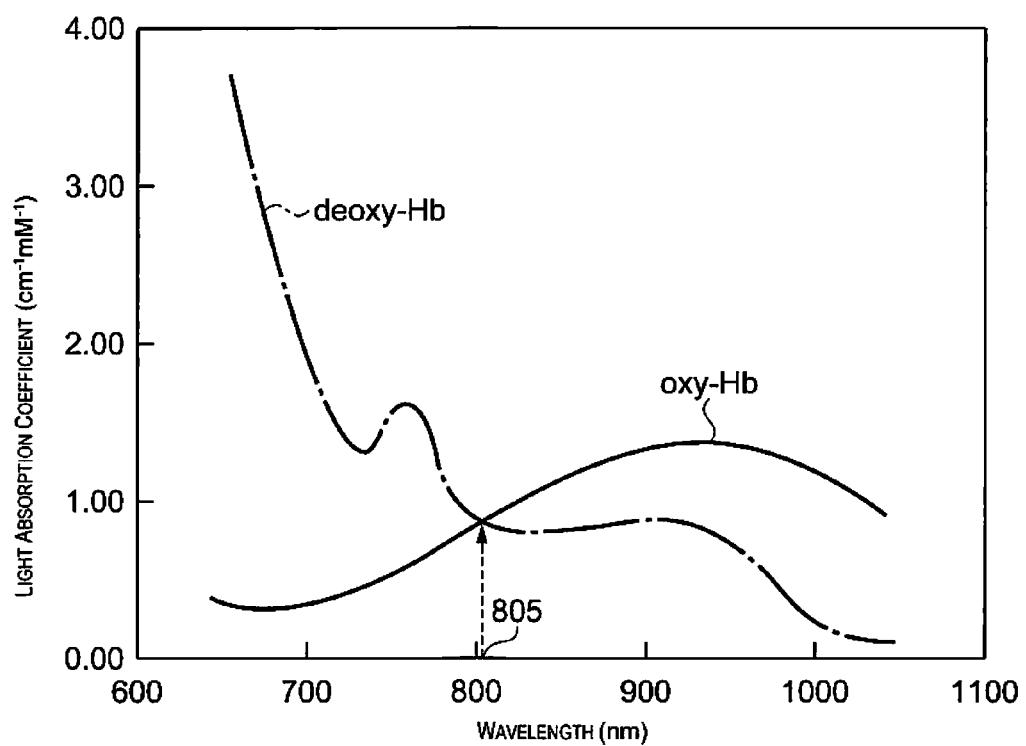
FIG. 18 is a graph showing the spectral characteristics related to the absorption coefficient of oxygenated hemoglobin and deoxygenated hemoglobin in blood.

Next, an example of the light receiving and emitting apparatus provided with the light emitting apparatus 210 of the second embodiment will be described in reference to FIG. 18. FIG. 18 is a graph showing the spectral characteristics related to the absorption coefficient of oxygenated hemoglobin and deoxygenated hemoglobin in blood.

It is said that the light in the wavelength between 700 nm to 1000 nm within the near-infrared wavelength region reaches to the deeper portion of the living body and can obtain the information for the inside of the living body in comparison with the light in the wavelength region (400 nm to 700 nm).

As shown in FIG. 18, it is well-known that the in the near-infrared wavelength between 700 nm to 1000 nm, the light absorption coefficients ($cm^{-1}$ $mM^{-1}$) of oxygenated hemoglobin (oxy-Hb) and deoxygenated hemoglobin (deoxy-Hb) in the blood, that is, spectrums, are different. Further, an equivalent point of the light absorption coefficients ($cm^{-1}$ $mM^{-1}$) of oxygenated hemoglobin (oxy-Hb) and deoxygenated hemoglobin (deoxy-Hb) is existed in vicinity of 805 nm. Therefore, the light in at least two near-infrared wavelengths divided by 805 nm as a boundary, or three near-infrared wavelengths if possible is emitted to the living body, and when the degree of absorption is measured, it is possible to accurately obtain the change amount of oxygenated hemoglobin (oxy-Hb) and deoxygenated hemoglobin (deoxy-Hb) in the blood. Since the hemoglobin has a role to supply oxygen in the living body, by measuring the change amount of oxygenated hemoglobin (oxy-Hb) and deoxygenated hemoglobin (deoxy-Hb) in the blood, it can obtain the oxygen supply state or the metabolic state in the living body. Also, deoxygenated hemoglobin is called as reduced hemoglobin.

When the light emitting apparatus 210 is used instead of the light emitting apparatus 110 in the light receiving and emitting apparatus 150 of the first embodiment, it is the active driving type of the light emitting apparatus 210 so that the first emitting section 30A of which the peak wavelength $\lambda_2$ is 710 nm when the emission angle $\theta$ is 40 degree, the second emitting section 30B of which the peak wavelength $\lambda_2$ is also 770 nm, and the third light emitting section 30C of which the peak wavelength $\lambda_2$ is 820 nm are respectively selected and the light can be emitted. Therefore, the light receiving apparatus 140 receives the near-infrared light, which was transmitted through the first optical filter section 50A of which the peak wavelength $\lambda_2$ of the transmittance is 710 nm, the second optical filter section 50B of which the peak wavelength $\lambda_2$ of the transmittance is 770 nm, and the third optical filter section 50C of which the peak wavelength) $\lambda_2$ of the transmittance is 830 nm, in the light receiving section 142, and it can be converted to an electrical signal. That is, the change amount of oxygenated hemoglobin (oxy-Hb) and deoxygenated hemoglobin (deoxy-Hb) in the blood can be accurately obtained as the biometric information.

The light emitting apparatus 210 is not limited to the configuration that is provided with the plurality of light emitting sections (three types) and the plurality of optical filter sections (three types). For example, it may be a configuration that is provided with one type of the light emitting section and two types of the optical filter sections in which the wavelength ranges of the transmitted light are different. Further, it may be a configuration that is provided with two types of the light emitting sections that emit the light with different wavelengths and one type of the optical filter section that transmits the light in a specific wavelength range.

There is a method for directly analyzing the components in the blood by obtaining the blood from the living body by using a syringe, etc., and on the other hand, there is a method for obtaining the biometric information by using the light receiving and emitting apparatus 150 provided with the aforementioned light emitting apparatus 210 and it is called as a noninvasive measurement method since the near-infrared light that reaches to the deeper portion of the living body is used to obtain the biometric information. Such noninvasive measurement method attracts attention in the medical field because it is less in burdens on a patient and the measurement results can be smoothly obtained. As described above, the measuring object is not only hemoglobin in the blood, but also, glucose by analyzing the absorbing spectrum of the near-infrared light so that the amount of glucose in the blood can be obtained, and the aforementioned light receiving and emitting apparatus 150 can be used as a noninvasive blood glucose level measurement apparatus.

In order to surely reach the near-infrared light to the deeper portion of the living body, for example, when there is one light emitting section 30, that is, the point light source, the intensity of the light emitted from the light emitting section 30 is preferably more than or equal to 100 mW/cm$^2$. Further, when the surface light source is configured by arranging the plurality of light emitting sections 30, the intensity of the light in each light emitting section 30 is preferably more than or equal to 0.1 mW/cm$^2$.

Figure 19:
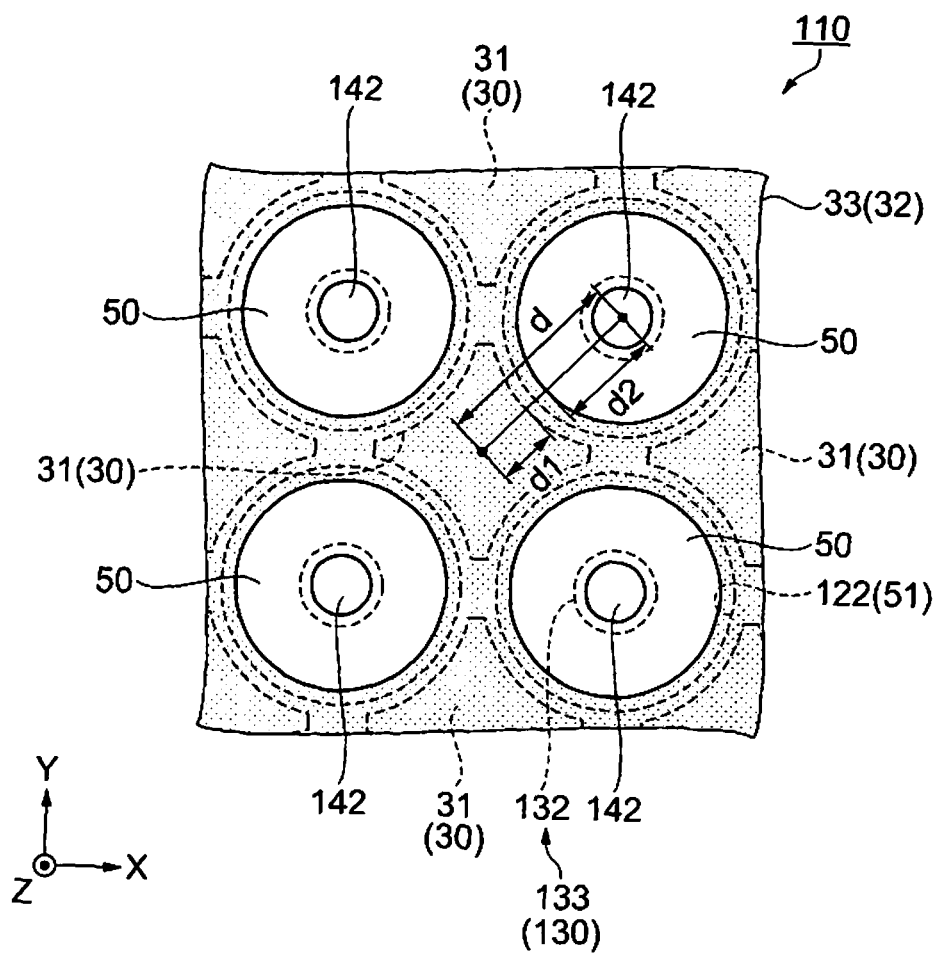
FIG. 19 is a diagram showing a relationship in an arrangement between the light emitting sections and the optical filter sections in a plan view.

Further, in addition to the light intensity in the light emitting section 30, when it is considered that the biometric information is obtained as the high-resolution image information by efficiently receiving the light emitted from the light emitting section 30 in the light receiving section 142, the relative arrangement of the light emitting sections 30 and the optical filter sections 50 becomes an important element. FIG. 19 shows a relationship in the arrangement between the light emitting sections and the optical filter sections in a plan view.

As shown in FIG. 19, with respect to the distance d from the center of the light emitting section 30 to the center of the optical filter section 50, in the direction from the center of the light emitting section 30 to the center of the optical filter section 50, a distance d1 from the center of the light emitting section 30 to the outer edge of the light emitting section 30 (more specifically, the outer edge of the region where the actual light emission is obtained) preferably satisfies the relationship of 5 µm≤d1≤0.7 mm.

When the distance d1 from the center of the light emitting section 30 to the outer edge is more than or equal to 5 µm, the light emitting section 30 can be arranged to avoid entering a circuit element or a wire, which is used for driving the light emitting section 30, in the optical filter section 50. Further, when the light emitting apparatus 110 is used for, for example, the light receiving and emitting apparatus 150, etc. that is possible to obtain various biometric information, by setting the distance from the center of the light emitting section 30 to the outer edge which is less than or equal to 0.7 mm, it is possible to obtain the biometric information as the high-resolution image information.

Further, in the direction from the center of the optical filter section 50 to the center of the light emitting section 30, a distance d2 from the center of the optical filter section 50 to the outer edge of the optical filter section 50 is preferably equal to the aforementioned distance d1 or larger than the aforementioned distance d1. Therefore, the light emitted in the outer edge of the light emitting section 30 and reflected at the subject is easily obtained in the optical filter section 50.

By satisfying the aforementioned relationship, the light emitted from the light emitting section 30 can be efficiently received by the light receiving section 142.

Further, in order to efficiently receive the light emitted from the light emitting section 30 in the light receiving section 142, the light-gathering capability by the microlens 122 becomes important so that the aforementioned distance d2 of the optical filter section 50 preferably satisfies the relationship of d2≥d/2.

The authentication accuracy is important in the aforementioned biometric authentication apparatus 100 so that the pitch between the light emitting section 30 and the optical filter section 50 is finely arranged as much as possible. The distance d from the center of the light emitting section 30 and the center of the optical filter section 50 in the first embodiment is approximately 70 µm. The distance d1 from the center of the light emitting section 30 to the outer edge is approximately 25 µm. Further, the distance d2 from the center of the optical filter section 50 to the outer edge is larger than the aforementioned distance d1 and is approximately 35 µm. That is, the arrangement of the light emitting sections 30 and the optical filter sections 50 in the first embodiment satisfies the aforementioned relationship.

As an example of the measuring object to be measured by receiving the reflected light RL from the living body in a fixed distance with the living body by the light emitting section 30 as a point light source and the light receiving section 142, it includes blood components (blood glucose value, venous blood oxygen concentration, cholesterol value, hemoglobin amount, water amount, etc.).

Further, as an example of the measuring object to be measured by receiving the reflected light RL from the living body without keeping a fixed distance with the living body by the plurality of light emitting sections 30 as a surface light source and the plurality of light receiving sections 142, it includes a blood vessel observation (vein authentication), a blood pressure, a pulse rate, a pulse wave, etc.

Third Embodiment

Figure 20:
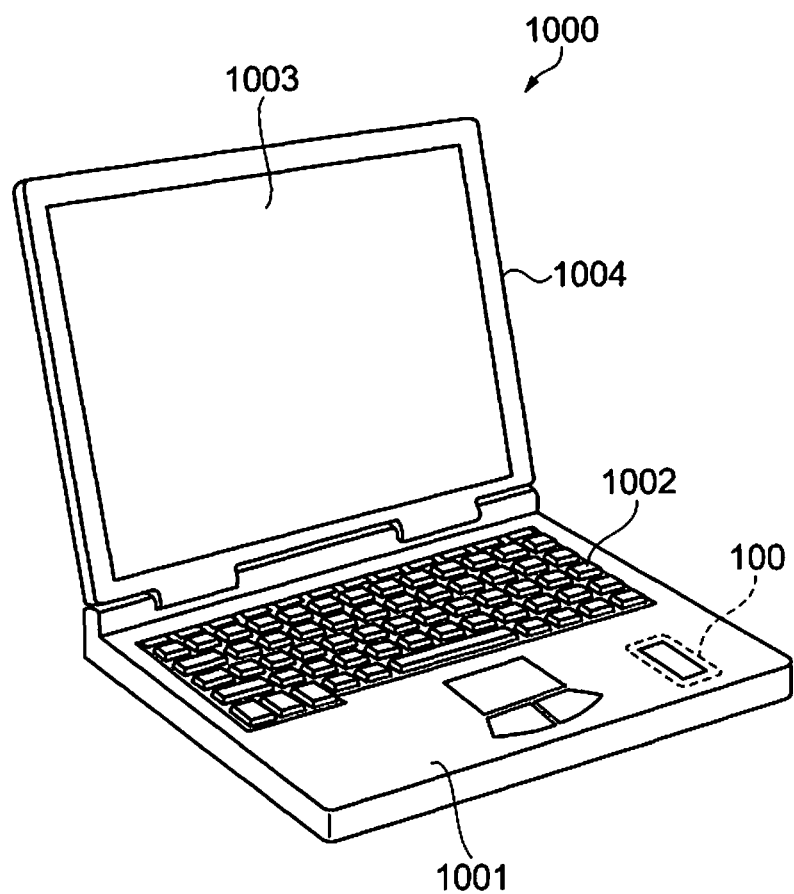
FIG. 20 is a schematic diagram showing a notebook type personal computer as electronic equipment.

Next, the electronic equipment as the third embodiment will be described in reference to FIG. 20. FIG. 20 is a schematic diagram showing a notebook type personal computer as the electronic equipment.

As shown in FIG. 20, the personal computer 1000 as the electronic equipment of the present embodiment is a notebook type, and is provided with a main body section 1001 provided with a keyboard 1002, and an indication unit 1004 provided with a display section 1003, and the indication unit 1004 is rotatably supported through a hinge structure section with respect to the main body section 1001.

In such personal computer 1000, the biometric authentication apparatus 100 of the first embodiment in which a cover glass 60 is arranged to be exposed (see FIG. 1) is provided in the main body section 1001.

According to such personal computer 1000, since the biometric authentication apparatus 100 is provided, an object person who is permitted to use the personal computer 1000 can be surely authenticated. That is, the personal computer 1000 having a high security function can be provided.

The electronic equipment in which the light receiving and emitting apparatus 150 used as the light emitting apparatus 110 or the light emitting apparatus 210 of the aforementioned embodiments is applicable is not limited to the aforementioned biometric authentication apparatus 100 or the personal computer 1000 provided this apparatus. For example, as the medical equipment, it can be applied to a measurement apparatus for measuring blood pressure, blood glucose, pulse rate, pulse wave, cholesterol amount, hemoglobin amount, water amount in the blood, oxygen amount in the blood, etc. Further, a liver function (detoxification rate) measurement, a blood vessel position confirmation, a cancer site confirmation can be done by using together with pigment. In addition, by increasing knowledge in specimens, it is possible to determine benign/malignant tumor (melanoma) of the skin cancer. Further, by comprehensively determining a part or all of the aforementioned items, it is also possible to determine skin age and health index of skin.

The present invention is not limited to the aforementioned embodiments, but various changes may be made without departing from the essence or spirit of the invention which can be read from the claims and the entire specification. A light emitting apparatus, which involves such changes, and its manufacturing method, and a light receiving and emitting apparatus and electronic equipment in which the light receiving and emitting apparatus is applied are also intended to be within the technical scope of the present invention. Various modification examples other than the aforementioned embodiments may be possible.

Modified Example 1

Figure 21:
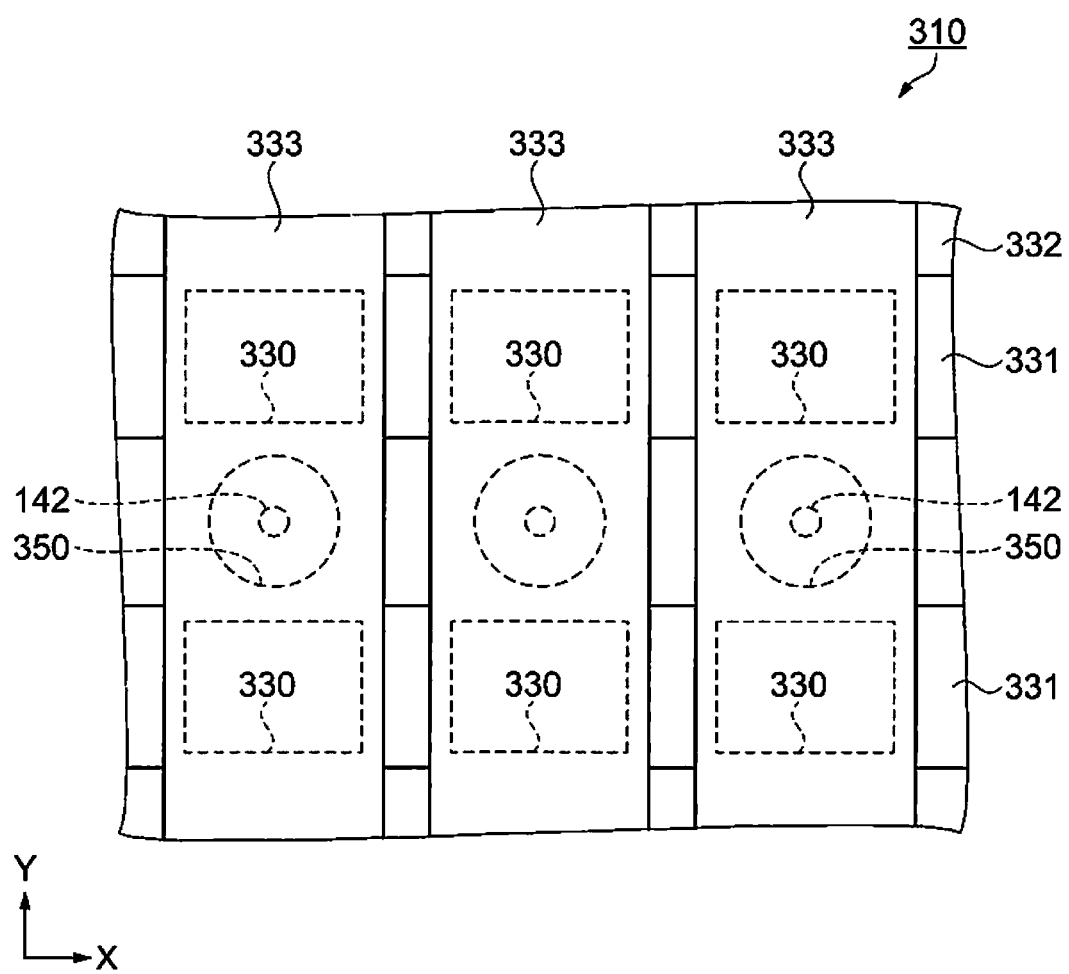
FIG. 21 is a schematic plan view showing an arrangement of the light emitting sections and the optical filter sections in a modified example of the light emitting apparatus.

The light emitting apparatuses 110, 210 of the aforementioned embodiments are not limited to the configuration provided with the active driving type of the light emitting section 30. FIG. 21 is a schematic plan view showing an arrangement of the light emitting sections and the optical filter sections in a modified example of the light emitting apparatus. It will be described by using the same symbols in the same configuration of the light emitting apparatus 110 of the first embodiment.

As shown in FIG. 21, the light emitting apparatus 310 of the modified example is provided with the first electrodes 331 as a positive electrode extending in the X-direction, and the second electrodes 333 as a negative electrode intersecting with the first electrodes 331 and extending in the Y-direction. A functional layer 332 including the EML (light emitting layer) is arranged between the first electrodes 331 and the second electrodes 333. The second electrodes 333 include a layer made of alloy including Ag, and have the semi-transmissive reflectivity. In a lower layer of the first electrodes 331, the reflection layer 26 is provided in the region where the first electrodes 331 and the second electrodes 333 are intersected. Further, the dielectric multilayer film 27 is provided between the reflection layer 26 and the first electrodes 331. Therefore, the region where the first electrodes 331 and the second electrodes 333 are intersected (in other words, a portion including a part of the first electrodes 331) functions as the light emitting section 330. The light emitting section 330 is provided with the reflection layer 26, the dielectric multilayer film 27, the first electrode 331, the functional layer 332, and the second electrode 333 in the order from the lower layer side. On the other hand, a portion where the second electrodes 333 do not overlap with the first electrodes 331 functions as the optical filter section 350. The optical filter section 350 is provided with the dielectric multilayer film 27, the functional layer 332, and the second electrodes 333 in the order from the lower layer. The light emitting sections 330 and the optical filter sections 350 are divided by a partition wall, which is not shown. The planar shape of the light emitting sections 330 is a square shape, and the planar shape of the optical filter sections 350 is a circular shape. The light receiving section 142 is arranged in the center of the circular-shaped optical filter sections 350. The light emitting sections 330 and the optical filter sections 350 are arranged on the translucent substrate. In such configuration, the passive drive type of the light emitting apparatus 310 can be provided.

The second electrodes 333 may be configured as a common electrode in common with the plurality of first electrodes 331.

Modified Example 2

According to the light emitting apparatus 110 of the aforementioned embodiments, there is a configuration that the light in a part of the wavelength within the near-infrared wavelength range emitted from the light emitting section 30 is transmitted through the optical filter section 50, and the film thickness of the positive electrode 31 is larger than the film thickness of the transparent layer 51, but it is not limited to this configuration. The film thickness of the positive electrode 31 and the transparent layer 51 may be the same. Accordingly, even though the resonance length L1 of the light emitting section 30 and the resonance length L2 of the optical filter section 50 by the calculation of the simple optical distance are the same, a peak of the transmittance is obtained in the permeability characteristics of the optical filter section 50.

Modified Example 3

According to the light emitting apparatuses 110, 210 of the aforementioned embodiments, there is a configuration that the light in a part of the wavelength within the near-infrared wavelength range emitted from the light emitting section 30 is transmitted through the optical filter section 50, and the film thickness of the transparent layer 51 is smaller than the positive electrode 31, but it is not limited to this configuration.

For example, in Japanese Unexamined Patent Application Publication (Translation of PCT Application) No. 2010-505582, a method for clinically using imaging information obtained by injecting indocyanine green (ICG) as a contrast dye in the living body and measuring the change in concentration is disclosed. According the disclosure, the excitation light in the wavelength between 740 nm to 800 nm (770 nm±30 nm) is irradiated to the ICG, and the near-infrared fluorescent in the wavelength between 800 nm to 850 nm that is generated by exciting the ICG is observed. Therefore, for example, the light having a peak wavelength in the wavelength range between 740 nm to 800 nm from the light emitting section 30 is emitted in the aforementioned light emitting apparatus 110. By providing the film thickness of the transparent layer 51 larger than the positive electrode 31 in the optical filter section 50, the resonance length L2 of the optical filter section 50 becomes larger than the resonance length L1 of the light emitting section 30 so that the near-infrared fluorescent in the wavelength range between 800 nm to 850 nm can be transmitted through the optical filter section 50. That is, a configuration that the light in the wavelength range other than the wavelength range of the light emitted from the light emitting section 30 is transmitted through the optical filter section 50 can be realized. As the example that the fluorescent observation of the ICG is clinically used, it includes a blood vessel observation, a cancer side observation, a liver function measurement, etc. In such observation or measurement, the light emitting apparatuses 110, 210 are preferably provided with the surface light source including the plurality of light emitting sections 30.

Modified Example 4

In the aforementioned first embodiment, the peak wavelength $\lambda_2$ when the emission angle $\theta$ is 40 degree in the light emitting section 30 is defined as a target peak wavelength, but the target peak wavelength is not limited to this. It is needless to say that the target peak wavelength relies on the spectral characteristics in the emission angle $\theta$ of the light emitting section 30 so that the peak wavelength may be set in the emission angle range of approximately 40 to 50 degree that the intensity of the emitted light is strong. Further, the light emitting wavelength range in the light emitting section 30 as a desired light source is selected depending on what information wants to be obtained by the light receiving and emitting apparatus 150. Also, the selection of the target peak wavelength in the light emitting section 30 is affected depending the receiving light characteristics (sensitivity depending on the wavelengths) of the light receiving section 142.

Modified Example 5

In the aforementioned embodiments, it is the embodiment that a chalcopyrite-type (e.g., CIS type, CIGS type) of a light receiving section in the light receiving section may be preferably used. The light receiving section configured by the CIS (Cu, In, Se) type and the CIGS (Cu, In, Ga, Se) type, etc. has higher sensitivity than the light receiving section configured by the COMS type which is the sensitivity for the light in the near-infrared wavelength. A desired light emitting apparatus can be configured together with the aforementioned filter effect. Further, the light receiving section can be formed thinner so that it is possible to provide the device itself in compact.

GENERAL INTERPRETATION OF TERMS

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. The term "attached" or "attaching", as used herein, encompasses configurations in which an element is directly secured to another element by affixing the element directly to the other element; configurations in which the element is indirectly secured to the other element by affixing the element to the intermediate member(s) which in turn are affixed to the other element; and configurations in which one element is integral with another element, i.e. one element is essentially part of the other element. This definition also applies to words of similar meaning, for example, "joined", "connected", "coupled", "mounted", "bonded", "fixed" and their derivatives. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. A light emitting apparatus comprising:
a translucent substrate; and
a light emitting section and an optical filter section arranged in a first region of the substrate when viewed in a normal direction of a first surface of the substrate,
the light emitting section having a laminate structure that includes, on the first surface of the substrate, a dielectric multilayer film, a first electrode, a functional layer with a light emitting layer, and a second electrode having semi-transmissive reflectivity,
the optical filter section having a laminate structure that includes, on the first surface of the substrate, the dielectric multilayer film, the functional layer, and the second electrode,
the dielectric multilayer film and the functional layer extending over the first region.

2. The light emitting apparatus according to claim 1, wherein
the light emitting section further has a reflection layer that is disposed between the first surface of the substrate and the dielectric multilayer film,
a first optical resonance structure is formed between the reflection layer and the second electrode, and
a second optical resonance structure is formed between the dielectric multilayer film of the optical filter section and the second electrode.

3. The light emitting apparatus according to claim 1, wherein
the optical filter section is configured to transmit light in a part of a wavelength range of light emitted from the light emitting section.

4. The light emitting apparatus according to claim 1, wherein
the optical filter section includes a transparent layer that has the same thickness of the first electrode and is located in the same layer level with the first electrode.

5. The light emitting apparatus according to claim 1, wherein
the optical filter section has a transparent layer that is made of the same conducting film as the first electrode and is located in the same layer level with the first electrode, with the first electrode having a film thickness that is different from that of the transparent layer.

6. The light emitting apparatus according to claim 1, wherein
the optical filter section is free of a transparent layer that is made of the same conducting film as the first electrode and is located in the same layer level with the first electrode.

7. The light emitting apparatus according to claim 1, wherein
the optical filter section is configured to transmit fluorescent excited by light emission in the light emitting section.

8. The light emitting apparatus according to claim 1, wherein
a distance d1 from a center of the light emitting section to an outer edge of the light emitting section measured in a direction directing toward a center of the optical filter section from the center of the light emitting section satisfies a relationship of 5 μm≤d1≤0.7 mm.

9. The light emitting apparatus according to claim 1, wherein
the light emitting section is configured to emit near-infrared light.

10. The light emitting apparatus according to claim 1, further comprising
a plurality of light emitting sections arranged in the first region of the substrate, the light emitting sections having light emitting wavelength ranges that are shifted relative to each other.

11. The light emitting apparatus according to claim 1, further comprising
a plurality of optical filter sections arranged in the first region of the substrate, the optical filter sections having wavelength ranges of transmitting light that are shifted relative to each other.

12. The light emitting apparatus according to claim 1, wherein
the dielectric multilayer film has a laminate structure that includes a first dielectric film having a first refractive index and a second dielectric film having a second refractive index that is larger than the first refractive index, and
the second dielectric film is made of amorphous silicon.

13. The light emitting apparatus according to claim 1, wherein
the second electrode includes a layer made of alloy that includes Ag.

14. The light emitting apparatus according to claim 1, wherein
the first electrode extends along a first direction,
the second electrode extends along a second direction that intersects with the first electrode,
the light emitting section includes a part of the first electrode that extends along the first direction, and
the optical filter section includes a part of the second electrode that does not overlap with the part of the first electrode.

15. A light receiving and emitting apparatus comprising:
the light emitting apparatus according to claim 1; and
a light receiving section disposed in a position overlapping the optical filter section in an opposite side of the first surface of the substrate.

16. The light receiving and emitting apparatus according to claim 15, further comprising
a microlens disposed between the optical filter section and the light receiving section.

17. The light receiving and emitting apparatus according to claim 16, further comprising
a light shielding film having an opening section that is disposed between the microlens and the light receiving section.

18. An electronic equipment comprising:
the light receiving and emitting apparatus according to claim 15.

* * * * *